United States Patent
Ikeda et al.

(10) Patent No.: US 11,309,688 B2
(45) Date of Patent: Apr. 19, 2022

(54) NITRIDE SEMICONDUCTOR LIGHT-EMITTING ELEMENT, METHOD FOR MANUFACTURING NITRIDE SEMICONDUCTOR LIGHT-EMITTING ELEMENT, AND NITRIDE SEMICONDUCTOR LIGHT-EMITTING DEVICE

(71) Applicant: PANASONIC INTELLECTUAL PROPERTY MANAGEMENT CO., LTD., Osaka (JP)

(72) Inventors: Daisuke Ikeda, Toyama (JP); Gen Shimizu, Toyama (JP); Hideo Kitagawa, Toyama (JP); Toru Takayama, Koyama (JP); Masayuki Ono, Koyama (JP); Katsuya Samonji, Toyama (JP); Osamu Tomita, Osaka (JP); Satoko Kawasaki, Osaka (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 306 days.

(21) Appl. No.: 16/584,173

(22) Filed: Sep. 26, 2019

(65) Prior Publication Data
US 2020/0021083 A1    Jan. 16, 2020

Related U.S. Application Data

(63) Continuation of application No. PCT/JP2018/011598, filed on Mar. 23, 2018.

(30) Foreign Application Priority Data

Mar. 29, 2017 (JP) .............................. JP2017-065568
Sep. 29, 2017 (JP) .............................. JP2017-190801

(51) Int. Cl.
*H01S 5/343*    (2006.01)
*H01S 5/026*    (2006.01)
(Continued)

(52) U.S. Cl.
CPC ........ *H01S 5/34333* (2013.01); *B28D 5/0011* (2013.01); *B28D 5/0023* (2013.01);
(Continued)

(58) Field of Classification Search
CPC ..... H01S 5/0202; H01S 5/2202; H01S 5/3433
See application file for complete search history.

(56) References Cited

U.S. PATENT DOCUMENTS 5,418,799 A * 5/1995 Tada ..................... H01S 5/0201
                                                    372/109
5,629,233 A    5/1997 Chand et al.
(Continued)

FOREIGN PATENT DOCUMENTS

JP    H06-275714 A    9/1994
JP    H10-27942 A     1/1998
(Continued)

OTHER PUBLICATIONS

International Search Report and Written Opinion dated May 29, 2018 in International Application No. PCT/JP2018/011598; with partial English translation.

*Primary Examiner* — Michael Carter
(74) *Attorney, Agent, or Firm* — McDermott Will & Emery LLP

(57) ABSTRACT

In a method for manufacturing a nitride semiconductor light-emitting element by splitting a semiconductor layer stacked substrate including a semiconductor layer stacked body with a plurality of waveguides extending along the Y-axis to fabricate a bar-shaped substrate, and splitting the bar-shaped substrate along a lengthwise split line to fabri-
(Continued)

cate an individual element, the waveguide in the individual element has different widths at one end portion and the other end portion and the center line of the waveguide is located off the center of the individual element along the X-axis, and in the semiconductor layer stacked substrate including a first element forming region and a second element forming region which are adjacent to each other along the X-axis, two lengthwise split lines sandwiching the first element forming region and two lengthwise split lines sandwiching the second element forming region are misaligned along the X-axis.

20 Claims, 60 Drawing Sheets

(51) Int. Cl.
| | | |
|---|---|---|
| *H01S 5/02* | (2006.01) | |
| *H01S 5/22* | (2006.01) | |
| *H01L 21/20* | (2006.01) | |
| *H01L 21/3065* | (2006.01) | |
| *B28D 5/00* | (2006.01) | |
| *H01L 33/00* | (2010.01) | |
| *H01L 21/285* | (2006.01) | |

(52) U.S. Cl.
CPC .......... *H01L 21/20* (2013.01); *H01L 21/3065* (2013.01); *H01L 33/0075* (2013.01); *H01S 5/0202* (2013.01); *H01S 5/026* (2013.01); *H01S 5/2202* (2013.01); *H01S 5/34346* (2013.01); *H01L 21/28512* (2013.01); *H01S 2304/00* (2013.01)

(56) References Cited

U.S. PATENT DOCUMENTS

| | | |
|---|---|---|
| 7,372,077 B2 | 5/2008 | Hata et al. |
| 2002/0172249 A1 | 11/2002 | Chino |
| 2004/0245540 A1 | 12/2004 | Hata et al. |
| 2007/0264802 A1 | 11/2007 | Sakamoto et al. |
| 2009/0296765 A1* | 12/2009 | Takayama ............ B82Y 20/00 372/45.01 |

FOREIGN PATENT DOCUMENTS

| | | |
|---|---|---|
| JP | H11-204880 A | 7/1999 |
| JP | 2002-344086 A | 11/2002 |
| JP | 2004-260152 A | 9/2004 |
| JP | 2007-329459 A | 12/2007 |
| JP | 2009-295680 A | 12/2009 |
| JP | 2011-029224 A | 2/2011 |
| JP | 2011-243857 A | 12/2011 |

\* cited by examiner (a)

(b)

LASER LIGHT ↓

LASER LIGHT ↓

NITRIDE SEMICONDUCTOR LIGHT-EMITTING ELEMENT, METHOD FOR MANUFACTURING NITRIDE SEMICONDUCTOR LIGHT-EMITTING ELEMENT, AND NITRIDE SEMICONDUCTOR LIGHT-EMITTING DEVICE

CROSS REFERENCE TO RELATED APPLICATIONS

This application is a U.S. continuation application of PCT International Patent Application Number PCT/JP2018/011598 filed on Mar. 23, 2018, claiming the benefit of priority of Japanese Patent Application Number 2017-065568 filed on Mar. 29, 2017, and Japanese Patent Application Number 2017-190801 filed on Sep. 29, 2017, the entire contents of which are hereby incorporated by reference.

BACKGROUND

1. Technical Field

The present disclosure relates to nitride semiconductor light-emitting elements, methods for manufacturing a nitride semiconductor light-emitting element, and nitride semiconductor light-emitting devices, and in particular relates to a watt-class high-output semiconductor light-emitting element used in a projector light source and a headlamp for automobiles.

2. Description of the Related Art

Conventionally, as one form for efficiently obtaining a widescreen image, projectors have been widely used as projection-type image display devices which project an enlarged optical image obtained using a spatial light modulation element such as a compact liquid-crystal panel that forms an image corresponding to an image signal onto a screen through a projector lens by illuminating the spatial light modulation element by light from a light source such as a lamp. In such projection-type image display devices exemplified by projectors, the light source generally includes an ultra-high pressure mercury lamp which exhibits high luminescence efficiency in the wavelength range of visible light.

Meanwhile, a light-emitting diode (LED) or a laser which is a semiconductor light-emitting element characterized by high luminance, high definition, low power consumption, a long operational life, etc., have recently begun to be used instead of a high pressure mercury lamp in a light source of a projector. Especially, in a widescreen, high-quality usage such as digital signage and a projector for movie theaters, a laser projector including a watt-class high-output semiconductor laser as a light source has begun to spread. Furthermore, the watt-class high-output semiconductor laser has begun to develop into a light source for vehicle headlamps. As just mentioned, a light source including a semiconductor light-emitting element such as a laser has been spreading to various fields.

In a conventionally known example of this type of semiconductor light-emitting element, a waveguide has different widths at one end portion and the other end portion in the cavity length direction. For example, a semiconductor laser element including a tapered strip waveguide is known (for example, Japanese Unexamined Patent Application Publication No. 2009-295680).

Examples of a semiconductor light-emitting element suitable for a light source of a projector include a nitride-based semiconductor laser which uses a nitride-based material. For example, a light source that emits blue-violet light in a wavelength range of 405 nm is provided using a nitride-based semiconductor laser, blue phosphor, green phosphor, and red phosphor are excited by laser light emitted from the nitride-based semiconductor layer, and blue light, green light, and red light are emitted from these phosphors; thus, a compact, low power consuming laser projector can be provided.

However, unlike a gallium arsenide-based laser used in optical pickups or optical communication, the nitride-based semiconductor laser involves splitting along a crystal face other than a cleavage surface upon an element split. Therefore, the high likelihood of problems such as a split out of an element split line or cracking of a laser element in the process of cutting out an individual laser element from a wafer (the process of obtaining a chip) has been an issue.

For such an issue, Japanese Unexamined Patent Application Publication No. 2011-029224 discloses techniques for splitting an element using a guide trench, for example. FIG. 49 is a plan view of semiconductor light-emitting element 1000 according to Conventional Example 1 disclosed in Japanese Unexamined Patent Application Publication No. 2011-029224. As illustrated in FIG. 49, in semiconductor light-emitting element 1000 according to Conventional Example 1, semiconductor layer stacked body 1200 formed on a substrate includes guide trench 1201 for element splits which extends in the direction of an element split.

Furthermore, Japanese Unexamined Patent Application Publication No. 2007-329459 discloses techniques for splitting an element using a guide trench having a two-step guide trench structure. FIG. 50 is a plan view of semiconductor light-emitting element 2000 according to Conventional Example 2 disclosed in Japanese Unexamined Patent Application Publication No. 2007-329459. As illustrated in FIG. 50, in semiconductor light-emitting element 2000 according to Conventional Example 2, semiconductor layer stacked body 2200 formed on a substrate includes first guide trench 2201 for element splits which is in the form of a projection at a leading end, and further includes a second guide trench 2202 at the bottom of first guide trench 2201.

SUMMARY

However, it is problematic in that manufacturing nitride semiconductor light-emitting elements in quantity is difficult with the conventional methods for manufacturing a semiconductor light-emitting element.

For example, in recent years, a nitride oxide semiconductor light-emitting element in which the position of a waveguide is offset along the width of the element has been studied, but it is not easy to manufacture, in quantity, a nitride semiconductor light-emitting element in which the position of a waveguide is offset along the width of the element while maintaining a structure in which the waveguide has different widths at one end portion and the other end portion.

The first purpose of the present disclosure is to provide, for example, a method for manufacturing a nitride semiconductor light-emitting element by which it is possible to easily manufacture, in quantity, a semiconductor laser element in which a waveguide has different widths at one end portion and the other end portion and the position of the waveguide is offset along the width of the element.

Furthermore, the conventional techniques disclosed in Japanese Unexamined Patent Application Publications No. 2011-029224 and No. 2007-329459 have the problem of failing to sufficiently reduce generation of particles that are due to an element split.

The second purpose of the present disclosure is to provide, for example, a method for manufacturing a nitride semiconductor light-emitting element in which upon an element split, generation of particles can be sufficiently reduced.

In order to achieve the first purpose, a method for manufacturing a first nitride semiconductor light-emitting element according to one aspect of the present disclosure includes: fabricating a semiconductor layer stacked substrate including a semiconductor layer stacked body on a substrate, the semiconductor layer stacked body including a plurality of waveguides extending in a second direction substantially orthogonal to a first direction; fabricating a plurality of bar-shaped substrates by splitting the semiconductor layer stacked substrate along a plurality of first-direction split lines parallel to the first direction, resulting in the plurality of waveguides being cut; and fabricating a plurality of individual elements by splitting each of the plurality of bar-shaped substrates along a plurality of second-direction split lines parallel to the second direction. A waveguide in each of the plurality of individual elements has different widths at one end portion and another end portion and a center line of the waveguide is located off a center of the individual element along the first direction, the semiconductor layer stacked substrate includes a plurality of element forming regions corresponding to the plurality of individual elements, the plurality of element forming regions include a first element forming region and a second element forming region which are adjacent to each other in the second direction, and two of the plurality of second-direction split lines sandwiching the first element forming region and two of the plurality of second-direction split lines sandwiching the second element forming region are misaligned in the first direction.

Furthermore, a first nitride semiconductor light-emitting element according to one aspect of the present disclosure includes: a substrate; and a semiconductor element structure on one surface of the substrate, and the semiconductor element structure includes a waveguide extending in a second direction substantially orthogonal to a first direction. The nitride semiconductor light-emitting element has: a first side surface substantially parallel to the second direction; a second side surface opposite to the first side surface; a third side surface substantially orthogonal to the first side surface and the second side surface; and a fourth side surface opposite to the third side surface. Each of the third side surface and the fourth side surface is a cleavage surface. The nitride semiconductor light-emitting element includes a first recess near the intersection between the first side surface and the third side surface in a plan view. The first recess has a side surface inclined at an angle of at least 45 degrees with respect to the third side surface. The relationship $W1 \neq W2$ is satisfied where $W1$ is a first width of the waveguide in the fourth side surface and $W2$ is a second width of the waveguide in the third side surface. The waveguide is located offset in the first direction.

In order to achieve the second purpose, a method for manufacturing a second nitride semiconductor light-emitting element according to one aspect of the present disclosure includes: (i) forming a first trench and a second trench in a semiconductor layer stacked substrate along a second direction substantially orthogonal to a first direction in a substrate plane, the first trench and the second trench sandwiching an area in which a plurality of waveguides extending in the second direction are formed, the semiconductor layer stacked substrate including, on a substrate, a semiconductor layer stacked body in which the plurality of waveguides are formed; (ii) splitting the semiconductor layer stacked substrate into segments by cleaving the semiconductor layer stacked substrate in a predetermined split position along the first direction in the substrate plane; (iii) forming a third trench extending in the second direction between the first trench and the second trench in the semiconductor layer stacked substrate; and (iv) splitting the semiconductor layer stacked substrate along the third trench into segments. In (i), a recess is formed in the predetermined split position between the first trench and the second trench.

Furthermore, a second nitride semiconductor light-emitting element according to one aspect of the present disclosure includes: a substrate; and a semiconductor element structure on one surface of the substrate, the semiconductor element structure including a waveguide extending in a second direction substantially orthogonal to a first direction. The nitride semiconductor light-emitting element further includes: a first side surface substantially parallel to the second direction; a second side surface opposite to the first side surface: a third side surface substantially perpendicular to the first side surface and the second side surface; and a fourth side surface opposite to the third side surface. Each of the third side surface and the fourth side surface is a cleavage surface. The nitride semiconductor light-emitting element further includes: a first trench between the second side surface and the waveguide, the first trench extending in the second direction; a second trench between the first side surface and the waveguide, the second trench extending in the second direction; a first recess near an intersection between the first side surface and the third side surface; a second recess near an intersection between the first side surface and the fourth side surface; a first depressed portion depressed toward the second side surface from the first side surface; and a second depressed portion depressed toward the first side surface from the second side surface.

According to the present disclosure, the nitride semiconductor light-emitting element can be easily manufactured in quantity. For example, according to one aspect of the method for manufacturing the first nitride semiconductor light-emitting element, it is possible to easily manufacture, in quantity, a nitride semiconductor light-emitting element in which a waveguide has different widths at one end portion and the other end portion and the position of the waveguide is offset along the width of the element. Furthermore, according to one aspect of the method for manufacturing the second nitride semiconductor light-emitting element, generation of particles upon an element split can be sufficiently reduced, and thus a nitride semiconductor light-emitting element the operation of which is guaranteed for several thousands of hours in the watt-class operating state can be manufactured in quantity. Moreover, according to one aspect of the first nitride semiconductor light-emitting element and the second nitride semiconductor light-emitting element, a nitride semiconductor light-emitting element excellent in mass productivity can be provided.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Figure 1A:
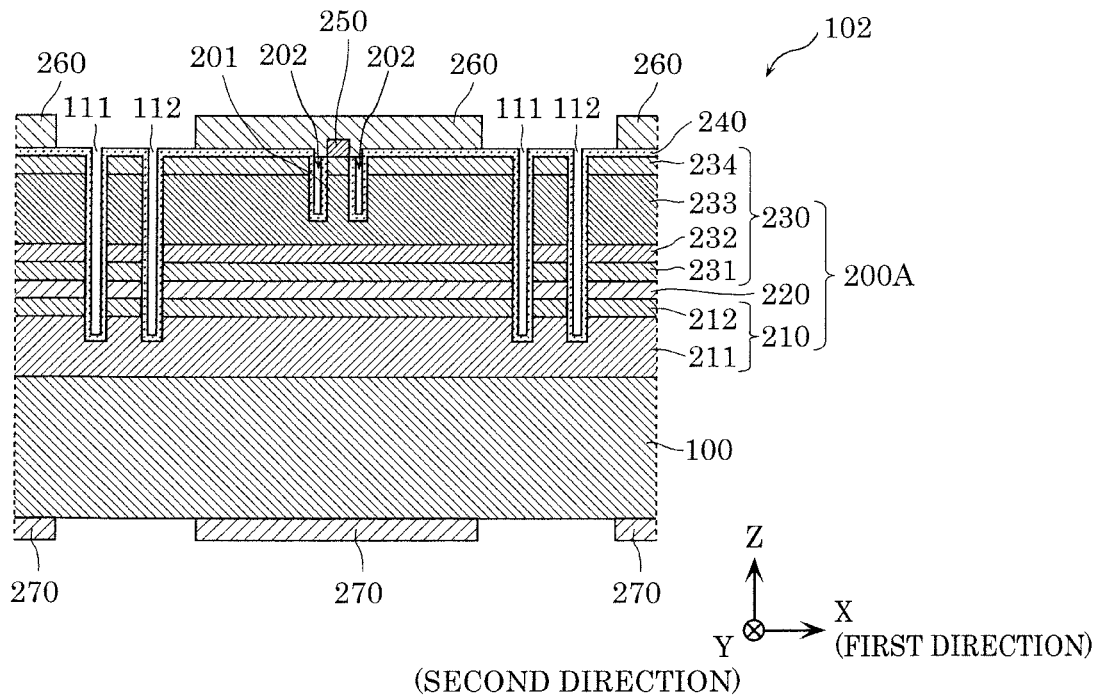
FIG. 1A is a cross-sectional view of a portion of a semiconductor layer stacked substrate according to Embodiment 1.

Hereinafter, embodiments of the present disclosure will be described with reference to the drawings. Note that each of the embodiments described below shows a specific preferred example of the present disclosure. Thus, the numerical values, shapes, materials, structural elements, and the arrangement and connection of the structural elements, steps, the processing order of the steps etc., shown in the following embodiments are mere examples, and are not intended to limit the present disclosure. Accordingly, among the structural elements in the following embodiments, structural elements not recited in any one of the independent claims which indicate the broadest concepts of the present disclosure will be described as arbitrary structural elements.

Note that the figures are schematic diagrams and are not necessarily precise illustrations. Therefore, scale reduction, etc., in the figures are not necessarily the same. In the figures, substantially identical elements are assigned the same reference signs, and overlapping description will be omitted or simplified.

In addition, in this Description and the drawings, the X-axis, the Y-axis, and the Z-axis represent the three axes in a three-dimensional orthogonal coordinate system. In the present embodiment, the Z-axis direction is a vertical direction, and a direction perpendicular to the Z-axis (i.e., a direction parallel to the XY plane) is a horizontal direction. The X-axis and the Y-axis are orthogonal to each other, and each is an axis that is orthogonal to the Z-axis. The X-axis direction and the Y-axis direction are directions in the substrate plane of substrate 100. In other words, the XY plane is parallel to the principal surface of substrate 100. The laser cavity length direction of a nitride semiconductor light-emitting element is the Y-axis direction. In this Description, the X-axis direction is the first direction, and the Y-axis direction is the second direction. Note that the direction the arrow of each of the X-axis, the Y-axis, and the Z-axis faces is the positive direction.

Embodiment 1

First, prior to the description of Embodiment 1 of the present disclosure, developments that resulted in one aspect of Embodiment 1 of the present disclosure will be described.

As in the techniques disclosed in Japanese Unexamined Patent Application Publications No. 2011-029224 and No. 2007-329459 mentioned above, the shape of a laser element becomes stable as a result of using a guide trench for element splits. However, studies by the inventors have revealed that there is the following problem.

First, in the case where the techniques disclosed in Japanese Unexamined Patent Application Publication No. 2011-029224 are used, the element split itself is within the guide trench, but, since the guide trench has a predetermined width, the element split line varies within the width range of the guide trench, causing the problem of disturbing the straightness of element splits Furthermore, actual fabrication of laser elements by the method disclosed in Japanese Unexamined Patent Application Publication No. 2011-029224 shows that a certain percentage of the laser elements are formed out-of-line from the guide trench.

In the case where the techniques disclosed in Japanese Unexamined Patent Application Publication No. 2007-329459 are used, the advantageous effect of reducing out-of-line element splits along the second guide trench can be expected due to the form of a projection at the leading end of the first guide trench. However, upon formation of the second guide trench at the bottom of the first guide trench having a predetermined depth by laser scribing, the focus of a laser for forming trenches is unstable at the bottom of the first guide trench due to the depth of the first guide trench. As a result, the shape of the second guide trench formed by the laser becomes unstable; it has been found that the element split line is unstable because the second guide trench is not accurately formed. Furthermore, actual fabrication of laser elements by the method disclosed in Japanese Unexamined Patent Application Publication No. 2007-329459 shows that the split guiding function of the first guide trench is not sufficient, leading to a certain percentage of the laser elements resulting from out-of-line element splits.

The shape of each of the elements obtained in Japanese Unexamined Patent Application Publications No. 2011-029224 and No. 2007-329459 has not been a significant issue for conventional laser elements; however, experiments conducted by the inventors have showed that the properties of high-out laser elements the output of which is of the class of several watts are highly susceptible to slight variations in element shape (for example, displacement of the element split line due to bending of the element split line).

First, in the laser elements of the class of several watts, how to efficiently release the heat generated in the laser elements is a major technical issue. For such an issue, there are cases where a method for mounting a laser element in such a manner that a light-emitting layer end comes into a sub-mount is used and where what is called junction-down mounting is used. These improve the heat release efficiency, allowing the heat generated in a laser element to be efficiently released.

However, in the case of the junction-down mounting, the distance between solder on a sub-mount and an element split surface (side surface) on which no insulation film is formed is very short, and thus there is an extremely high risk of a leakage current being generated due to manufacturing inconsistencies.

In the laser elements of the class of several watts, it is problematic in that if there is a defective portion resulting from a projection generated due to displacement of the element split line or an insulation film separated due to cracking of a laser element, the manufacturing yield is reduced due to a leakage current between solder and the laser element at said portion.

In addition, during development of a laser element for vehicle headlamps, a reliability test in a high-temperature vibrating environment represented by an in-vehicle environment was conducted, and it has been found that there is a laser element in which the leakage current increases due to long-term usage. Through an analysis of this defective element, an obvious leakage path was not found, but separation of an insulation film due to cracking of the laser element was found. This suggests that in a high-temperature vibrating environment, a projection of the element split line or separation of the insulation film due to cracking of the element may lead to reliability degradation; thus, an accurate split method in which the element split line is not displaced or the laser element does not crack is required.

Moreover, further studies by the inventors have revealed that if the laser element is split with the element split line displaced, this affects even an end surface (laser exit surface and reflection surface) of the laser element.

Specifically, a coating film (end surface coating film) which adjusts reflectivity is formed on the end surface (laser exit surface and reflection surface) of the laser element, and it has been found that if the laser element is split with the element split line displaced due to, for example, bending of the element split line, a large force is applied to the end surface of the laser element, resulting in the problem of the end surface coating film being separated.

It has also been found that if the laser element is split with the element split line displaced, the probability that particles such as separated pieces of the end surface coating film and flakes of the substrate are generated increases accordingly. A portion of the generated particles may adhere on the end surface of the laser element in a light-emitting region. Adhesion of particles to the end surface of the laser element in the light-emitting region causes problems such as deterioration of the properties of the laser element and a reduction in the catastrophic optical damage (COD) level thereof.

Furthermore, it has also been found that in this case, development of a laser element for vehicle headlamps has the following problem. Specifically, even when obvious problems such as separation of the end surface coating film were not found, the properties of some of laser elements formed with the element split line displaced deteriorated after a vibration test. An analysis of the laser element having deteriorated properties shows that particles which had not been present before the vibration test adhere to the end surface after the test. This seems to be due to generation of particles in the vibration test that are originated from microcracks formed upon the element split. Furthermore, even when obvious problems such as separation of the end surface coating film and the particles were not found, some of laser elements formed with the element split line displaced were found less reliable. This suggests that some damage occurred upon the element split may have affected the reliability of the laser element.

As described above, it has been revealed that in the high-out nitride-based semiconductor laser of the class of several watts, using the conventionally-used element split structure is insufficient and causes a few problems. Therefore, there has been a demand for development of a new technique for accurate element split.

To deal with such problems, the inventors have diligently studied and found a technique that reduces displacement of the element split line and sufficiently reduces generation of particles upon the element split by: forming a first trench and a second trench which extend in the extending direction (second direction) of a waveguide in a semiconductor layer stacked body formed on a substrate; forming a recess between the first trench and the second trench; and further forming, between the first trench and the second trench, a third trench extending in the extending direction of the waveguide.

Embodiment 1 of the present disclosure has been conceived to solve such problems and aims to provide, for example, a nitride semiconductor light-emitting element and a method for manufacturing a nitride semiconductor light-emitting element in which displacement of the element split line is reduced and generation of particles upon an element split is sufficiently reduced.

Hereinafter, Embodiment 1 of the present disclosure will be described with reference to the drawings.

Figure 1B:
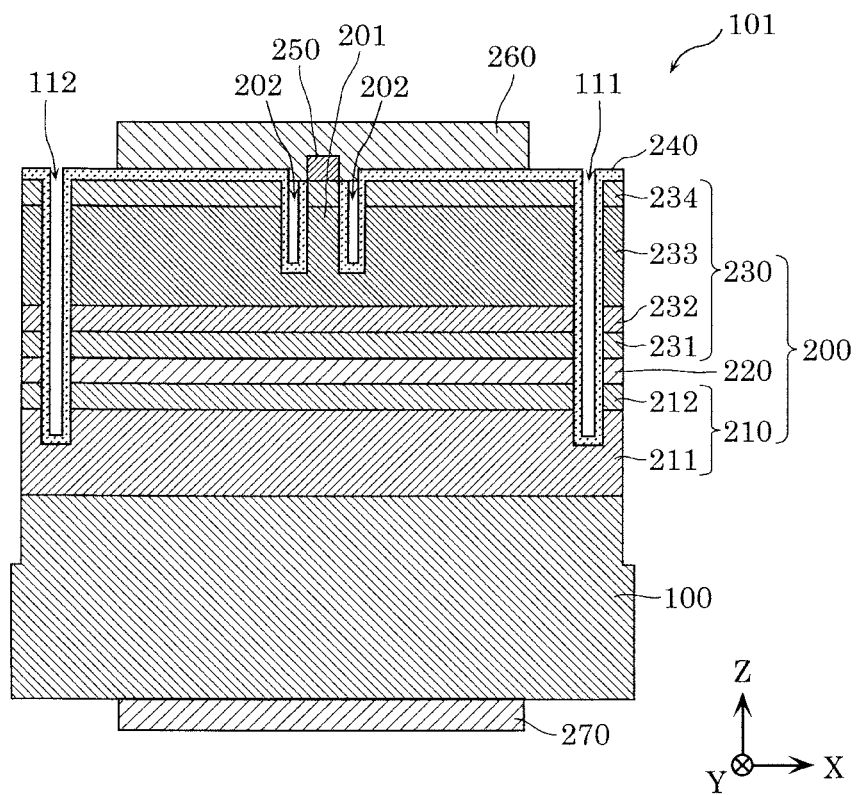
FIG. 1B is a cross-sectional view of a nitride semiconductor light-emitting element according to Embodiment 1.

First, the configurations of semiconductor layer stacked substrate 102 and nitride semiconductor light-emitting element 101 according to Embodiment 1 will be described with reference to FIG. 1A and FIG. 1B. FIG. 1A is a cross-sectional view of a portion of semiconductor layer stacked substrate 102 according to Embodiment 1. FIG. 1B is a cross-sectional view of nitride semiconductor light-emitting element 101 according to Embodiment 1.

Semiconductor layer stacked substrate 102 illustrated in FIG. 1A is a nitride semiconductor light-emitting element stacked substrate, and nitride semiconductor light-emitting element 101 illustrated in FIG. 1B can be obtained by splitting semiconductor layer stacked substrate 102. In the present embodiment, nitride semiconductor light-emitting element 101 is a nitride semiconductor laser including semiconductor element structure 200 made from a nitride-based material.

As illustrated in FIG. 1A, semiconductor layer stacked substrate 102 includes substrate 100 and semiconductor layer stacked body 200A stacked on substrate 100.

As illustrated in FIG. 1B, nitride semiconductor light-emitting element 101 includes substrate 100 and semiconductor element structure 200 stacked on substrate 100.

Substrate 100 is a semiconductor substrate such as a nitride semiconductor substrate and, for example, is a GaN substrate made from GaN. In the present embodiment, a hexagonal crystal, n-type GaN substrate is used as substrate 100.

Semiconductor layer stacked body 200A of semiconductor layer stacked substrate 102 illustrated in FIG. 1A and semiconductor layer stacked body 200 in nitride semiconductor layer light-emitting element 101 illustrated in FIG. 1B have the same layer configuration. Specifically, semiconductor layer stacked substrate 102 and nitride semiconductor light-emitting element 101 include first nitride semiconductor layer 210 of the first conductivity type, active layer 220, and second nitride semiconductor layer 230 of the second conductivity type sequentially on substrate 100 as semiconductor layer stacked body 200A and semiconductor element structure 200.

First nitride semiconductor layer 210 includes, for example, n-type clad layer 211 made from n-type AlGaN and n-side guide layer 212 made from GaN formed on n-type clad layer 211.

Active layer 220 is a nitride semiconductor layer. In the present embodiment, active layer 220 is an undoped quantum well active layer and, for example, has a quantum well structure in which a quantum well layer made from InGaN and a quantum barrier layer made from InGaN are alternately stacked.

Second nitride semiconductor layer 230 includes, for example, p-side guide layer 231 made from InGaN, p-type electron barrier layer (overflow controlling layer) 232 formed on p-side guide layer 231, p-type clad layer 233 made from p-type AlGaN formed on p-type electron barrier layer 232, and p-type contact layer 234 made from p-type GaN formed on p-type clad layer 233.

As illustrated in FIG. 1A, second nitride semiconductor layer 230 of semiconductor layer stacked substrate 102 includes a plurality of waveguides 201 extending in the form of ridge stripes in the laser cavity length direction. As illustrated in FIG. 1B, second nitride semiconductor layer 230 of nitride semiconductor light-emitting element 101 includes single waveguide 201 extending in the laser cavity length direction. Waveguide 201 functions as an electric current injecting region and an optical waveguide in nitride semiconductor light-emitting element 101.

Each waveguide 201 can be formed by digging, in second nitride semiconductor layer 230, two openings 202 extending in the laser cavity length direction. In other words, each waveguide 201 is sandwiched between two openings 202 formed in second nitride semiconductor layer 230. In the present embodiment, waveguide 201 is formed by digging in p-type clad layer 233 and p-type contact layer 234.

Furthermore, electric current blocking layer 240 made from $SiO_2$ covers second nitride semiconductor layer 230 (in the present embodiment, p-type contact layer 234), except for a portion over each waveguide 201, from above. In other words, electric current blocking layer 240 is formed including an opening above p-type contact layer 234.

P-side ohmic electrode 250 and p-side electrode 260 are formed above semiconductor element structure 200 and semiconductor layer stacked body 200A as a first electrode. P-side ohmic electrode 250 is formed in the opening of electric current blocking layer 240. P-side electrode 260 is formed on p-side ohmic electrode 250. P-side ohmic electrode 250 is made, for example, from Pd and Pt, and p-side electrode 260 is made, for example, from Ti, Pt, and Au. P-side electrode 260 is formed as the uppermost surface of each of semiconductor layer stacked substrate 102 and nitride semiconductor light-emitting element 101.

Furthermore, n-side electrode 270 is formed on the other side (back surface) opposite to one surface (p-side electrode 260-side surface) of substrate 100 as a second electrode. N-side electrode 270 is made, for example, from Ti, Pt, and Au.

As illustrated in FIG. 1A, in semiconductor layer stacked substrate 102, first trench 111 and second trench 112 are formed along the longitudinal direction of the plurality of waveguides 201 (Y-axis direction: the second direction), between two adjacent waveguides 201 among the plurality of waveguides 201. In other words, first trench 111 and second trench 112 extend substantially parallel to waveguides 201. First trench 111 and second trench 112 are formed adjacent to each other as a pair, and waveguide 201 is present between the pair of first trench 111 and second trench 112 that are adjacent to each other. Each of first trench 111 and second trench 112 is in the form of a recess defined by the lower surface and two facing side surfaces formed almost at a right angle with respect to the lower surface.

Note that as illustrated in FIG. 1B, in nitride semiconductor light-emitting element 101, waveguide 201 is present between one first trench 111 and one second trench 112.

First trench 111 and second trench 112 are formed by digging in semiconductor layer stacked body 200A. Specifically, first trench 111 and second trench 112 are dug so that the bottom of each of first trench 111 and second trench 112 reaches first nitride semiconductor layer 210. In other words, first trench 111 and second trench 112 are formed by digging in second nitride semiconductor layer 230, active layer 220, and a portion of first nitride semiconductor layer 210. In the present embodiment, digging extends halfway in n-type clad layer 211; the bottom of each of first trench 111 and second trench 112 reaches the inside of n-type clad layer 211. Note that first trench 111 and second trench 112 have the same depth, but this is not limiting.

Next, a method for manufacturing nitride semiconductor light-emitting element 101 according to Embodiment 1 will be described with reference to FIG. 2A to FIG. 2K. FIG. 2A to FIG. 2K are diagrams for describing the method for manufacturing nitride semiconductor light-emitting element 101 according to Embodiment 1.

In the method for manufacturing nitride semiconductor light-emitting element 101 according to the present embodiment, first, semiconductor layer stacked substrate 102 is fabricated as illustrated in FIG. 2A to FIG. 2F, and semiconductor layer stacked substrate 102 is split as illustrated in FIG. 2G to FIG. 2K. Specific processes will be described in detail below.

Figure 2A:
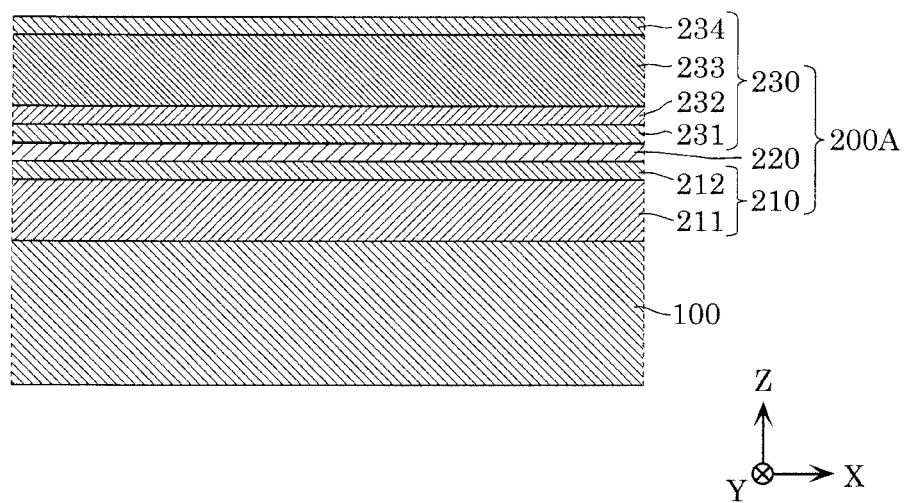
FIG. 2A is a diagram illustrating the process of forming a semiconductor layer stacked body on a substrate in a method for manufacturing a nitride semiconductor light-emitting element according to Embodiment 1.

First, as illustrated in FIG. 2A, a n-type GaN substrate is prepared as substrate 100, and semiconductor layer stacked body 200A is formed on the entire upper surface of substrate 100 by epitaxial growth of a semiconductor layer including a plurality of nitride semiconductors.

Specifically, first nitride semiconductor layer 210 is formed by causing n-type clad layer 211 made from Ge-doped n-type AlGaN and n-side guide layer 212 made from n-type GaN to sequentially grow on substrate 100.

Subsequently, for example, a quantum well active layer in which a well layer made from undoped InGaN and a barrier layer made from undoped InGaN are alternately stacked once or more than once is formed on first nitride semiconductor layer 210 (in the present embodiment, on n-side guide layer 212) as active layer 220.

Thereafter, p-side guide layer 231 made from InGaN, p-type electron barrier layer 232, p-type clad layer 233 made from Mg-doped p-type AlGaN, and p-type contact layer 234 made from p-type GaN are sequentially formed on active layer 220.

Figure 2B:
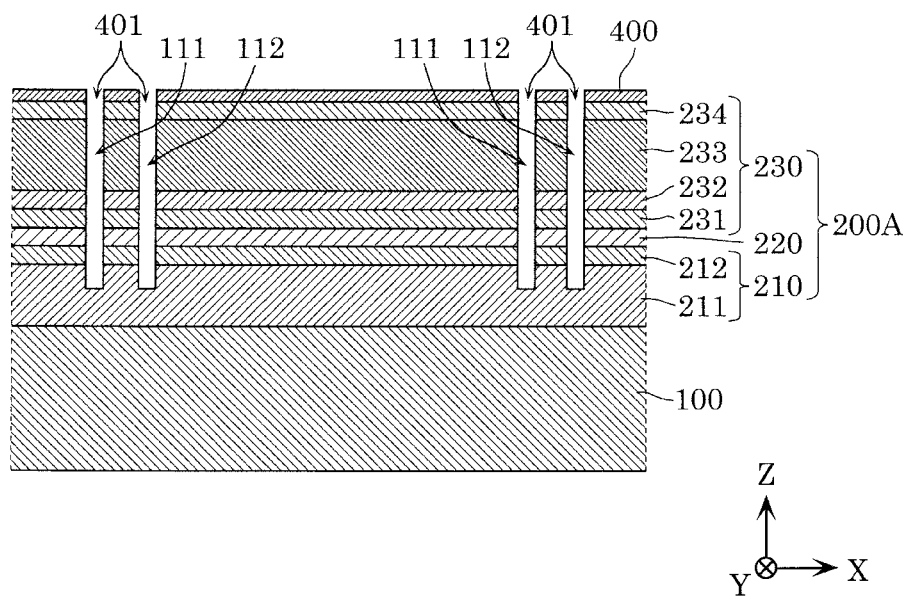
FIG. 2B is a diagram illustrating the process of forming a first trench and a second trench in a method for manufacturing a nitride semiconductor light-emitting element according to Embodiment 1.

Next, as illustrated in FIG. 2B, on substrate 100 with semiconductor layer stacked body 200A formed thereon in which the plurality of waveguides 201 extending in the Y-axis direction (on-paper vertical direction) in the substrate plane are formed, first trench 111 and second trench 112 are formed along the Y-axis direction, sandwiching the area in which the plurality of waveguides 201 are formed.

Specifically, mask 400 made of a SiO$_2$ film and a first resist film (not illustrated in the drawings) are sequentially formed on p-type contact layer 234 using a vacuum deposition method and an etching technique, and an opening is formed in the first resist film using a photolithography technique. This opening of the first resist film is formed in a portion corresponding to each of first trench 111 and second trench 112.

Subsequently, first opening 401 is formed in mask 400 by etching, using an etching technique, a portion of mask 400 that corresponds to the opening of the first resist film, and then the remaining first resist film is removed.

Subsequently, first trench 111 and second trench 112 are formed by etching, using a dry-etching technique such as reactive ion etching (RIE), semiconductor layer stacked body 200A in a portion that is located on and below p-type contact layer 234 and corresponds to first opening 401 of mask 400.

At this time, first trench 111 and second trench 112 are formed by digging in semiconductor layer stacked body 200A toward substrate 100 by means of etching and removing active layer 220 and second nitride semiconductor layer 230 until the bottom surface of each of first trench 111 and second trench 112 reaches first nitride semiconductor layer 210. The bottom (depth) of each of first trench 111 and second trench 112 reaches at least first nitride semiconductor layer 210 and may reach substrate 100. Specifically, first nitride semiconductor layer 210 or substrate 100 is exposed at the bottom of each of first trench 111 and second trench 112. In the present embodiment, the bottom of each of first trench 111 and second trench 112 reaches n-type clad layer 211.

In this manner, first trench 111 and second trench 112 can be formed. Furthermore, in this process, although details will be described later, recess 120 (refer to FIG. 2G and FIG. 5) is formed between first trench 111 and second trench 112. Recess 120 is formed at the same time as first trench 111 and second trench 112 are formed. Therefore, the depth of recess 120 is the same as the depth of each of first trench 111 and second trench 112. Furthermore, first trench 111 and second trench 112 are connected by recess 120. In other words, first trench 111, second trench 112, and recess 120 share the bottom surface and are formed continuous with one another. Note that details of the entire shape including the top view shape of first trench 111, second trench 112, and recess 120 will be described later.

Figure 2C:
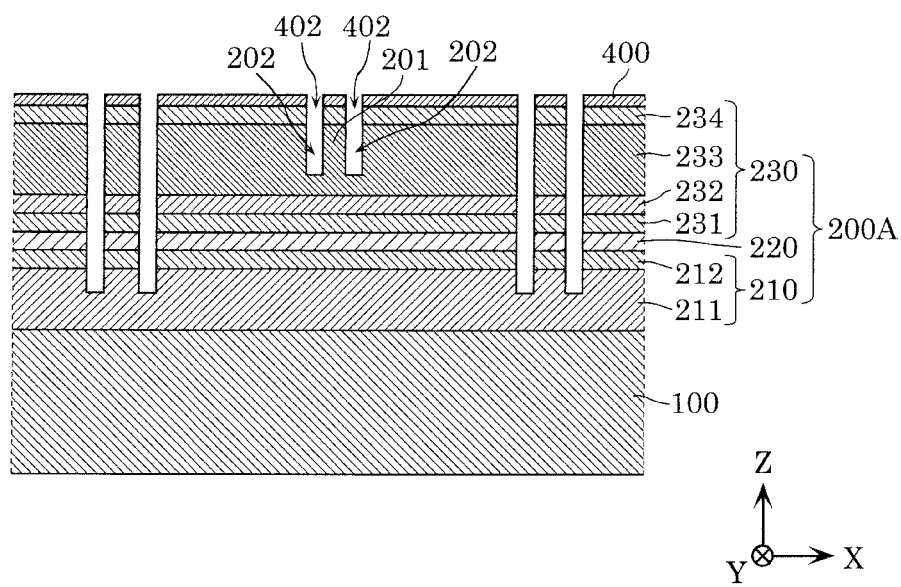
FIG. 2C is a diagram illustrating the process of forming a waveguide in a method for manufacturing a nitride semiconductor light-emitting element according to Embodiment 1.

Next, as illustrated in FIG. 2C, waveguides 201 in the form of ridge stripes are formed in semiconductor layer stacked body 200A.

Specifically, a second resist film (not illustrated in the drawings) is formed on mask 400, and using a photolithography technique, openings in the form of stripes are formed in the second resist film. These openings of the second resist film are formed in portions corresponding to openings 202 between which waveguide 201 is located.

Subsequently, second opening 402 is formed in mask 400 by etching, using an etching technique, a portion of mask 400 that corresponds to the opening of the second resist film, and then the remaining second resist film is removed.

Subsequently, two openings 202 are formed by etching, using a dry-etching technique such as RIE, semiconductor layer stacked body 200A in portions that are located on and below p-type contact layer 234 and correspond to second openings 402 of mask 400.

At this time, two openings 202 are formed by digging in semiconductor layer stacked body 200A toward substrate 100 until the bottom of each of two openings 202 reaches p-type clad layer 233. Specifically, p-type contact layer 234 is etched, and p-type clad layer 233 is etched from the upper surface to a portion thereof having a predetermined depth. As a result, waveguides 201 in the form of ridge stripes are formed. At this time, the plurality of waveguides 201 are formed at predetermined intervals, extending along the Y-axis in the substrate plane of substrate 100.

Figure 2D:
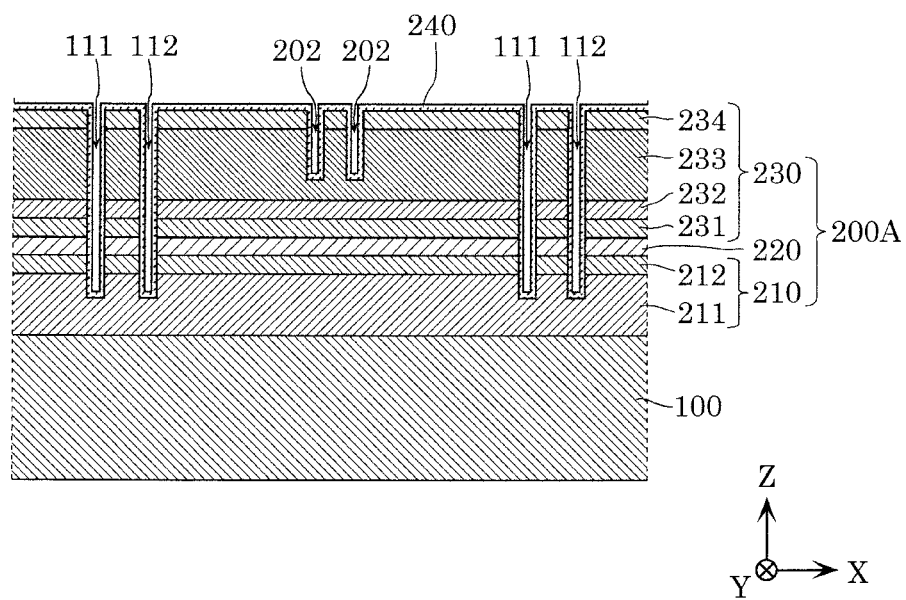
FIG. 2D is a diagram illustrating the process of forming an electric current blocking layer in a method for manufacturing a nitride semiconductor light-emitting element according to Embodiment 1.

Next, after mask 400 is removed, electric current blocking layer 240 is formed to cover semiconductor layer stacked body 200A, as illustrated in FIG. 2D.

Specifically, electric current blocking layer 240 including a $SiO_2$ film having a thickness of approximately 300 nm is formed on semiconductor layer stacked body 200A across the entire upper surface of substrate 100 using the plasma chemical vapor deposition (CVD) method. With this, the upper surface of p-type contact layer 234 is covered by electric current blocking layer 240, and the inner surfaces of first trench 111, second trench 112, and opening 202 are covered by electric current blocking layer 240.

Figure 2E:
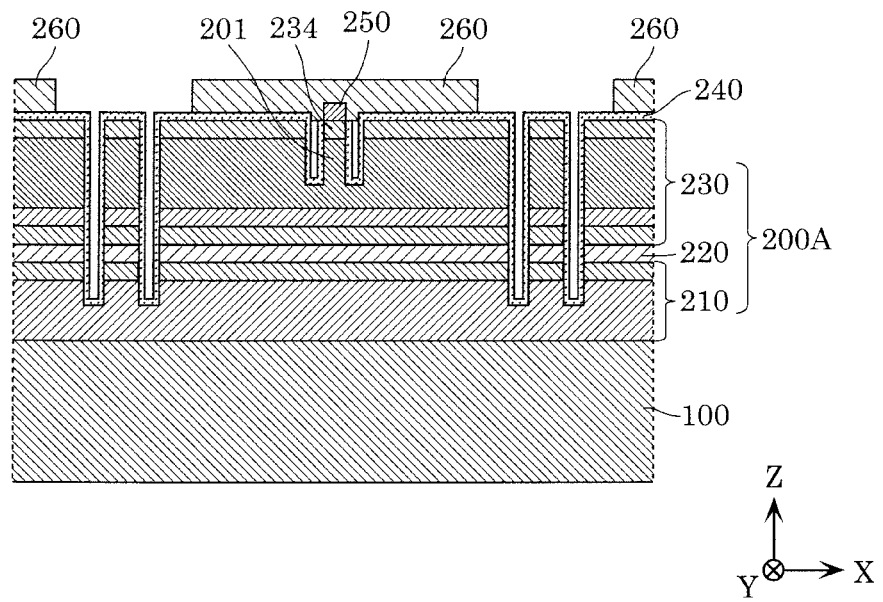
FIG. 2E is a diagram illustrating the process of forming a p-side ohmic electrode and a p-side electrode in a method for manufacturing a nitride semiconductor light-emitting element according to Embodiment 1.

Next, as illustrated in FIG. 2E, p-side ohmic electrode 250 and p-side electrode 260 each patterned into a predetermined shape are formed above semiconductor layer stacked body 200A.

Specifically, using an etching technique in which a third resist film (not illustrated in the drawings) is used as a mask, electric current blocking layer 240 above waveguides 201 in the form of ridge stripes is etched to form openings in the form of stripes in electric current blocking layer 240. Thereafter, using a vacuum deposition method and an etching technique, a Pt film and a Pd film are sequentially stacked on p-type contact layer 234 at each of waveguides 201 in the form of ridge stripes to form p-side ohmic electrode 250.

Subsequently, using a vacuum deposition method and a lift-off method, a Ti film and a Au film are sequentially stacked to cover the openings of electric current blocking layer 240, and thus p-side electrode 260 is formed. At this time, p-side electrode 260 is formed in a predetermined region on electric current blocking layer 240 in such a manner as to contact p-side ohmic electrode 250 and has a width greater than the width of p-side ohmic electrode 250.

Thereafter, polishing is conducted on a surface of substrate 100 (back surface of substrate 100) opposite to a surface thereof on the p-side electrode 260 side until the thickness between the polished surface and p-side electrode 260 becomes approximately 85 µm.

Figure 2F:
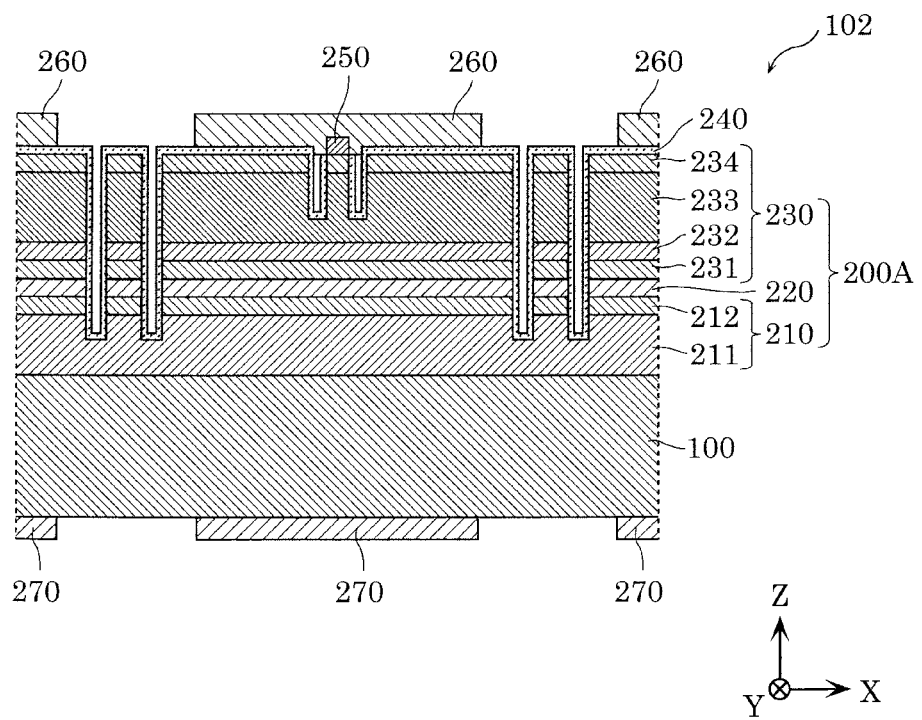
FIG. 2F is a diagram illustrating the process of forming an n-side electrode in a method for manufacturing a nitride semiconductor light-emitting element according to Embodiment 1.

Next, as illustrated in FIG. 2F, n-side electrode 270 patterned into a predetermined shape is formed on the back surface of substrate 100.

Specifically, using a vacuum deposition method and a lift-off method, a Ti film, a Pt film, and a Au film are stacked on the polished surface of substrate 100 in a sequence from substrate 100, and thus n-side electrode 270 is formed.

In this way, it is possible to fabricate semiconductor layer stacked substrate 102 in which the plurality of waveguides 201 in the form of ridge stripes are formed in semiconductor layer stacked body 200A such as that illustrated in FIG. 1A.

Next, with reference to FIG. 2G to FIG. 2K, a method for separating nitride semiconductor light-emitting element 101 as an element by splitting semiconductor layer stacked substrate 102.

Figure 2G:
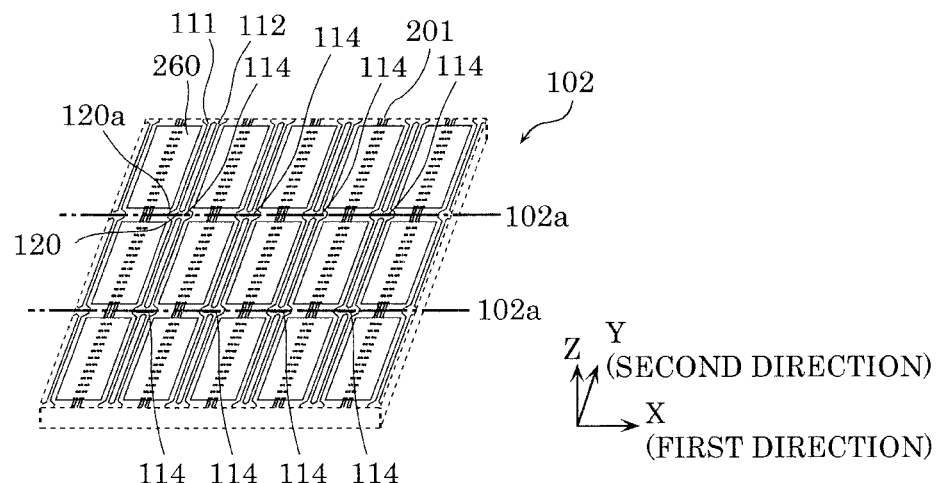
FIG. 2G is a diagram illustrating the process of forming a fourth trench in a method for manufacturing a nitride semiconductor light-emitting element according to Embodiment 1.

After the process in FIG. 2F, as illustrated in FIG. 2G, in order to cleave semiconductor layer stacked substrate 102, fourth trench 114 is formed by a laser scribe method as a split trench for cleavage which serves as a starting point of cleavage.

The plurality of fourth trenches 114 (split trench for cleavage) are formed in predetermined split positions 102a (positions subject to cleavage) at given intervals. In the present embodiment, in semiconductor layer stacked substrate 102, recess 120 and first portion 120a including a partial region of recess 120 are formed in predetermined split positions 102a as a region for forming fourth trench 114. In other words, each fourth trench 114 is formed at first portion 120a in such a manner as to traverse recess 120.

The plurality of fourth trenches 114 are formed along the first direction (X-axis direction) orthogonal to the longitudinal direction (Y-axis direction) of waveguides 201 in the substrate plane. Each of fourth trenches 114 is elongated in the first direction. A plurality of lines each made up of the plurality of fourth trenches 114 aligned in the first direction are arranged in the longitudinal direction of waveguides 201.

Therefore, at the time of forming fourth trenches 114, laser light for the laser scribe method is intermittently emitted to semiconductor layer stacked substrate 102 as the laser light is moved relative thereto, and thus fourth trenches 114 can be formed into the shape of broken lines extending in a direction (first direction) orthogonal to the longitudinal direction of waveguides 201.

Note that fourth trenches 114 may be formed at all of the plurality of first portions 120a or may be formed at a constant interval among the plurality of first portions 120a, in a direction orthogonal to waveguides 201 in plan view. Stated differently, the plurality of first portions 120a may include first portion 120a at which no fourth trench 114 is formed.

The depth of fourth trench 114 (the depth measured from p-type contact layer 234 toward substrate 100) is greater than the depth of each of first trench 111 and second trench 112. In the present embodiment, fourth trench 114 reaches substrate 100. Specifically, the actual depth of fourth trench 114 is desirably at least 20 µm; if the depth of fourth trench 114 is less than 20 µm, there is a risk of out-of-line cleavage or the like. On the other hand, if fourth trench 114 is too deep, the leading end of fourth trench 114 has a round shape; also in this case, there is a high likelihood of out-of-line cleavage or the like. Therefore, the depth of fourth trench 114 is desirably between 20 µm and 60 µm, inclusive.

Figure 2H:
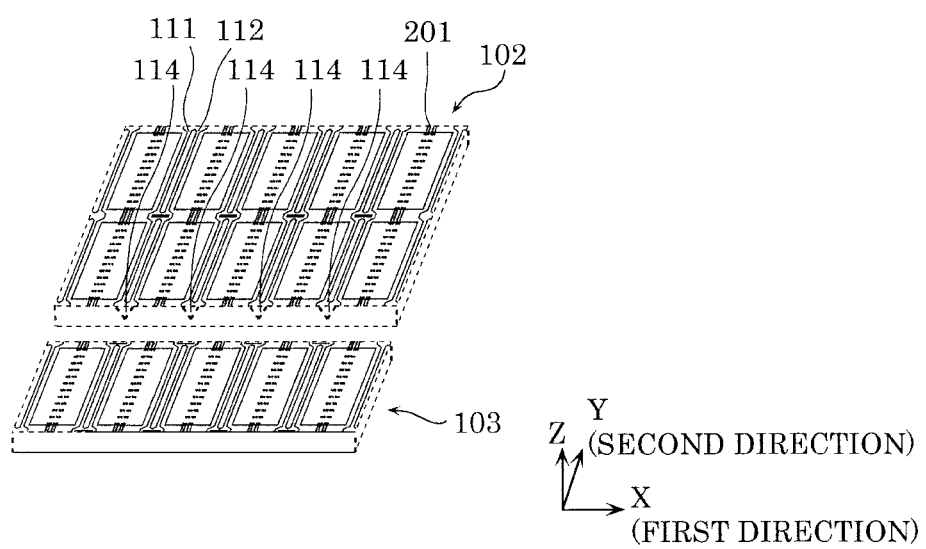
FIG. 2H is a diagram illustrating the process of cleaving a semiconductor layer stacked substrate in a method for manufacturing a nitride semiconductor light-emitting element according to Embodiment 1.

Next, as illustrated in FIG. 2H, semiconductor layer stacked substrate 102 is split into segments by cleaving semiconductor layer stacked substrate 102 in split positions 102a (cleavage positions) along the first direction (X-axis direction) orthogonal to the longitudinal direction of waveguides 201 (Y-axis direction: the second direction) in the substrate plane. In the present embodiment, semiconductor layer stacked substrate 102 is split into a plurality of bar-shaped substrates 103 by cleaving semiconductor layer stacked substrate 102 with fourth trenches 114 formed therein (primary cleavage).

Specifically, load is applied by causing a blade-shaped tool extending in a direction (first direction) orthogonal to waveguides 201 in the substrate plane to contact semiconductor layer stacked substrate 102 with fourth trench 114 from the n-side electrode 270 side along fourth trench 114. With this, semiconductor layer stacked substrate 102 is cleaved along fourth trenches 114, and thus bar-shaped substrate 103 is formed from semiconductor layer stacked substrate 102.

At this time, semiconductor layer stacked substrate 102 is cleaved more than one time, at each line of the plurality of fourth trenches 114 arranged in the form of broken lines along a direction orthogonal to waveguides 201 in the substrate plane. Thus, a plurality of bar-shaped substrates 103 are formed from semiconductor layer stacked substrate 102.

Figure 2I:
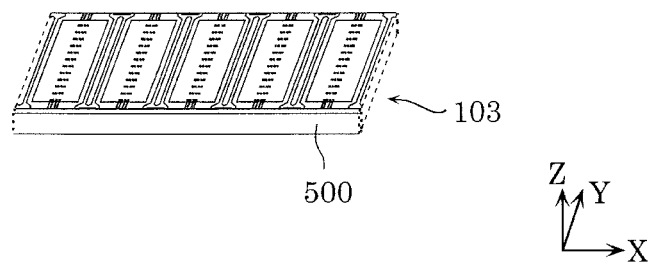
FIG. 2I is a diagram illustrating the process of forming an end surface coating film on a bar-shaped substrate in a method for manufacturing a nitride semiconductor light-emitting element according to Embodiment 1.

Next, as illustrated in FIG. 2I, end surface coating film 500 is formed on the cleavage surface of bar-shaped substrate 103 obtained by the cleavage.

Specifically, an AlON film, which serves as an adhesion layer, an AlN film, which serves an oxygen diffusion prevention layer, and a reflectivity adjustment layer are formed on one cleavage surface of bar-shaped substrate 103 as a first end surface coating film. Furthermore, an AlON film, which serves as an adhesion layer, an AlN film, which serves an oxygen diffusion prevention layer, and a reflectivity adjustment layer are formed on the other cleavage surface of bar-shaped substrate 103 in the stated order as a second end surface coating film.

Figure 2J:
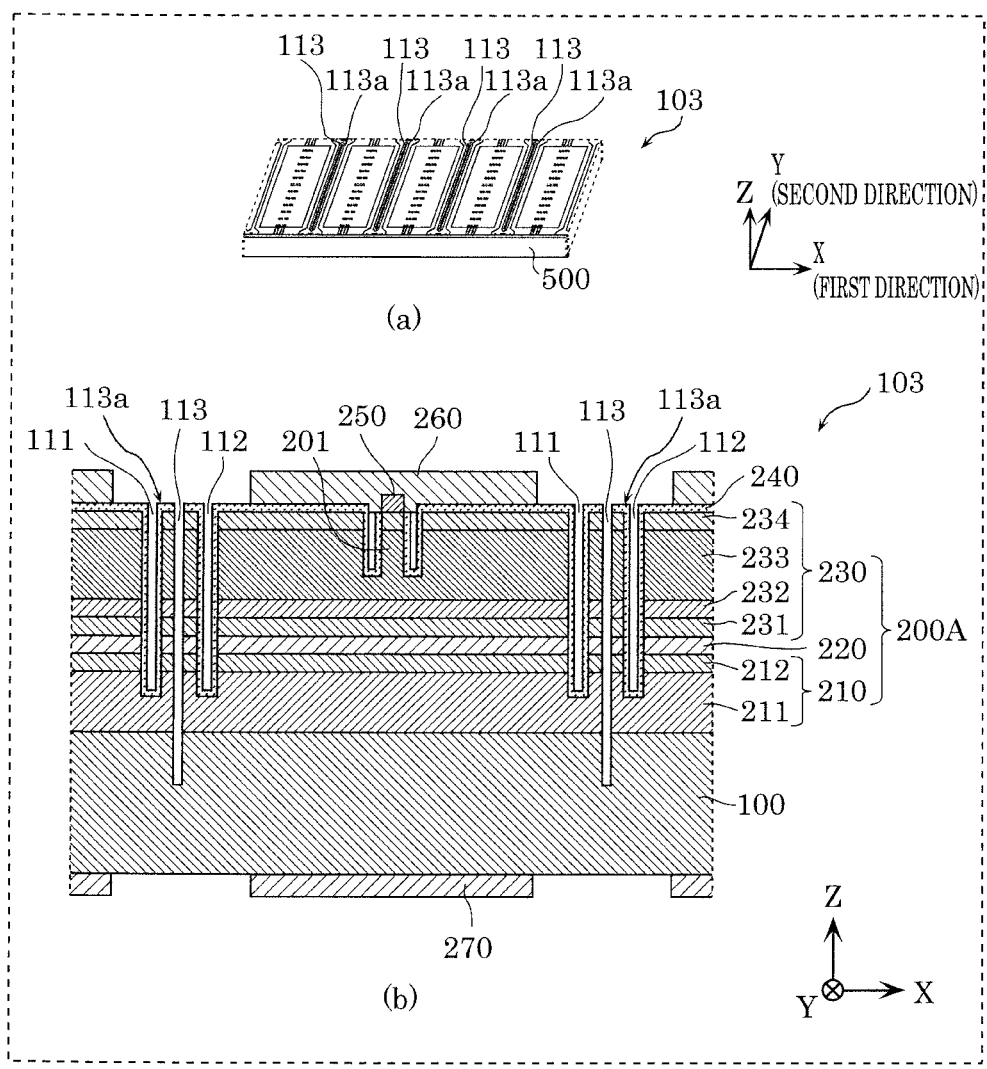
FIG. 2J is a diagram illustrating the process of forming a third trench in a method for manufacturing a nitride semiconductor light-emitting element according to Embodiment 1.

Next, as illustrated in FIG. 2J, third trench 113 extending in the longitudinal direction of waveguides 201 (Y-axis direction: the second direction) and having a width between 3 μm and 8 μm, inclusive, is formed between first trench 111 and second trench 112 in bar-shaped substrate 103. In the present embodiment, third trench 113 is formed in bar-shaped substrate 103. Similarly to fourth trench 114, third trench 113 is formed by a laser scribe method.

Third trench 113 is formed in bar-shaped substrate 103 in advance for splitting (separating) bar-shaped substrate 103. In other words, third trench 113 is a split trench serving as a starting point for element splits and is formed between adjacent waveguides 201 in bar-shaped substrate 103.

Third trench 113 is formed, from above, in split trench forming region 113a having a cross-section in the form of a projection between first trench 111 and second trench 112. Split trench forming region 113a is surrounded by first trench 111, second trench 112, and two recesses 120, and the form of a projection in split trench forming region 113a is defined by an upper surface and two facing side surfaces nearly perpendicular to the upper surface. There are a plurality of split trench forming regions 113a in each area between first trench 111 and second trench 112. Third trench 113 is formed in each of the plurality of split trench forming region 113a. The plurality of third trenches 113 are formed along the longitudinal direction of waveguides 201 in the substrate plane.

The depth of third trench 113 (the depth measured from p-type contact layer 234 toward substrate 100) is greater than the depth of each of first trench 111 and second trench 112. In the present embodiment, the bottom of third trench 113 reaches substrate 100. Specifically, the actual depth of third trench 113 is desirably at least 30 μm; if the depth of third trench 113 is less than 30 μm, there is a risk of out-of-line cleavage or the like. Furthermore, if third trench 113 is too deep, the leading end of third trench 113 has a round shape; also in this case, there is a high likelihood of out-of-line cleavage or the like. In addition, an increased amount of debris is generated, which may cause a problem in the p-side electrode. Therefore, the depth of third trench 113 is preferably between 30 μm and 70 μm, inclusive, and is more preferably between 30 μm and 60 μm, inclusive.

Figure 2K:
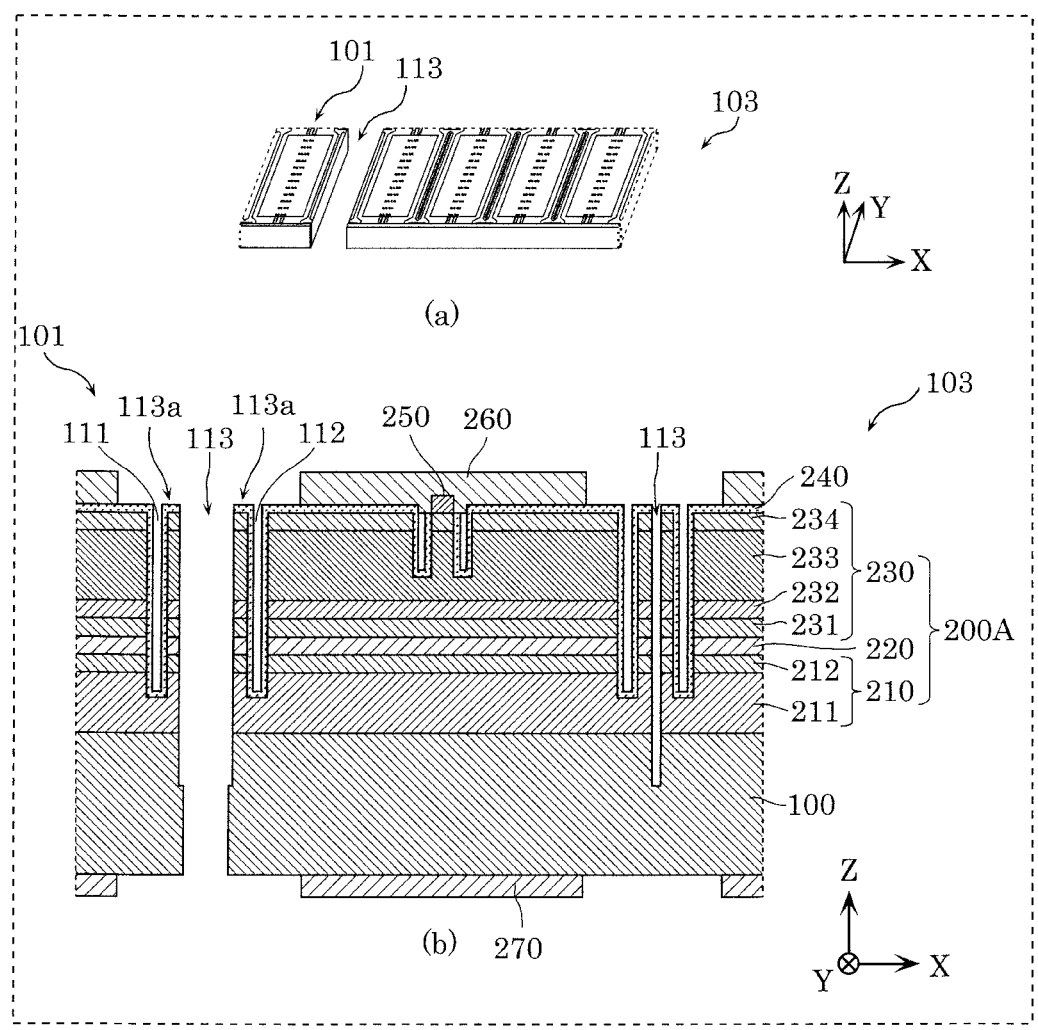
FIG. 2K is a diagram illustrating the process of splitting a bar-shaped substrate in a method for manufacturing a nitride semiconductor light-emitting element according to Embodiment 1.

Next, as illustrated in FIG. 2K, semiconductor layer stacked substrate 102 split into segments (each of bar-shaped substrates 103) is further split into segments along third trench 113. In the present embodiment, bar-shaped substrate 103 is split into segments using third trench 113 as a split trench.

Specifically, load is applied by causing a blade-shaped tool extending in the longitudinal direction of waveguides 201 to contact bar-shaped substrate 103 with third trench 113 from the n-side electrode 270 side along third trench 113. With this, bar-shaped substrate 103 is split along third trench 113. Thus, nitride semiconductor light-emitting element 101 is separated from bar-shaped substrate 103 as an individual piece.

Figure 3:
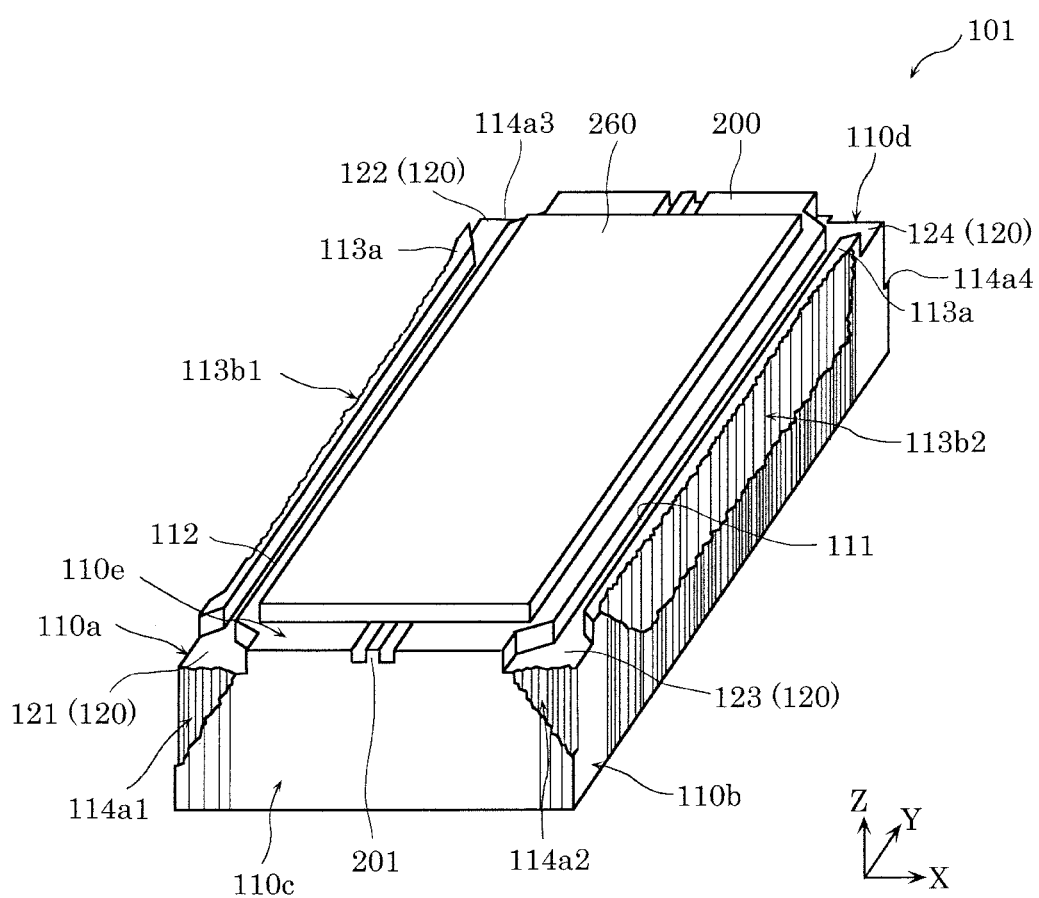
FIG. 3 is a diagram schematically illustrating a nitride semiconductor light-emitting element manufactured by a method for manufacturing a nitride semiconductor light-emitting element according to Embodiment 1.

Nitride semiconductor light-emitting element 101 fabricated in this manner is illustrated in FIG. 3. FIG. 3 is a diagram schematically illustrating nitride semiconductor light-emitting element 101 manufactured by the method for manufacturing nitride semiconductor light-emitting element 101 according to Embodiment 1. FIG. 3 is a diagram corresponding to nitride semiconductor light-emitting element 101 illustrated in FIG. 1B.

As illustrated in FIG. 3, nitride semiconductor light-emitting element 101 is obtained by forming, on substrate 100, semiconductor element structure 200 including waveguide 201. Nitride semiconductor light-emitting element 101 includes: first side surface 110a substantially parallel to the longitudinal direction (second direction) of waveguide 201; second side surface 110b opposite to first side surface 110a; third side surface 110c substantially perpendicular to first side surface 110a and second side surface 110b; fourth side surface 110d opposite to third side surface 110c, and upper surface 110e.

Nitride semiconductor light-emitting element 101 has an approximate quadrangular shape surrounded by first side surface 110a, second side surface 110b, third side surface 110c, and fourth side surface 110d in top view. Third side surface 110c and fourth side surface 110d are in contact with waveguide 201 and are cleavage surfaces. Each of third side surface 110c and fourth side surface 110d is covered by end surface coating film. Upper surface 110e is the upper surface of semiconductor element structure 200.

Nitride semiconductor light-emitting element 101 includes: first trench 111 formed between second side surface 110b and waveguide 201 and extending in the longitudinal direction of waveguide 201; and second trench 112 formed between first side surface 110a and waveguide 201 and extending in the longitudinal direction of waveguide 201.

Furthermore, nitride semiconductor light-emitting element 101 includes first recess 121, second recess 122, third recess 123, and fourth recess 124 as recess 120. First recess 121, second recess 122, third recess 123, and fourth recess 124 are formed at the four corners of an approximate quadrangle surrounded by first side surface 110a, second side surface 110b, third side surface 110c, and fourth side surface 110d in top view.

First recess 121 is formed near the intersection between first side surface 110a and third side surface 110c in plan view. In other words, first recess 121 is formed over first side surface 110a and third side surface 110c.

Second recess 122 is formed near the intersection between first side surface 110a and fourth side surface 110d in plan view. In other words, second recess 122 is formed over first side surface 110a and fourth side surface 110d.

Third recess 123 is formed near the intersection between second side surface 110b and third side surface 110c in plan view. In other words, third recess 123 is formed over second side surface 110b and third side surface 110c.

Fourth recess 124 is formed near the intersection between second side surface 110b and fourth side surface 110d in plan view. In other words, fourth recess 124 is formed over second side surface 110b and fourth side surface 110d.

Furthermore, nitride semiconductor light-emitting element 101 includes, as a portion of third trench 113, first depressed portion 113b1 which is depressed toward second side surface 110b from first side surface 110a and second depressed portion 113b2 which is depressed toward first side surface 110a from second side surface 110b.

First depressed portion 113b1 including third trench 113 is nearly trapezoidal in shape when viewed from the first side surface 110a side. In this trapezoidal shape, the length of the lower base on the n-side electrode 270 side is shorter than the length of the upper base on the p-side electrode 260 side.

As described earlier, third trench 113 is formed from the upper surface in split trench forming region 113a by the laser scribe method. For example, in the case of emitting laser light while moving the laser light from the third side surface 110c side to the fourth side surface 110d side in parallel with waveguide 201, first, the power of the laser is gradually increased while in motion, and thus a portion corresponding to the oblique side of the trapezoidal shape on the third side surface 110c side is formed. Next, after the power is increased up to a given level, this level is maintained while in motion, and thus a portion corresponding to the lower base of the trapezoidal shape is formed. Subsequently, the power is gradually reduced while in motion, and thus a portion corresponding to the oblique side of the trapezoidal shape on the fourth side surface 110d side is formed. In this manner, the shape of first depressed portion 113b1 including third trench 113 can be obtained.

Here, in first depressed portion 113b1, recesses and projections in a striped pattern are formed which extend from the front surface side, on which p-side electrode 260 is formed, toward the back surface side, on which n-side electrode 270 is formed, of nitride semiconductor light-emitting element 101. These recesses and projections in the striped pattern are first recesses and projections in a striped pattern which are due to laser scribing. These first recesses and projections in a striped pattern are formed in entire first depressed portion 113b1. Furthermore, in the area between first depressed portion 113b1 and the back surface, that is, an n-side electrode 270-side area of first side surface 110a or an area close thereto, second recesses and projections in a striped pattern which extend toward the back surface are formed due to first depressed portion 113b1 upon the element split. In first side surface 110a, the size (the average height of a projection and an area between projections) of the first recesses and projections in a striped pattern, which is formed in first depressed portion 113b1, and the size of the second recesses and projection (roughness) in a striped pattern, which is formed on the n-side electrode 270 side, are greater than the size of roughness between first depressed portion 113b1 and third side surface 110c and the size of roughness between first depressed portion 113b1 and fourth side surface 110d.

Second depressed portion 113b2 including third trench 113, which is located opposite to first depressed portion 113b1, is formed in substantially the same method, and thus has substantially the same shape as first depressed portion 113b1. Accordingly, the shape of second side surface 110b is substantially the same as the shape of first side surface 110a.

First depressed portion 113b1 is a section recessed to form a step such that a region including an upper end portion of first side surface 110a is depressed. Likewise, second depressed portion 113b2 is a section recessed to form a step such that a region including an upper end portion of second side surface 110b is depressed.

Furthermore, nitride semiconductor light-emitting element 101 includes, as a portion of fourth trench 114, first depressed portion 114a1 which contacts first side surface 110a and is depressed toward fourth side surface 110d from third side surface 110c, second depressed portion 114a2 which contacts second side surface 110b and is depressed toward fourth side surface 110d from third side surface 110c, third depressed portion 114a3 which contacts first side surface 110a and is depressed toward third side surface 110c from fourth side surface 110d, and fourth depressed portion 114a4 which contacts second side surface 110b and is depressed toward third side surface 110c from fourth side surface 110d.

First depressed portion 114a1 and second depressed portion 114a2 including fourth trench 114 are nearly triangular in shape when viewed from the third side surface 110c side; there are steps in the form of recesses and projections on substrate 100 and in an area close thereto, from first depressed portion 114a1 and second depressed portion 114a2 of third side surface 110c toward the back surface, resulting in the form of a displaced staircase with non-flush cleavage surfaces at the step portions.

Similarly, third depressed portion 114a3 and fourth depressed portion 114a4 including fourth trench 114 are nearly triangular in shape when viewed from the fourth side surface 110d side; there are steps in the form of recesses and projections on substrate 100 and in an area close thereto, from third depressed portion 114a3 and fourth depressed portion 114a4 of fourth side surface 110d toward the back surface, resulting in an incomplete cleavage surface.

If these steps contact waveguides 201 in the form of ridge stripes, problems such as a failure to obtain stable properties of nitride semiconductor element 101 occur.

Note that first trench 111, second trench 112, first recess 121, second recess 122, third recess 123, fourth recesses 124, and split trench forming region 113a are continuously covered by electric current blocking layer 240 (not illustrated in the drawings), which aims to protect stacked semiconductor element structure 200 from being electrically connected due to external particles and plays the role of reducing leakage current.

The above description focuses on the method for manufacturing nitride semiconductor light-emitting element 101, and the following describes the feature of nitride semiconductor light-emitting element 101 manufactured as described above being able to obtain a stable shape, desired element properties, etc.

Figure 4:
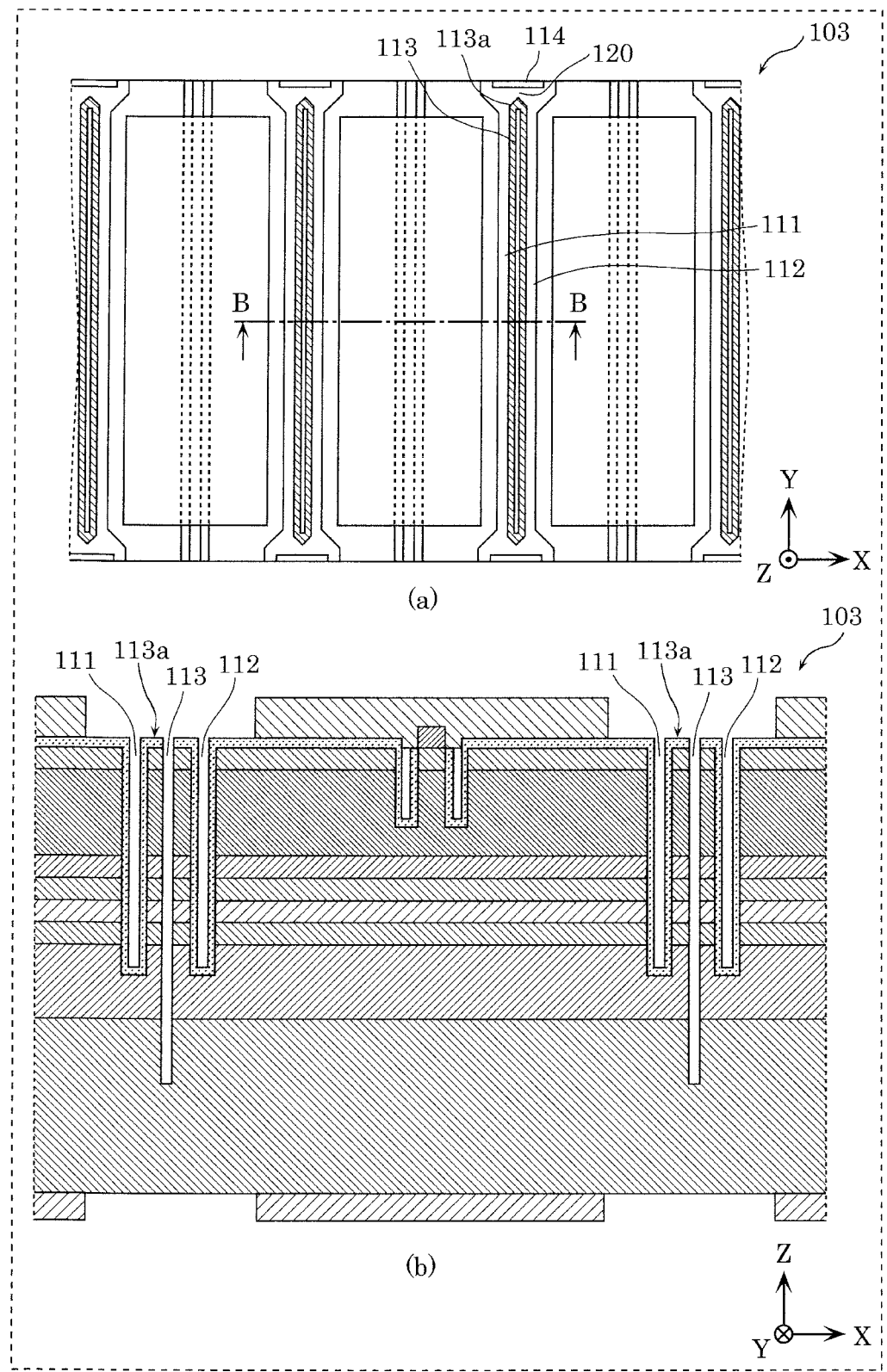
FIG. 4 is an enlarged view of a portion of a bar-shaped substrate according to Embodiment 1.
Figure 5:
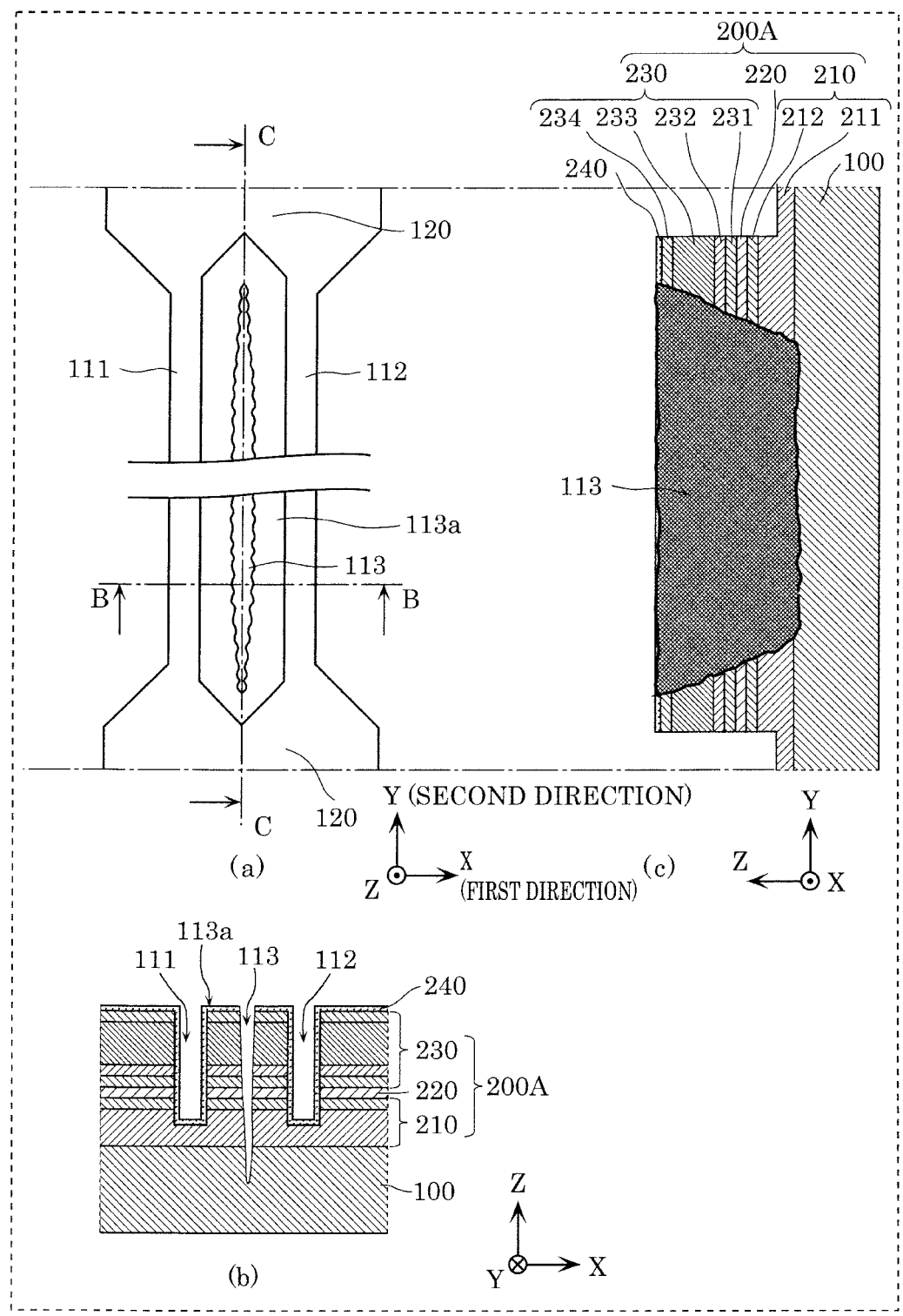
FIG. 5 is an enlarged view of a portion of a bar-shaped substrate according to Embodiment 1.

FIG. 4 and FIG. 5 illustrate bar-shaped substrate 103. In FIG. 4, (a) is an enlarged plan view of a portion of bar-shaped substrate 103, and (b) is a cross-sectional view taken along line B-B in (a) in FIG. 4. In FIG. 5, (a) is an enlarged plan view of a portion of bar-shaped substrate 103, (b) is a cross-sectional view taken along line B-B in (a) in FIG. 5, and (c) is a cross-sectional view taken along line C-C in (a) in FIG. 5.

Figure 6:
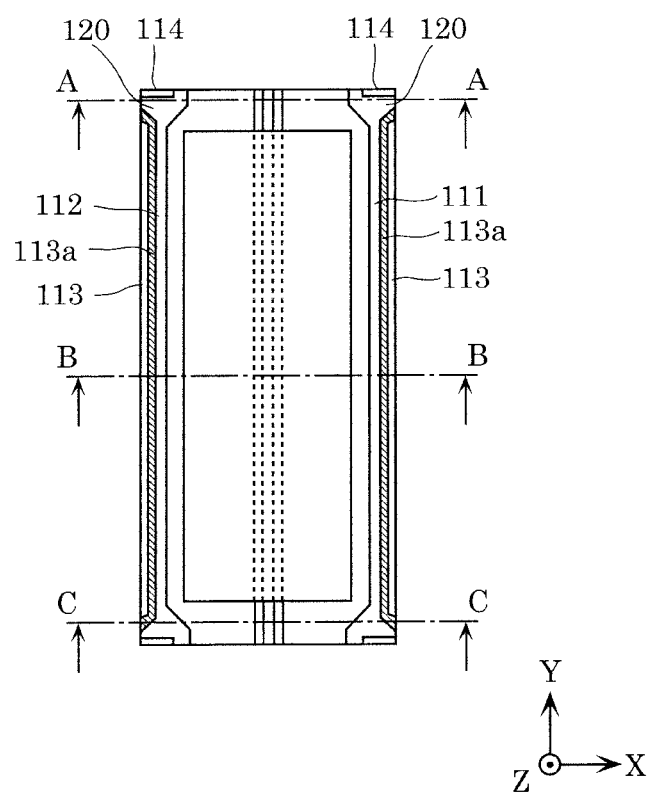
FIG. 6 is a plan view of a nitride semiconductor light-emitting element according to Embodiment 1.
Figure 7:
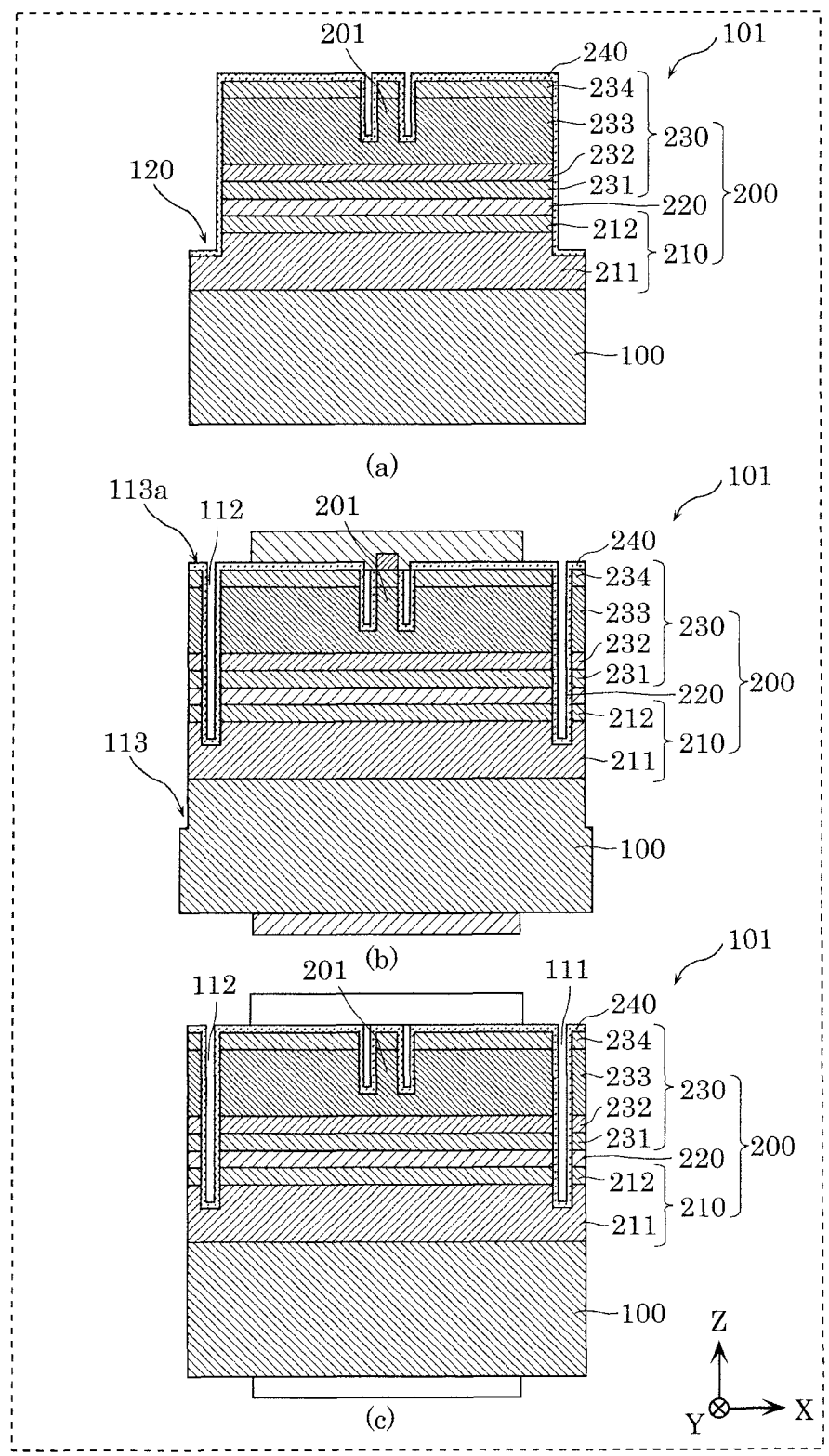
FIG. 7 is a cross-sectional view of a nitride semiconductor light-emitting element according to Embodiment 1.

FIG. 6 and FIG. 7 illustrate nitride semiconductor light-emitting element 101 obtained by splitting bar-shaped substrate 103. FIG. 6 is a plan view of nitride semiconductor light-emitting element 101. In FIG. 7, (a) is a cross-sectional view taken along line A-A in FIG. 6, (b) is a cross-sectional view taken along line B-B in FIG. 6, and (c) is a cross-sectional view taken along line C-C in FIG. 6.

As illustrated in (a) in FIG. 4, FIG. 6, and (a) in FIG. 7, recess 120 having the same depth as the depth of each of first trench 111 and second trench 112 is formed between first trench 111 and second trench 112 in a region corresponding to the corners of nitride semiconductor light-emitting element 101 after the element split.

Furthermore, as illustrated in FIG. 4 to FIG. 7, third trench 113 is formed in split trench forming region 113a surrounded by first trench 111, second trench 112, and two recesses 120. In the present embodiment, third trench 113 is elongated along the longitudinal direction of split trench forming region 113a. Specifically, third trench 113 is formed from one end portion to the other end portion of split trench forming region 113a. Note that third trench 113 is formed in split trench forming region 113a only and is not formed in recesses 120.

As illustrated in (a) in FIG. 5, third trench 113 is elongated along the longitudinal direction of split trench forming region 113a in top view. The width of third trench 113 in the first direction (X-axis direction) is small in positions close to the end portions of split trench forming regions 113a, and is great in positions distant from the end portions in the second direction (Y-axis direction).

Furthermore, as in the cross-sectional view illustrated in (b) in FIG. 5, third trench 113 formed from the upper surface in split trench forming region 113a is gradually reduced in width in the depth direction toward substrate 100 and has a depth to substrate 100.

The cross-section along the second direction (Y-axis direction) parallel to waveguide 201 does not become a cleavage surface, and thus splitting along the second direction parallel to waveguide 201 is more difficult than splitting along the first direction (X-axis direction) orthogonal to waveguide 201 in the substrate plane. Therefore, upon splitting bar-shaped substrate 103 along the second direction parallel to waveguide 201 to obtain the plurality of nitride semiconductor light-emitting elements 101, an out-of-line split, chipping, and the like are likely to occur.

Figure 8:
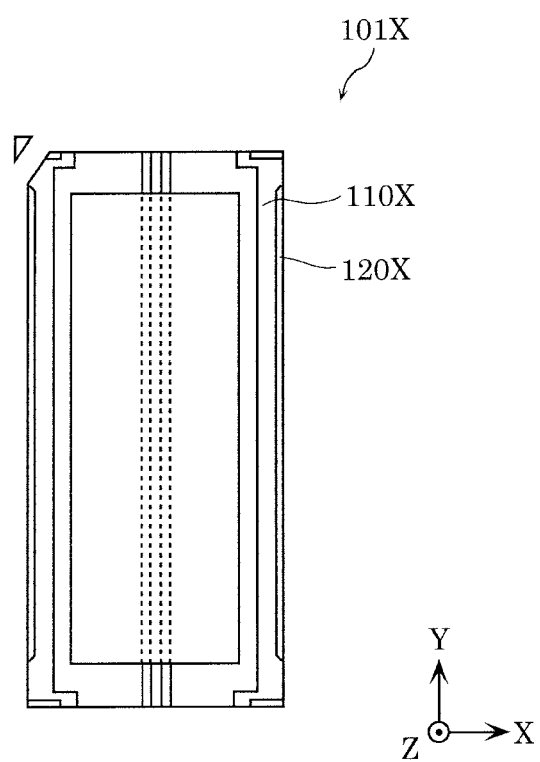
FIG. 8 is a plan view of a nitride semiconductor light-emitting element according to a comparative example.

For example, even if the two-stage guide trench structure is applied to form first guide trench 110X for element splits along the second direction parallel to waveguide 201 and further form second guide trench 120X at the bottom of first guide trench 110X as in nitride semiconductor light-emitting element 101X according to a comparative example illustrated in FIG. 8, an out-of-line split, chipping, and the like cannot be sufficiently reduced.

An out-of-line split, chipping, and the like may cause separation of the end surface coating film and generation of particles, etc. Adhesion of a portion of the generated particles to the light-emitting region of the nitride semiconductor light-emitting element cause problems such as deterioration of the properties of the nitride semiconductor light-emitting element and a reduction in the COD level thereof.

In contrast, in the present embodiment, third trench 113 serving as a starting point of split upon splitting bar-shaped substrate 103 along the second direction parallel to waveguide 201 is formed by digging from a portion of nitride semiconductor light-emitting element 101 that is close to the upper surface as exemplified by split trench forming region 113a having a cross-section in the form of a projection, instead of further digging a region formed by digging in the depth direction as exemplified by first trench 111 and second trench 112. In other words, in the present embodiment, third trench 113 is formed in a portion that remains without digging semiconductor layer stacked body 200A. Specifically, third trench 113 is formed by digging from a portion above p-type contact layer 234 where electric current blocking layer 240 is formed.

The reason why third trench 113 is formed by digging from a region of semiconductor layer stacked body 200A that is close to the upper surface as exemplified by split trench forming region 113a, instead of further digging the dug portion of semiconductor layer stacked body 200A is as follows.

As mentioned above, the inventors have conducted various studies on the split trench forming region and the structure in the vicinity thereof to deal with defects that, even when the related art is used, still occur upon splitting the nitride semiconductor light-emitting element. As a result, it has been found that the use of split trench forming region 113a according to the present embodiment reduces the occurrence of an out-of-line split, chipping, and the like. Hereinafter, this point will be described with reference to FIG. 9 and FIG. 10.

Figure 9:
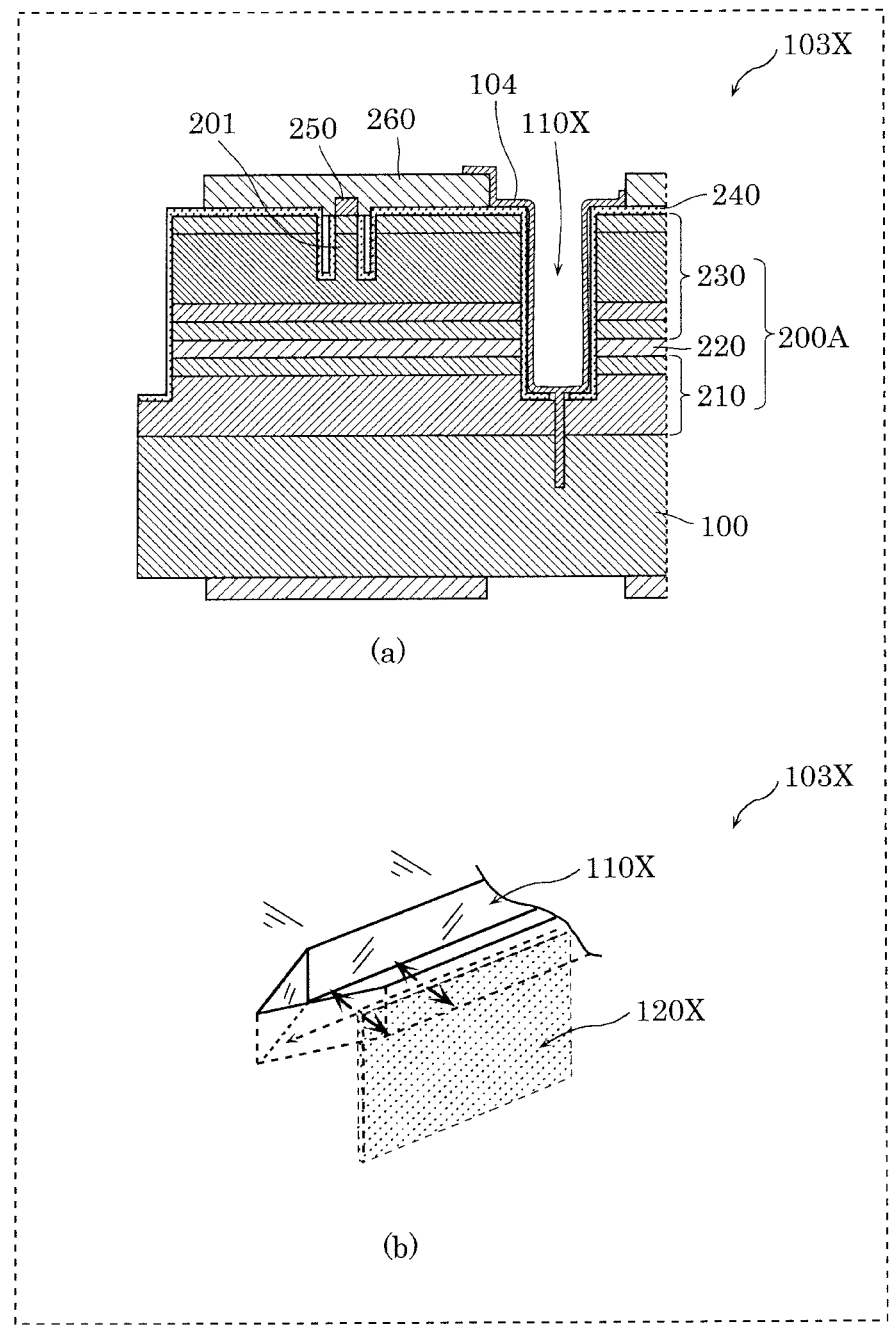
FIG. 9 is an enlarged view of a main portion of a bar-shaped substrate according to a comparative example.

FIG. 9 illustrates the configuration of bar-shaped substrate 103X according to a comparative example. In FIG. 9, (a) is a cross-sectional view of a portion of bar-shaped substrate 103X according to the comparative example, and (b) is an enlarged perspective view of the vicinity of guide trench 110X of bar-shaped substrate 103X according to the comparative example.

Figure 10:
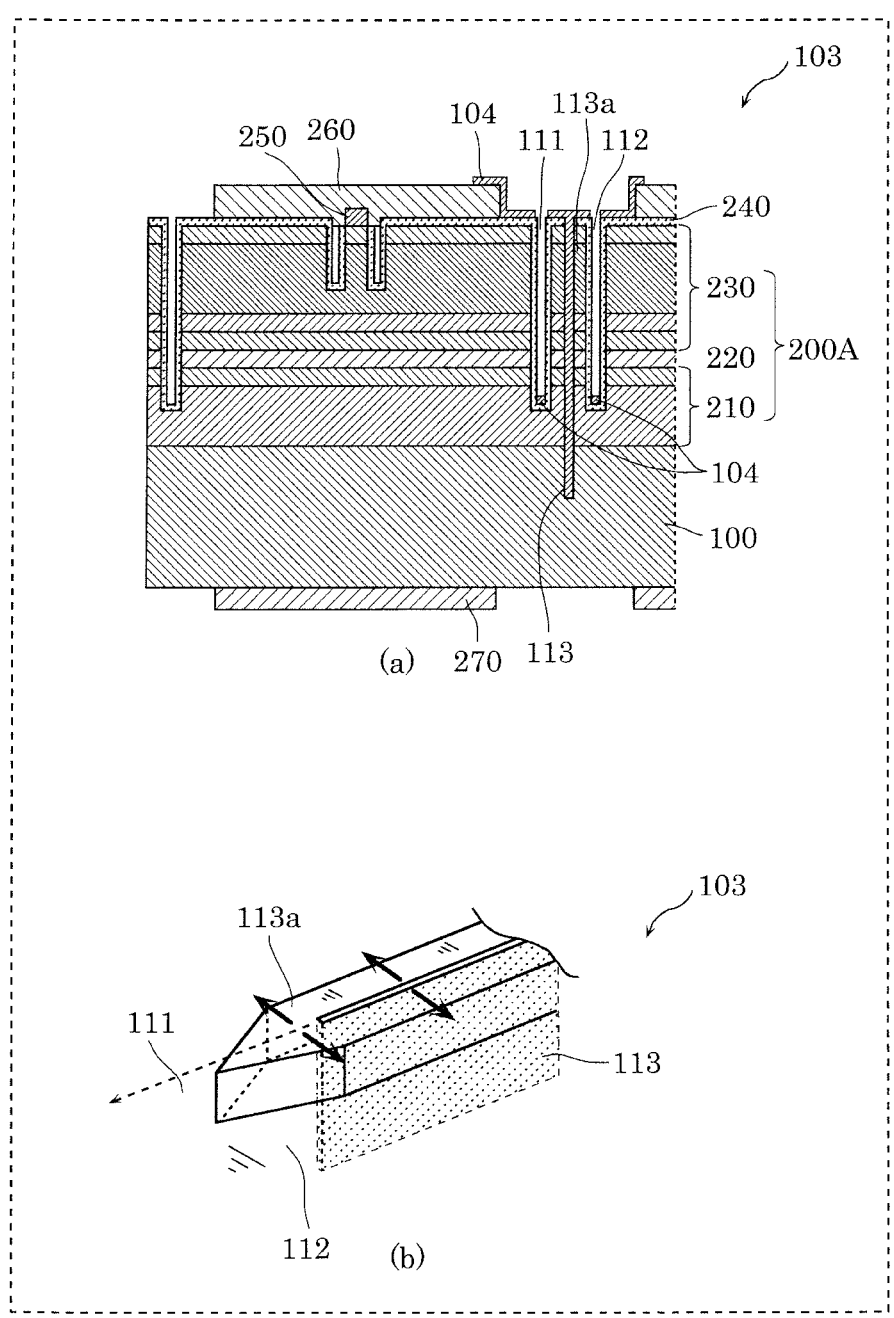
FIG. 10 is an enlarged view of a portion of a bar-shaped substrate according to Embodiment 1.

FIG. 10 illustrates the configuration of bar-shaped substrate 103 according to Embodiment 1. In FIG. 10, (a) is a cross-sectional view of a portion of bar-shaped substrate 103 according to Embodiment 1, and (b) is an enlarged perspective view of the vicinity of split trench forming region 113a of said bar-shaped substrate 103.

Nitride semiconductor light-emitting element 101X illustrated in FIG. 8 can be obtained by splitting bar-shaped substrate 103X according to the comparative example illustrated in FIG. 9. As illustrated in (a) and (b) in FIG. 9, in bar-shaped substrate 103X according to the comparative example, first guide trench 110X is formed by digging in semiconductor layer stacked body 200A, and second guide trench 120X is formed by further digging at the bottom of first guide trench 110X.

As illustrated in (a) and (b) in FIG. 10, in bar-shaped substrate 103 according to the present embodiment, first trench 111 and second trench 112 are formed by digging in semiconductor layer stacked body 200A, a portion (between first trench 111 and second trench 112) that remains without digging in semiconductor layer stacked body 200A is defined as split trench forming region 113a, and third trench 113 is formed as a split trench by digging in said remaining split trench forming region 113a in the form of a projection.

As a result of diligent studies by the inventors, it has been found that the warpage of a resultant nitride semiconductor light-emitting element is different between bar-shaped substrate 103X according to the comparative example illustrated in FIG. 9 and bar-shaped substrate 103 according to the present embodiment illustrated in FIG. 10. The inventors checked the correlation between the warpage of the nitride semiconductor light-emitting element and the thickness (remaining thickness) of a portion that that remains without digging in semiconductor layer stacked body 200A. The result is illustrated in FIG. 11.

Figure 11:
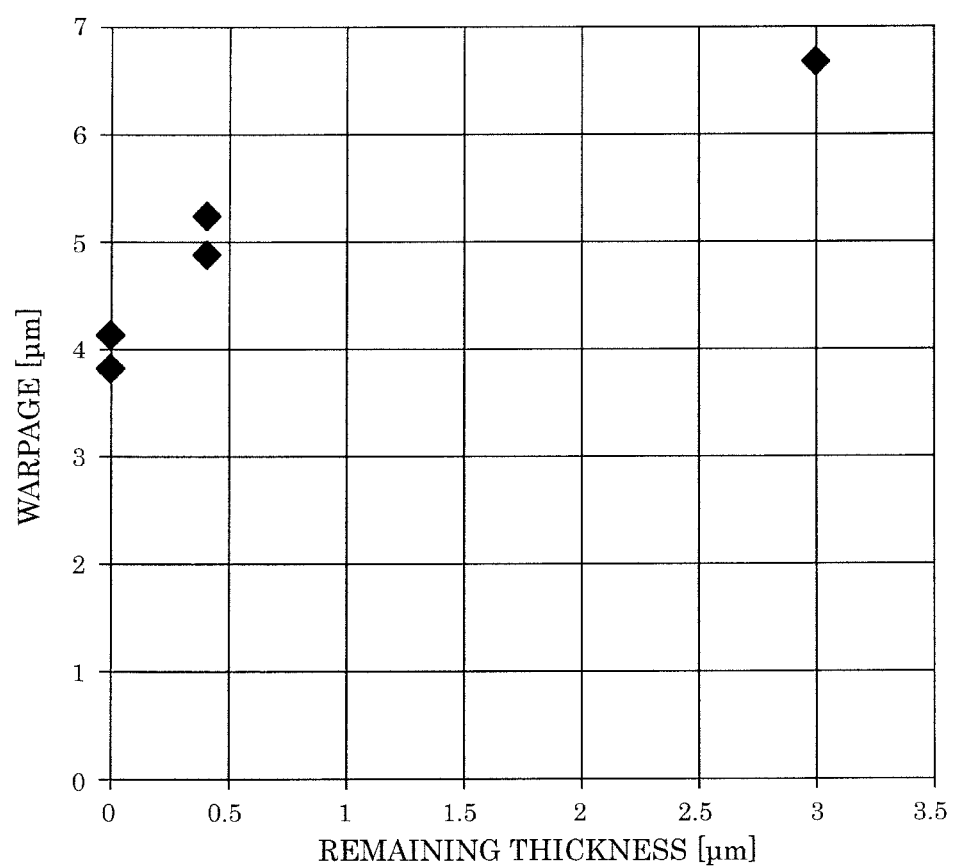
FIG. 11 illustrates the relationship between the remaining thickness of a semiconductor layer stacked body on a substrate and the warpage of a nitride semiconductor light-emitting element.

FIG. 11 illustrates the relationship between the remaining thickness of semiconductor layer stacked body 200A on substrate 100 and the warpage of the nitride semiconductor light-emitting element. Note that the remaining thickness of 0 μm means no semiconductor layer stacked body 200A, which indicates digging into substrate 100, and the remaining thickness of 3 μm means no digging in semiconductor layer stacked body 200A.

FIG. 11 has revealed that when the recess is dug toward substrate 100 to minimize the remaining thickness of semiconductor layer stacked body 200A on substrate 100, the warpage of the nitride semiconductor light-emitting element is reduced to about one-half.

Here, the inventors considered that the warpage of the nitride semiconductor light-emitting element has some impact when splitting the bar-shaped substrate, and examined the impact. This examination will be described with reference to FIG. 12.

Figure 12:
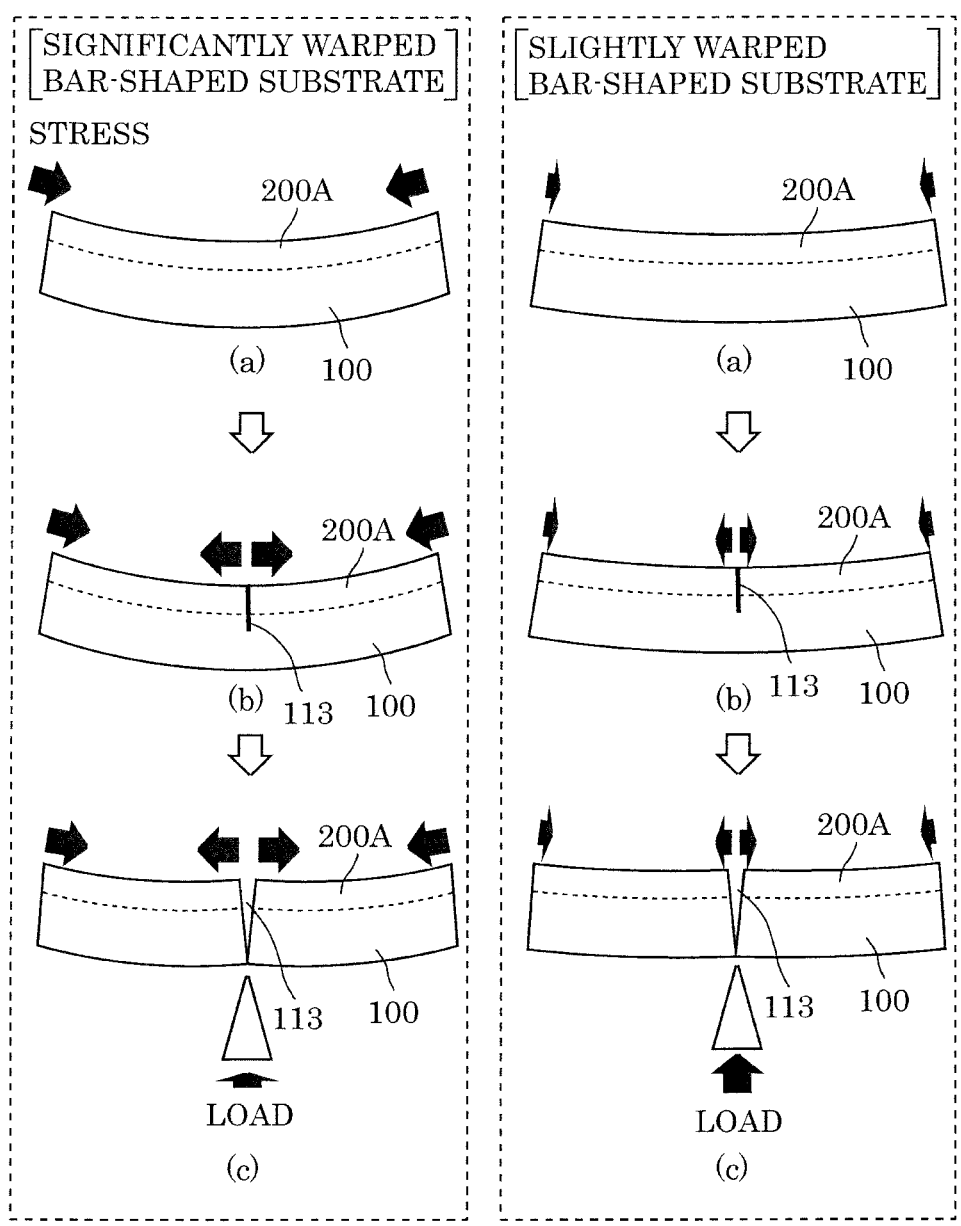
FIG. 12 is a diagram schematically illustrating the relationship between the stress on a semiconductor layer stacked body on a substrate and the load upon an element split in the case where a bar-shaped substrate is significantly warped and in the case where a bar-shaped substrate is slightly warped.

FIG. 12 is a diagram schematically illustrating the relationship between the stress on semiconductor layer stacked body 200A on substrate 100 and the load upon an element split in the case where the bar-shaped substrate is significantly warped and in the case where the bar-shaped substrate is slightly warped. In FIG. 12, (a) illustrates the membrane stress on the bar-shaped substrate, (b) illustrates the stress after third trench 113 is formed, and (c) illustrates the relationship between the load and the stress upon an element split.

Generally, in the case of a GaN-based nitride semiconductor light-emitting element, an impurity composition thereof causes a compressive stress to act on semiconductor layer stacked body 200A formed on substrate 100 including a GaN substrate, as illustrated in (a) in FIG. 12. This is the reason why the warpage of the nitride semiconductor light-emitting element increases as the remaining thickness of semiconductor layer stacked body 200A increases, as illustrated in FIG. 11.

Here, when split trench forming region 113a is in the form of a projection (that is, when the remaining thickness of semiconductor layer stacked body 200A is large) like bar-shaped substrate 103 according to the present embodiment illustrated in FIG. 10, it is considered that the bar-shaped substrate is significantly warped and a large compressive stress is applied to the bar-shaped substrate as illustrated in the diagram on the left side of FIG. 12.

In contrast, when the split trench forming region is formed in the shape of a recess by further digging second guide trench 120X at the bottom of first guide trench 110X (that is, when the remaining thickness of semiconductor layer stacked body 200A is small) like bar-shaped substrate 103X according to the comparative example illustrated in FIG. 9, the stress is mitigated at the portion dug into substrate 100, and thus it is considered that the bar-shaped substrate is slightly warped and the compressive stress on the bar-shaped substrate is small as illustrated in the diagram on the right side of FIG. 12.

Next, as illustrated in (b) in FIG. 12, when third trench 113 is formed in each of the significantly warped bar-shaped substrate and the slightly warped bar-shaped substrate, stresses directed to open third trench 113 are generated on both sides of semiconductor layer stacked body 200A separated by third trench 113.

This stress directed to open third trench 113 is proportional to the value of the stress generated in semiconductor layer stacked body 200A; thus, this stress is high in a significantly warped bar-shaped substrate such as that in the present embodiment (the left side of FIG. 12) and is low in a slightly warped bar-shaped substrate such as that in the comparative example (the right side of FIG. 12).

Furthermore, as illustrated in (c) in FIG. 12, when a load is applied from the n-side electrode 330 side to each of the significantly warped bar-shaped substrate and the slightly warped bar-shaped substrate to split the element, the stress directed to open third trench 113 acts in a direction to assist the load for splitting the element.

Therefore, the element can be split with less load in the case of the significantly warped bar-shaped substrate such as that in the present embodiment (the left side of FIG. 12), compared to the slightly warped bar-shaped substrate such as that in the comparative example (the right side of FIG. 12).

Here, the result of the examination about the stress generated in the split trench forming region by the split trench in bar-shaped substrate 103X according to the comparative example and bar-shaped substrate 103 according to the present embodiment will be described with reference to FIG. 9 and FIG. 10 mentioned above.

As mentioned above, in bar-shaped substrate 103X according to the comparative example illustrated in FIG. 9, first guide trench 110X and second guide trench 120X are formed as split trenches to form the split trench forming region in the shape of a recess. In contrast, in bar-shaped substrate 103 according to the present embodiment illustrated in FIG. 10, third trench 113 is formed as a split trench in split trench forming region 113a in the form of a projection.

In bar-shaped substrate 103X according to the comparative example illustrated in FIG. 9, because the split trench forming region (first guide trench 110X) is in the form of a recess, the stress directed to open the split trench (second guide trench 120X) in the split trench forming region is low. Therefore, a crack extending from the leading end of the split trench has poor straightness, resulting in an increase in the likelihood that the nitride semiconductor light-emitting element obtained by the split has a poor shape.

In contrast, in bar-shaped substrate 103 according to the present embodiment illustrated in FIG. 10, the stress directed to open the split trench (third trench 113) in split trench forming region 113a is higher than in bar-shaped substrate 103X according to the comparative example illustrated in FIG. 9. Therefore, a crack extending from the leading end of the split trench has good straightness, resulting in the nitride semiconductor light-emitting element obtained by the split having a good shape.

Furthermore, the advantageous effect of split trench forming region 113a in the form of a projection in bar-shaped substrate 103 according to the present embodiment illustrated in FIG. 10 is prominent in a substrate with no defect concentration region or polarity reversal region (hereinafter referred to as a core region) in the substrate plane, which is what is called a coreless substrate, but the advantageous effect of the present embodiment is small in a substrate with a defect concentration region or a polarity reversal region in a stripe pattern in the substrate, which is what is called a strip core substrate. It is considered that this is because semiconductor layer stacked body 200A (that is, an epitaxial layer) on substrate 100 is continuous in the substrate in the case of the coreless substrate, whereas in the case of the stripe core substrate, the epitaxial layer is divided in the core region, and thus the stress in the core region is low.

Furthermore, with the structure of semiconductor layer stacked substrate 102 according to the present embodiment, it is possible to reduce the occurrence of a problem that is caused by adhering of debris that has spread at the time of forming the split trench (third trench 113). This point will be described below.

In the case of forming the split trench (third trench 113) by the laser scribe method, debris spreads and adheres to the surrounding region. This debris has the ability to erode metals; when the debris adheres to p-side electrode 260, the portion of p-side electrode 260 to which the debris adheres is eroded and modified. A larger region is eroded as the area where the debris is continuous increases.

For example, in bar-shaped substrate 103X according to the comparative example, as illustrated in (a) in FIG. 9, second guide trench 120X is formed as a split trench in the split trench forming region (first guide trench 110X) in the form of a recess; therefore, debris 104 that has spread and adhered to the region surrounding the split trench forming region is continuously formed. As a result, p-side electrode 260 is eroded and modified.

When p-side electrode 260 is modified as just described, problems such as an increase in the drive voltage of the nitride semiconductor light-emitting element and a reduction in wire bonding strength occur.

In order to solve such problems, in one conceivable method, a protection film is applied to a surface of the bar-shaped substrate before the split trench (third trench 113) is formed, and then debris that has spread to the protection film is removed together with the protection film, and in another conceivable method, the nitride semiconductor light-emitting element itself with debris adhered thereto is cleaned to remove the debris; however, these methods require a separate process.

In contrast, nitride semiconductor light-emitting element 101 according to the present embodiment incudes split trench forming region 113*a* having a cross-section in the form of a projection, as illustrated in (a) in FIG. 10, and thus even if debris 104 adheres to the portion between third trench 113 and p-side electrode 260, debris 104 is divided by first trench 111 and second trench 112. This allows for a reduction in the area where p-side electrode 260 and debris 104 come into contact; thus, modification of p-side electrode 260 due to debris 104 can be reduced.

Furthermore, in nitride semiconductor light-emitting element 101 according to the present embodiment, split trench forming region 113*a* having a cross-section in the form of a projection is provided at each of both ends corresponding to the long sides of nitride semiconductor light-emitting element 101 in top view. With this, split trench forming region 113*a* in the form of a partition functions as a side surface outer wall, and thus it is possible to keep foreign matter from entering the vicinity of waveguide 201 or semiconductor layer stacked body 200.

Furthermore, with the structure of semiconductor layer stacked substrate 102 according to the present embodiment, it is possible to reduce the amount of debris itself that is generated at the time of forming the split trench (third trench 113). This point will be described below.

The split trench (third trench 113) is formed by the laser scribe method. In this case, the laser beams converged by a condenser lens are emitted to a designated position using a focus in the depth direction as a reference. At this time, the focus of the laser beams is adjusted so that the spot diameter of the beams becomes minimum at the focus area.

Figure 13:
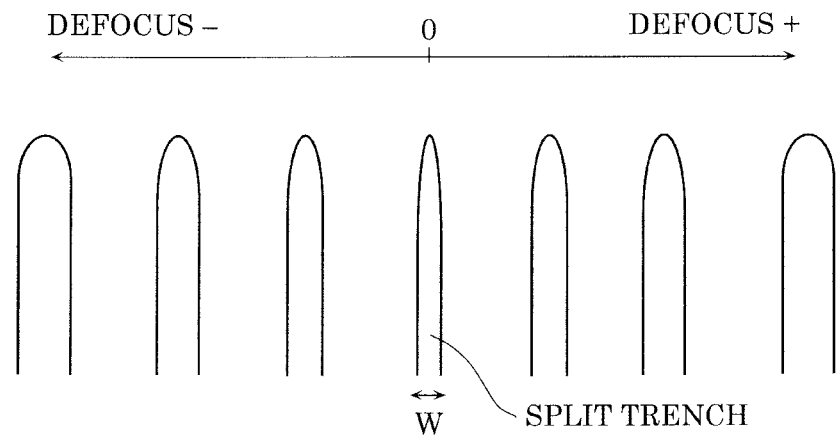
FIG. 13 is a diagram illustrating the relationship between the shape of a third trench and the focus of laser beams upon forming the third trench.

The shape of the split trench (third trench 113) formed by the laser beams changes according to the focus position of the laser beams. Specifically, if the focus position varies in the depth direction, the amount of defocus becomes large, and trench width W of the split trench becomes large, as illustrated in FIG. 13. Furthermore, as the amount of defocus increases, the shape of the leading end of the split trench becomes rounder. Thus, the function as a starting point of a split deteriorates.

Figure 14:
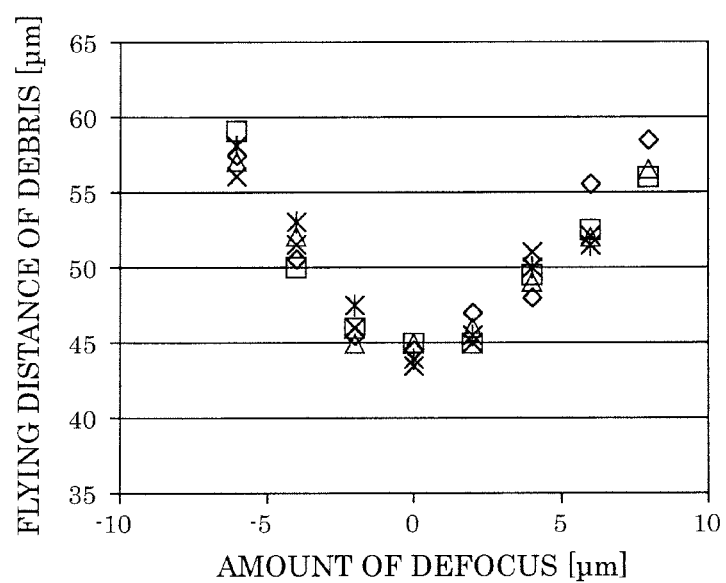
FIG. 14 is a diagram illustrating the relationship between the flying distance of debris and the amount of defocus of laser beams upon forming a third trench.

Furthermore, defocusing with respect to the focus position causes an increase in the flying distance of debris. FIG. 14 is a diagram illustrating the relationship between the amount of defocus upon forming the split trench using the laser beams and the flying distance of debris generated upon forming the split trench. As illustrated in FIG. 14, when the amount of defocus is large, debris is generated in a wide area, leading to an increase in the risk of generating leakage current. Note that the amount of flying debris differs depending on the power of laser scribing and other conditions.

In the case of further digging second guide trench 120X as a split trench at the bottom of first guide trench 110X like bar-shaped substrate 103X according to the comparative example illustrated in FIG. 9, the laser beams need to be focused on the bottom surface of first guide trench 110X. A region of approximately 200 μm×200 μm is used to focus the laser beams. Therefore, in the case of bar-shaped substrate 103X according to the comparative example illustrated in FIG. 9, the laser beams are likely to be focused on the upper surface of bar-shaped substrate 103X instead of the bottom of first guide trench 110X, and thus second guide trench 120X serving as a split trench has a large trench width and a round leading end, which results in the deterioration of the function as a starting point of a split. In other words, the split may be out of line from the split trench.

In contrast, in bar-shaped substrate 103 according to the present embodiment illustrated in FIG. 10, first trench 111 and second trench 112 are formed to form, as split trench forming region 113*a*, semiconductor layer stacked body 200A that is located between first trench 111 and second trench 112, and third trench 113 serving as a split trench is formed. In other words, the portion that remains without digging in semiconductor layer stacked body 200A is defined as split trench forming region 113*a*, and third trench 113 is formed in said split trench forming region 113*a* in the form of a projection.

With this, in bar-shaped substrate 103 according to the present embodiment illustrated in FIG. 10, the laser beams are likely to be focused on the upper surface of split trench forming region 113*a*, and thus it is possible to keep third trench 113 serving as a split trench from having a large trench width and having a round leading end. Therefore, third trench 113 sufficiently functions as a starting point of a split, allowing for a reduction in splits that are out of line from third trench 113.

However, in bar-shaped substrate 103 according to the present embodiment, third trench 113 formed in split trench forming region 113*a* does not reach the cleavage surface (split position 102*a*), and thus an out-of-line split, chipping, and the like may occur in nitride semiconductor light-emitting element 101, between third trench 113 and the cleavage surface.

Figure 15:
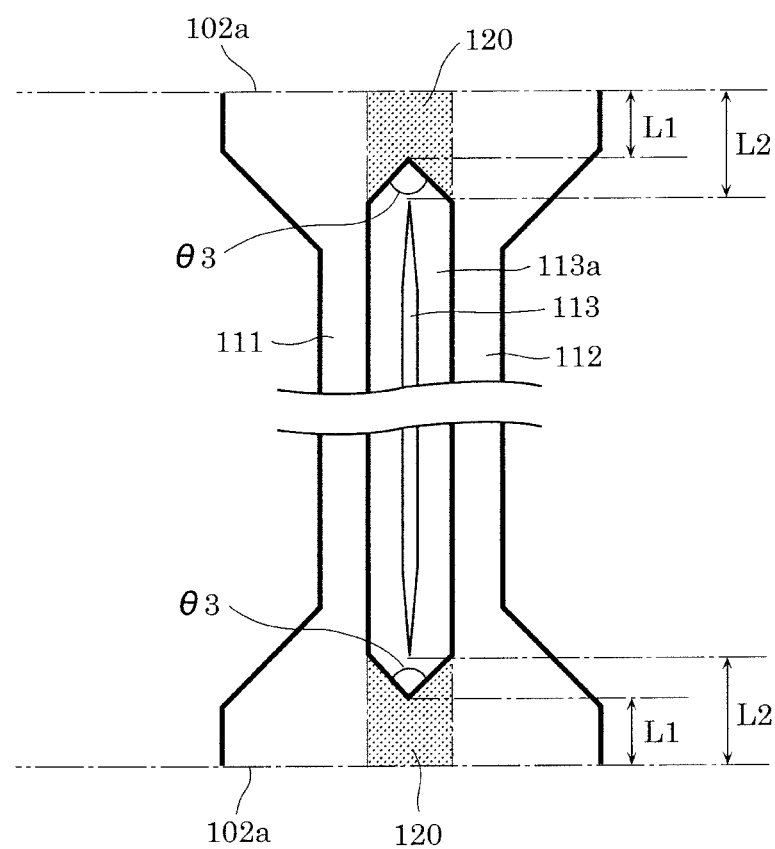
FIG. 15 is an enlarged plan view of an area in the vicinity of an end portion of a split trench forming region on a bar-shaped substrate according to Embodiment 1.

Therefore, in bar-shaped substrate 103 according to the present embodiment, recess 120 is formed as a structure having a split guiding function between split trench forming region 113*a* and split position 102*a* (cleavage surface), as illustrated in FIG. 15. With this, it is possible to significantly reduce the occurrence of an out-of-line split, chipping, and the like at the time of splitting. Hereinafter, this point will be described with reference to FIG. 15. FIG. 15 is an enlarged plan view of an area in the vicinity of an end portion of split trench forming region 113*a* on bar-shaped substrate 103 according to Embodiment 1.

As illustrated in FIG. 15, recess 120 is formed on an extension of third trench 113. Specifically, recesses 120 are formed on both end portions of split trench forming region 113*a* in the longitudinal direction.

Recess 120 includes a minimum portion having a length that is shortest in the longitudinal direction (second direction) of split trench forming region 113*a*. Specifically, recess 120 includes a region having a locally reduced width in the longitudinal direction (second direction) of split trench forming region 113*a*.

Figure 16:
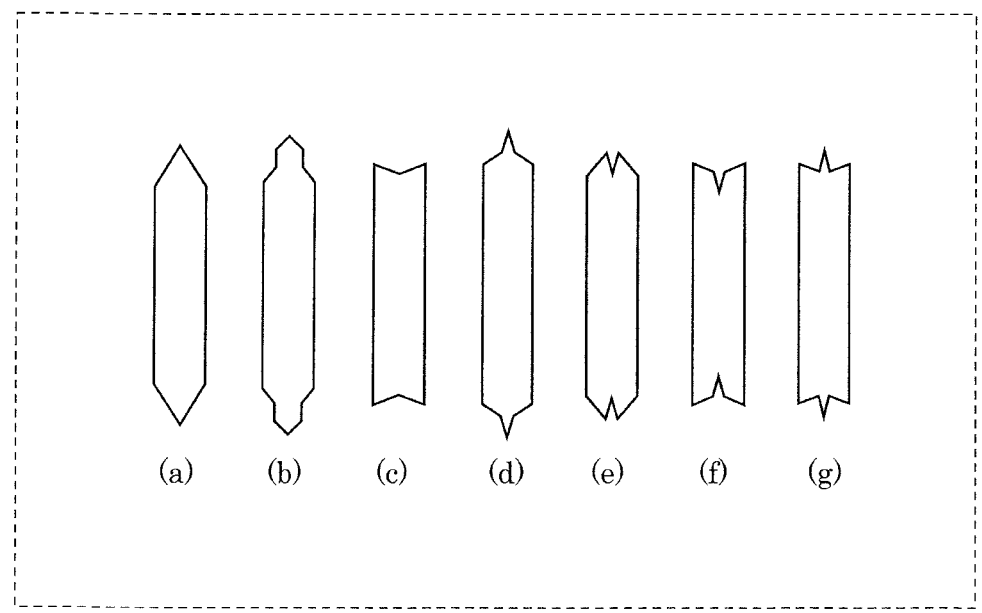
FIG. 16 is a plan view illustrating variations of a split trench forming region on a bar-shaped substrate according to Embodiment 1.

The shape of the minimum portion of recess 120 defined by a side wall on which recess 120 and the vertex of split trench forming region 113*a* are in contact with each other has a split guiding function. Stated differently, the leading end portion of split trench forming region 113a has a vertex. When the degree of the internal angle at the vertex of split trench forming region 113a is θ3, it is possible to cause recess 120 to function well as a guide by making θ3 small. On the other hand, making θ3 small leaves a narrow area for forming third trench 113 and causes an increase in distance L2 between the leading end of third trench 113 and split position 102a (cleavage surface), deteriorating the function of third trench 113 as a starting point of a split. Thus, as distance L2 is reduced, the stress required for a split is lowered, allowing for a reduction in the occurrence of chipping. In the case where substrate 100 is a hexagonal crystal nitride semiconductor substrate, if θ3 is set to 60 degrees, the side wall in contact with recess 120 overlaps the cleavage surface; therefore, the shape at the vertex of split trench forming region 113a is desirably defined by θ3 that is different from 60 degrees. Note that split trench forming region 113a for forming third trench 113 may be symmetric with respect to a straight line connecting the vertices at the leading ends of split trench forming region 113a in the longitudinal direction; for example, polygonal shapes such as those illustrated in (a) to (g) in FIG. 16 are available.

Furthermore, the position of the vertex at the leading end of split trench forming region 113a in the longitudinal direction can be brought close to split position 102a (cleavage surface) to allow the leading end of third trench 113 to be formed also in a position close to split position 102a (cleavage surface).

Figure 17:
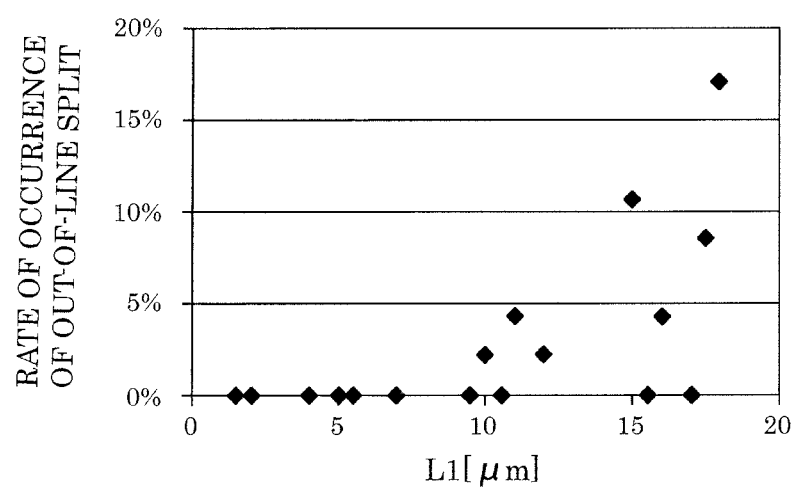
FIG. 17 illustrates the relationship between the rate of occurrence of an out-of-line split and distance L1 between the vertex of a split trench forming region in the longitudinal direction and a split position (cleavage surface)

FIG. 17 illustrates the relationship between the rate of occurrence of an out-of-line split and distance L1 between the vertex of split trench forming region 113a in the longitudinal direction and split position 102a (cleavage surface).

As illustrated in FIG. 17, when distance L1 is 9 μm or less, the occurrence of an out-of-line split can be reduced. However, there is a need for a region for forming fourth trench 114 for cleaving semiconductor layer stacked substrate 102 to obtain bar-shaped substrate 103. The width of fourth trench 114 may be approximately 2 μm to 6 μm, and distance L1 may be 4 μm or more in consideration of variations in the width of fourth trench 114 and variations, along the Y-axis direction (second direction), in the position in which fourth trench 114 is formed. In sum, distance L1 may be between 4 μm and 9 μm, inclusive.

In this case, the distance between two split trench forming regions 113a adjacent in the longitudinal direction of split trench forming regions 113a is between 8 μm and 18 μm, inclusive. Specifically, the minimum width of recess 120 in the longitudinal direction (Y-axis direction) of split trench forming region 113a may be set to 8 μm and 18 μm, inclusive.

As described above, use of these advantageous effects allows nitride semiconductor light-emitting element 101 to have a stable shape and exhibit good properties.

Furthermore, at least a given distance is required between split trench forming region 113a and each of the first outer wall of first trench 111 and the second outer wall of second trench 112. First trench 111, second trench 112, and recess 120 are formed at the same time by etching as described earlier, but if there is a residual region in which first trench 111 and second trench 112 are not completely dug down to or below n-type clad layer 211, the residual region becomes a leak path for an electric current. In the manufacturing method according to the present embodiment, the distance between split trench forming region 113a and each of the first outer wall of first trench 111 and the second outer wall of second trench 112 is desirably set to at least 5 μm, which may vary depending on the size, position, etc., of the residual region.

Furthermore, if the distance between split trench forming region 113a and the first outer wall of first trench 111 and the distance between split trench forming region 113a and the second outer wall of second trench 112 are set greater than 5 μm while the width of nitride semiconductor light-emitting element 101 is maintained, the width of split trench forming region 113a itself needs to be reduced. Therefore, in the present embodiment, the width of split trench forming region 113a is desirably set to at least 10 μm, which may vary depending on the laser scribing conditions for forming third trench 113. This is for third trench 113 to be formed as a region included in split trench forming region 113a and is also for preventing, for example, cracking in split trench forming region 113a after a split. The width of third trench 113 at this time is between 3 μm and 8 μm, inclusive, and more preferably 4 μm and 6 μm, inclusive.

Figure 18:
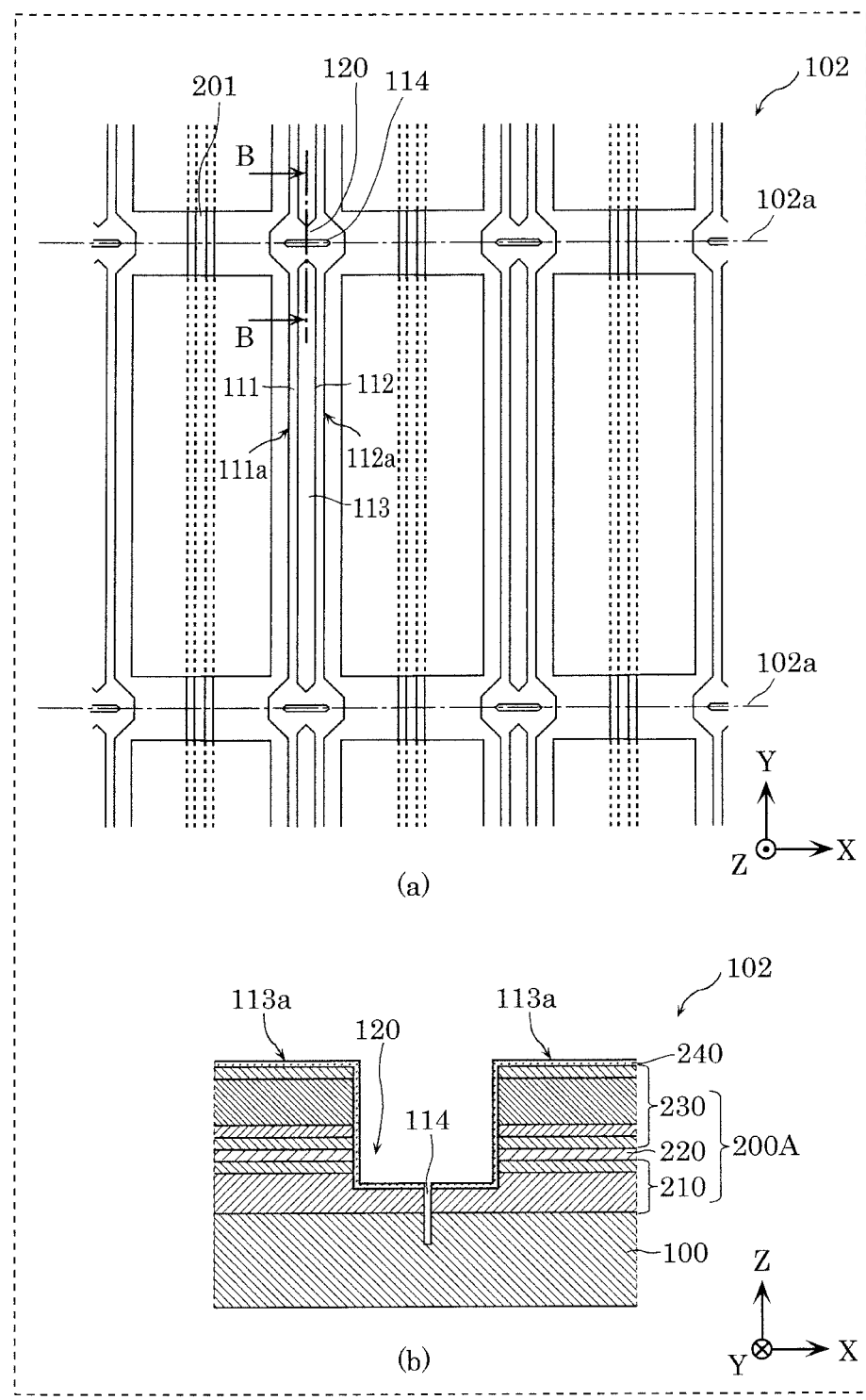
FIG. 18 is an enlarged view of a portion of a semiconductor layer stacked substrate according to Embodiment 1.
Figure 19:
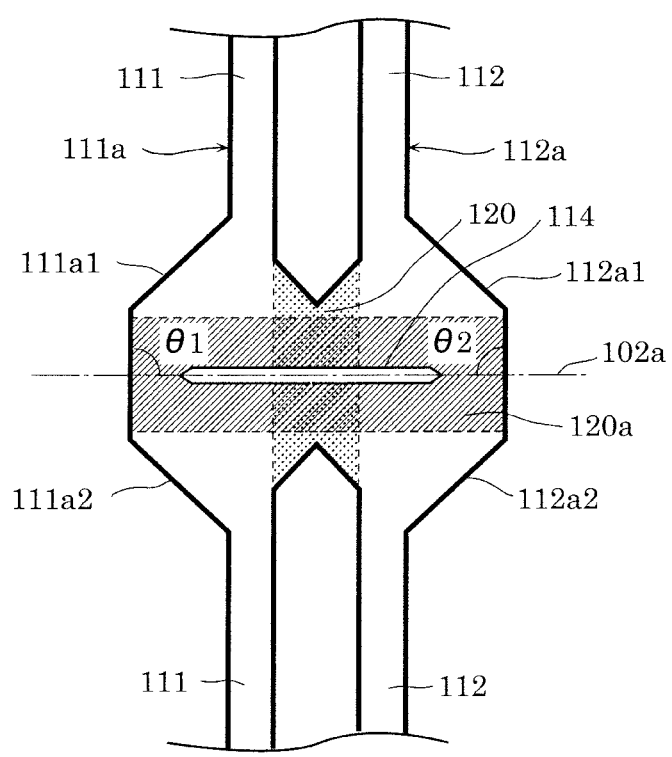
FIG. 19 is an enlarged plan view of an area around a recess in a semiconductor layer stacked substrate according to Embodiment 1.

Furthermore, in the present embodiment, examples of the method for inhibiting separation of the end surface coating film and generation of particles, etc., include the following method. Hereinafter, this method will be described with reference to FIG. 18 and FIG. 19. FIG. 18 and FIG. 19 are enlarged views of a portion of semiconductor layer stacked substrate 102. In FIG. 18, (a) is an enlarged plan view of semiconductor layer stacked substrate 102, and (b) is a cross-sectional view taken along line B-B in (a) in FIG. 18. FIG. 19 is an enlarged plan view of an area around recess 120 in semiconductor layer stacked substrate 102.

As illustrated in FIG. 18 and FIG. 19, first trench 111 has first outer wall 111a on the side away from second trench 112, and second trench 112 has second outer wall 112a on the side away from first trench 111. In the vicinity of split position 102a, first portion 120a including a partial region of recess 120 is disposed between first outer wall 111a and second outer wall 112a. In other words, the distance between first outer wall 111a and second outer wall 112a in a direction parallel to the first direction (X-axis direction) has the maximum value in the vicinity of split position 102a.

Furthermore, as illustrated in FIG. 19, first outer wall 111a includes a pair of first outer wall portions 111a1 and 111a2 located across split position 102a from each other and extending away from second outer wall 112a. Moreover, second outer wall 112a includes a pair of second outer wall portions 112a1 and 112a2 located across split position 102a from each other and extending away from first outer wall 111a.

Fourth trench 114 is formed spanning across recess 120 (in first portion 120a) between first outer wall 111a of first trench 111 and second outer wall 112a of second trench 112 at split position 102a. The longitudinal length of fourth trench 114 is desirably set to as great as possible within the range where fourth trench 114 does not reach first outer wall 111a or second outer wall 112a. If fourth trench 114 is formed having a length greater than the length of first portion 120a to span across first outer wall 111a or second outer wall 112a, this will cause an increase in the leakage current.

Fourth trench 114 may be formed having a length approximately 5 μm to 25 μm less than the length of first portion 120a in the first direction (X-axis direction); the length of fourth trench 114 in the present embodiment is preferably between 25 μm and 45 μm, inclusive. If the length of fourth trench 114 is greater than 45 μm (5 μm less than the length of first portion 120a in the first direction), fourth trench 114 may be formed spanning across first outer wall 111a and second outer wall 112a depending on, for example, variations, in the first direction, in the position in which first trench 114 is formed. On the other hand, if the length of fourth trench 114 is less than 25 μm (25 μm less than the length of first portion 120a in the first direction), the advantageous effect of serving as a starting point of cleavage is reduced, and thus the likelihood of causing problems such as out-of-line cleavage increases. The length of fourth trench 114 is more preferably between 30 μm and 40 μm, inclusive.

Stated differently, the length of first portion 120a, in which fourth trench 114 is formed, in the first direction (X-axis direction) is desirably at least 30 μm, and more preferably at least 35 μm.

Furthermore, fourth trench 114 may be formed having a width between 2 μm and 6 μm, inclusive. If the width of fourth trench 114 is less than 2 μm, fourth trench 114 is shallow in depth, and thus the advantageous effect of serving as a starting point of cleavage is small. On the other hand, if the width of fourth trench 114 is greater than 6 μm, fourth trench 114 may reach split trench forming region 113a, which is disposed to function as a guide to split bar-shaped substrate 103 to obtain nitride semiconductor light-emitting element 101, depending on, for example, variations, in the position in which fourth trench 114 is formed, in the second direction (Y-axis direction), and thus the advantageous effect of reducing the occurrence of an out-of-line split is small. In addition, an increased amount of debris is generated; thus, the width of fourth trench 114 is more preferably between 3 μm and 5 μm, inclusive.

The width of fourth trench 114 is gradually reduced toward both end portions in the longitudinal direction (X-axis direction: first direction) and has the maximum value in the vicinity of the center; fourth trench 114 is desirably formed so that the maximum value is within the aforementioned range.

Next, as illustrated in FIG. 19, the angle formed at split position 102a between the direction in which first outer wall 111a extends in the substrate plane and the direction (first direction; X-axis direction) orthogonal to the longitudinal direction of waveguide 201 or split trench forming region 113a is denoted as θ1, and the angle formed split position 102a between the direction in which second outer wall 112a extends in the substrate plane and the direction (first direction) orthogonal to the longitudinal direction of waveguide 201 or split trench forming region 113a is denoted as θ2. Each of θ1 and θ2 may be between 75 degrees and 90 degrees, inclusive (75°≤θ1≤90°, 75°≤θ2≤90°).

Here, in the present embodiment, as illustrated in FIG. 18, first outer wall 111a and second outer wall 112a at split position 102a are formed parallel to waveguide 201, and each of θ1 and θ2 is 90 degrees. In other words, as illustrated in FIG. 19, a pair of first outer wall portions 111a1 and 111a2 is symmetric with respect to split position 102a in terms of the slope with respect to the longitudinal direction (Y-axis direction) of waveguide 201 or split trench forming region 113a, first outer wall portions 111a1 and 111a2 have the same length, and thus θ1 is 90 degrees. Likewise, a pair of second outer wall portions 112a1 and 112a2 is symmetric with respect to split position 102a in terms of the slope with respect to the longitudinal direction (Y-axis direction) of waveguide 201 or split trench forming region 113a, second outer wall portions 112a1 and 112a2 have the same length, and thus θ2 is 90 degrees.

Note that in the case where a pair of first outer wall portions 111a1 and 111a2 is not symmetric with respect to split position 102a in terms of the slope with respect to the Y-axis direction or in the case where first outer wall portions 111a1 and 111a2 have different lengths, first outer wall 111a at split position 102a is not parallel to the Y-axis direction. In this case, a smaller one of the angles formed between first outer wall 111a and the X-axis direction is defined as θ1, and a smaller one of the angles formed between second outer wall 112a and the X-axis direction is defined as θ2.

Figure 20:
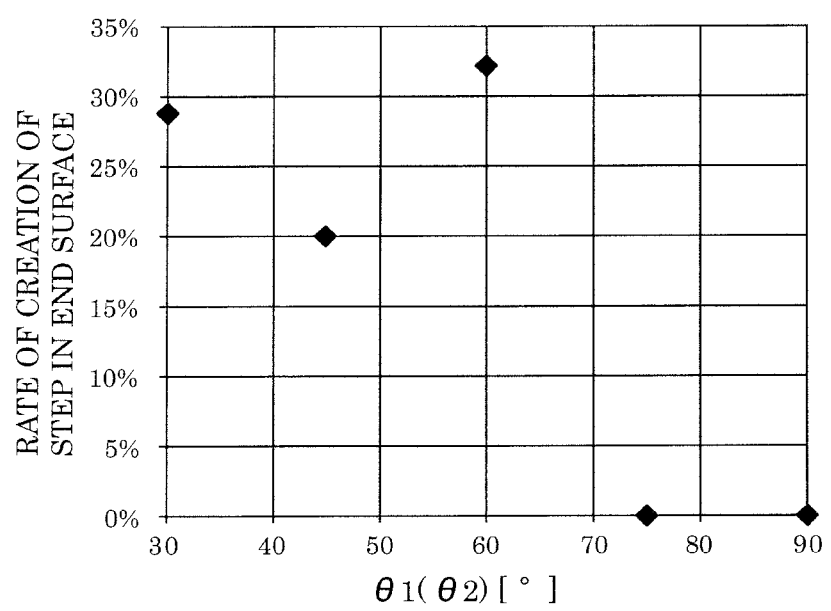
FIG. 20 illustrates the relationship between the rate of creation of a step in an end surface and $\theta 1$, $\theta 2$ related to a first trench and a second trench in a semiconductor layer stacked substrate according to Embodiment 1.

Here, the relationship between θ1, θ2 and a step in an end surface (cleavage surface) that is created at the time of cleaving semiconductor layer stacked substrate 102 will be described with reference to FIG. 20. FIG. 20 illustrates the relationship between θ1, θ2 and the rate of creation of a step in the end surface.

In the case of fabricating bar-shaped substrate 103 by cleaving semiconductor layer stacked substrate 102 at split position 102a, the cleavage surface is formed through first outer wall 111a and second outer wall 112a along the direction (first direction: X-axis direction) orthogonal to the longitudinal direction of waveguide 201.

At this time, as illustrated in FIG. 20, when θ1 are θ2 are less than 75 degrees, the percentage for out-of-line cleavage progression in the vicinity of first portion 120a is high, and thus the rate at which a step is created in the end surface is high. Furthermore, as θ1 are θ2 are reduced, the percentage for out-of-line cleavage in the vicinity of first portion 120a increases. This is due to first trench 111 and second trench 112 having steps in the depth direction by etching and due to each of first outer wall 111a and second outer wall 112a functioning as a guide. In addition, since nitride semiconductor light-emitting element 101 in which semiconductor element structure 200 has a hexagonal crystal structure has cleavage surfaces in the direction (first direction) orthogonal to the longitudinal direction of waveguide 201 and in a direction at 60 degrees with respect to the first direction, the percentage for out-of-line cleavage further increases by setting θ1 and θ2 to 60 degrees.

Next, the impact of out-of-line cleavage on the properties of nitride semiconductor light-emitting element 101 will be described with reference to FIG. 21 and FIG. 22.

Figure 21:
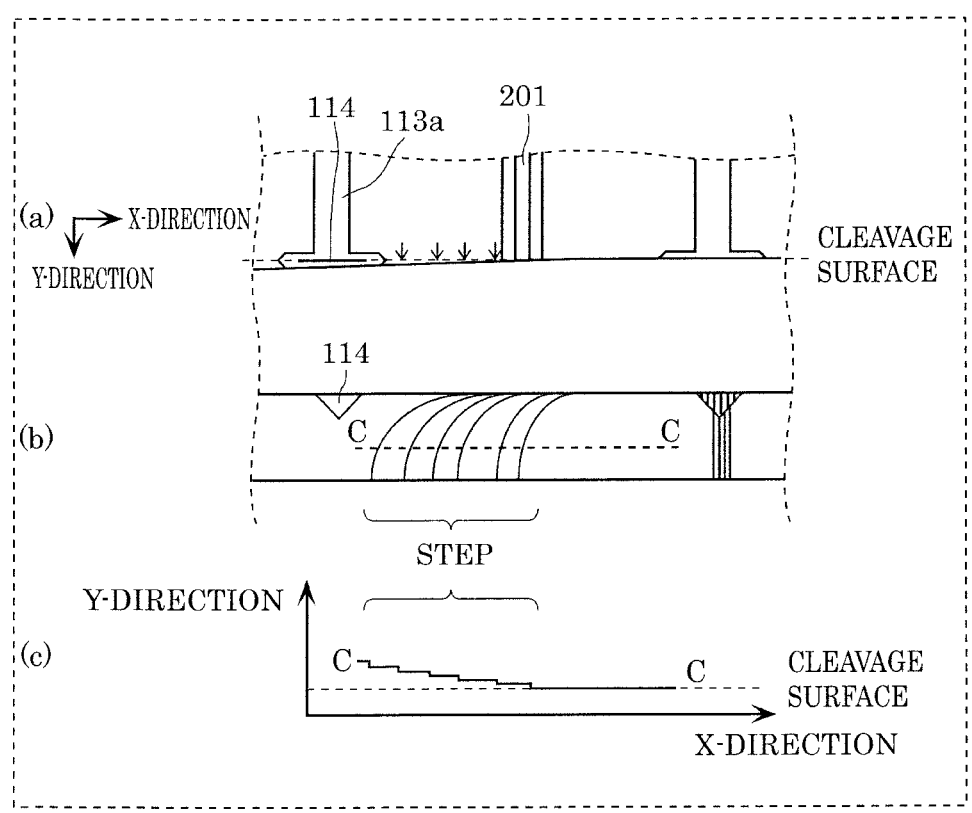
FIG. 21 is a diagram illustrating a cleavage surface of a semiconductor layer stacked substrate that has been cleaved.

In FIG. 21, (a) is a plan view of an area in the vicinity of an end portion of semiconductor layer stacked substrate 102 that has been cleaved, (b) is a diagram illustrating a cleavage surface thereof, and (c) is a diagram illustrating steps created in the cleavage surface.

As illustrated in (a) to (c) in FIG. 21, when cleavage progresses out of line, steps are created in the cleavage surface (end surface) of bar-shaped substrate 103. The cleavage surface becomes a light-emitting surface of nitride semiconductor light-emitting element 101, and thus the steps created in the cleavage surface have an impact on the light-emitting properties of nitride semiconductor light-emitting element 101.

Figure 22:
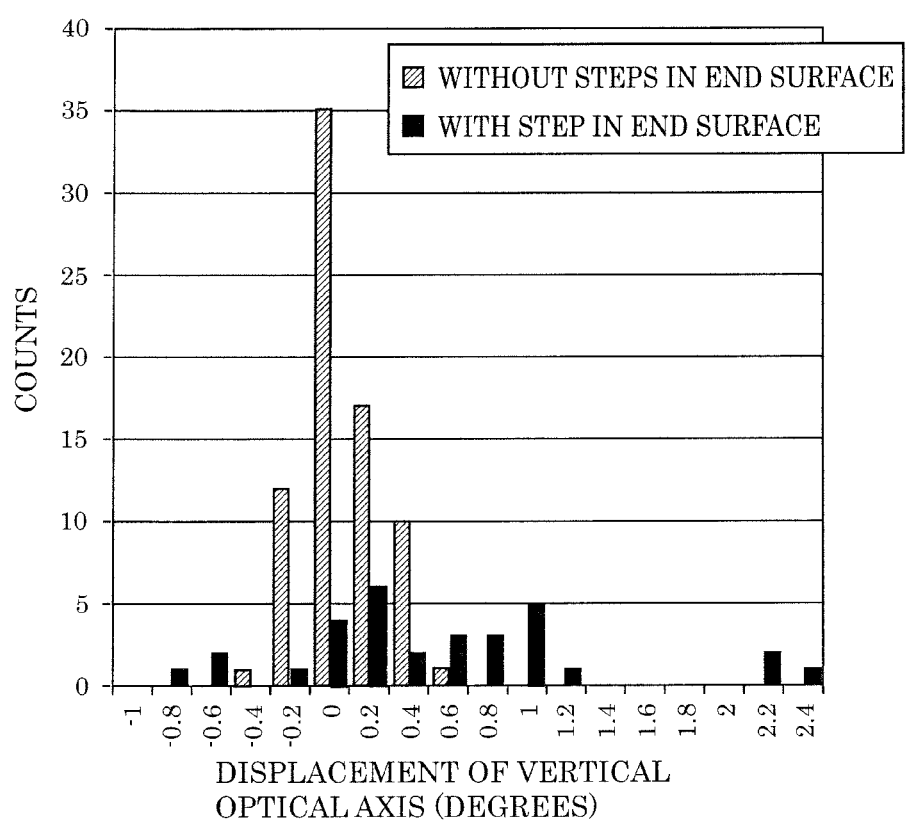
FIG. 22 illustrates the values of displacement of vertical optical axes of a nitride semiconductor light-emitting element with a step in an end surface and a nitride semiconductor light-emitting element without steps in an end surface.

FIG. 22 illustrates the values of displacement of the vertical optical axes of nitride semiconductor light-emitting element 101 with a step in the end surface (cleavage surface) and nitride semiconductor light-emitting element 101 without steps in the end surface (cleavage surface).

As illustrated in FIG. 22, if the vertical optical axis on the end surface of nitride semiconductor light-emitting element 101 is displaced, the angle in a direction perpendicular to laser oscillation is unstable. Therefore, this has an impact not only on the light-emitting properties, but also on electrical properties and reliability.

This is because the step created by out-of-line cleavage is divided in a direction different from the direction of the crystal face of semiconductor layer stacked substrate 102. Creation of the step causes generation of particles from semiconductor layer stacked substrate 102 and also causes a decrease in the adhesiveness of the end surface coating film.

Figure 23:
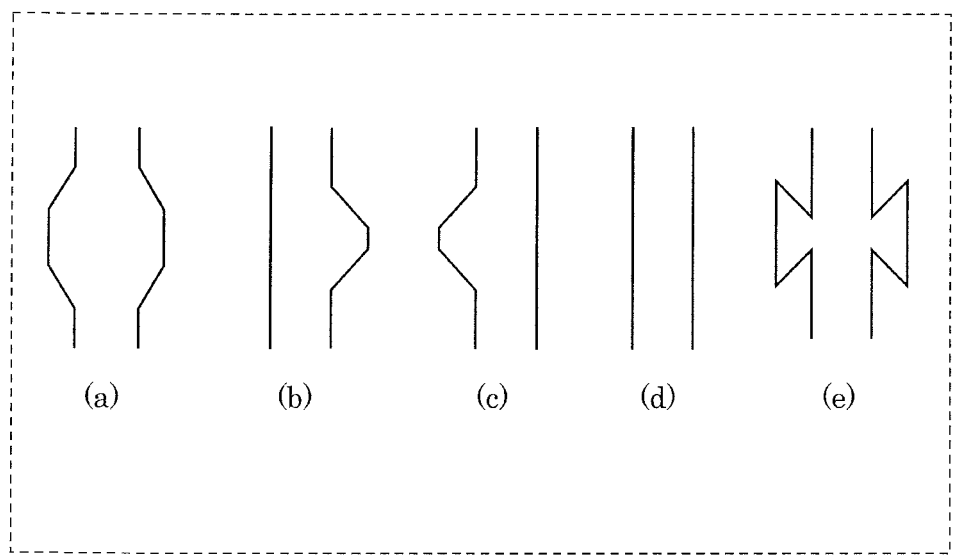
FIG. 23 is a plan view illustrating variations of a first trench (first outer wall) and a second trench (second outer wall) of a semiconductor layer stacked substrate according to Embodiment 1.

Therefore, θ1 and θ2 are desirably set to between 75 degrees and 90 degrees, inclusive, and more preferably set to values closer to 90 degrees, in order to weaken the guiding functions of first outer wall 111*a* and second outer wall 112*a*. Note that even when first outer wall 111*a* and second outer wall 112*a* have shapes such as those illustrated in (a) to (e) in FIG. 23, for example, stable cleavage is possible.

Furthermore, each of the angle formed between the direction in which a pair of first outer wall portions 111*a*1 and 111*a*2 extend in the substrate plane and the direction (first direction) orthogonal to the longitudinal direction of waveguide 201 and the angle formed between the direction in which a pair of second outer wall portions 112*a*1 and 111*a*2 extend in the substrate plane and the direction (first direction) orthogonal to the longitudinal direction of waveguide 201 may be between 30 degrees and 90 degrees, inclusive, and more preferably at least 45 degrees excluding 60 degrees. The positions of a pair of first outer wall portions 111*a*1 and 111*a*2 and a pair of second outer wall portions 112*a*1 and 111*a*2 are not at split position 102*a* (position subject to cleavage), but, in order to eliminate, also in the vicinity of split position 102*a*, even a little of the impact caused in the case where the position in which fourth trench 114 is formed is displaced parallel to the longitudinal direction (second direction) of waveguide 201, a pair of first outer wall portions 111*a*1 and 111*a*2 and a pair of second outer wall portions 112*a*1 and 111*a*2 are desirably formed at angles within the aforementioned angle range. Note that the distance between first outer wall portion 111*a* and second outer wall portion 112*a* in the first direction in the vicinity of first portion 120*a* may be the same as that in other regions.

Furthermore, in order to inhibit separation of the end surface coating film, it is necessary to improve the adhesiveness of the end surface coating film which is formed on the cleavage surface. A crystalline AlN film has been generally used as an adhesion layer to be adhered to a semiconductor substrate, but the AlN film is easily separated from semiconductor layer stacked substrate 102 which is a nitride semiconductor light-emitting element stacked substrate due to a large difference in the coefficient of thermal expansion therebetween.

In view of this, in the present embodiment, the end surface coating film is formed using, as the adhesion layer, an AlON film which has a coefficient of thermal expansion less different from the coefficient of thermal expansion of the nitride semiconductor light-emitting element stacked substrate than the AlN film.

Figure 24:
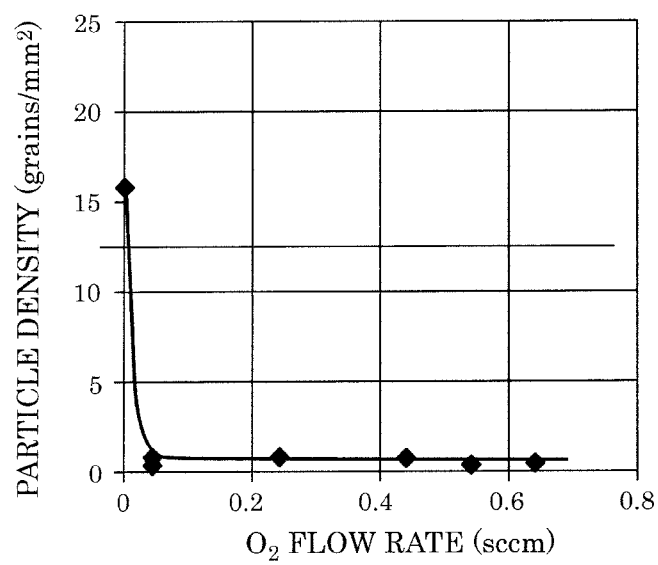
FIG. 24 illustrates the $O_2$ addition amount dependency of the density of particles adhered to a film surface when a trace amount of $O_2$ gas is added to an AlN film upon film formation on a Si substrate.

FIG. 24 illustrates the $O_2$ addition amount dependency of the density of particles adhered to a film surface when a trace amount of $O_2$ gas is added to the AlN film upon film formation on a Si substrate. A low density of particles (that is, a small number of particles generated) means high adhesiveness of the film.

As illustrated in FIG. 24, the density of particles can be drastically reduced by adding a trace amount of $O_2$ to the AlN film. This indicates that adding a trace amount of $O_2$ to the AlN film upon film formation has led to a significant increase in the adhesiveness of the film.

Figure 25:
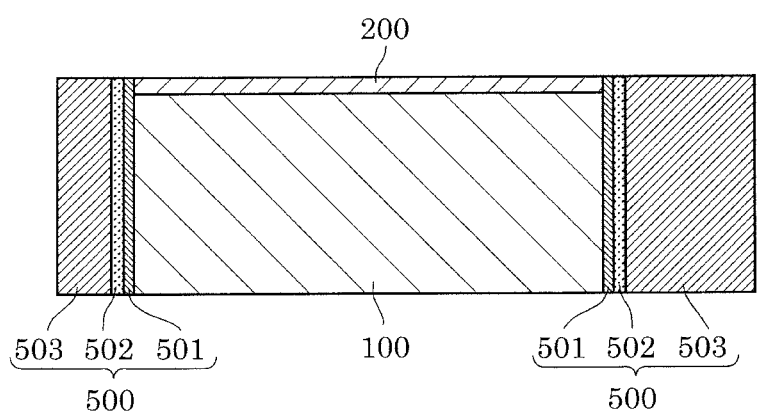
FIG. 25 is a diagram illustrating an end surface coating film structure that further improves the advantageous effect of reducing film separation of an end surface coating film according to Embodiment 1.

FIG. 25 is a diagram illustrating an end surface coating film structure that further improves the advantageous effect of reducing film separation of the end surface coating film according to Embodiment 1.

In the nitride semiconductor light-emitting element illustrated in FIG. 25, adhesion layers 501, AlN layers 502, and reflectivity adjustment layers 503 are formed on both end surfaces. Note that a GaN substrate is used as substrate 100. With adhesion layer 501 inserted between AlN layer 502 and substrate 100 as just described, the advantageous effect of reducing film separation of AlN layer 502 and reflectivity adjustment layer 503 can be expected, and in the process of splitting to obtain a nitride semiconductor light-emitting element, the advantageous effect of inhibiting separation of the end surface coating film is obtained.

Figure 26:
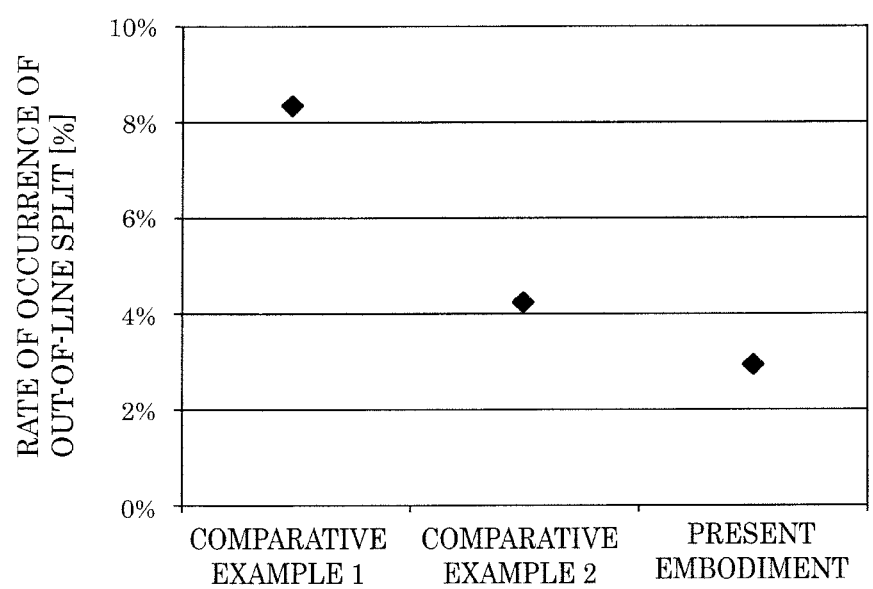
FIG. 26 is for explaining the advantageous effects obtained when a nitride semiconductor light-emitting element according to Embodiment 1 is fabricated.

Nitride semiconductor light-emitting element 101, the method for manufacturing the same, etc., according to the present embodiment have been described above. FIG. 26 shows the advantageous effects obtained when nitride semiconductor light-emitting element 101 according to the present embodiment is actually fabricated.

FIG. 26 illustrates the rate of occurrence of an out-of-line split in each of the present embodiment, Comparative Example 1, and Comparative Example 2. The difference between the present embodiment and Comparative Examples 1 and 2 is the shape of split trench forming region 113*a*. Split trench forming region 113*a* in Comparative Example 1 has a flat structure, split trench forming region 113*a* in Comparative Example 2 has a recessed structure (equivalent to the structure in FIG. 9), and split trench forming region 113*a* in the present embodiment has a projecting structure. In all of the present embodiment and Comparative Examples 1 and 2, distance L1 is set to 4 μm, distance L2 is set to 10 μm, and the depth of third trench 113 is set to a depth reaching substrate 100. Furthermore, both θ1 and θ2 in all of the present embodiment and Comparative Examples 1 and 2 are set to 90 degrees, and θ3 in the present embodiment and Comparative Example 2 is set to 90 degrees.

As a result, as illustrated in FIG. 26, compared to Comparative Example 1, in Comparative Example 2, since split trench forming region 113*a* is in the form of a recess, the guiding function works, resulting in a nitride semiconductor light-emitting element having a good shape. Furthermore, it is confirmed that in the present embodiment in which split trench forming region 113*a* is in the form of a projection, a nitride semiconductor light-emitting element having a better shape can be obtained.

As described above, in the present embodiment, a cleavage surface having improved flatness can be formed, and thus nitride semiconductor light-emitting element 101 having a more stable shape can be manufactured in quantity with a high yield. Accordingly, nitride semiconductor light-emitting element 101 having good laser element properties can be obtained. Moreover, upon an element split, generation of particles can be sufficiently reduced, enabling a long-term guarantee for operations for several thousands of hours even in the watt-class operating state.

Variation 1 of Embodiment 1

Next, Variation 1 of Embodiment 1 described above will be described.

In the present variation, regarding the length of third trench 113 in Embodiment 1 described above, three conditions, 15 μm, 20 μm, and 25 μm, are set for L2 illustrated in FIG. 15, and the other conditions remain the same as those in Embodiment 1 described above; using this manufacturing method, a nitride semiconductor light-emitting element is fabricated.

As a result, compared to the case in Comparative Example 2 illustrated in FIG. 26, the rate of occurrence of an out-of-line split is lower where L2=15 μm and L2=20 μm, but chipping occurs more frequently where L2=25 μm. This results is considered to be due to the need for higher stress to split bar-shaped substrate 103 because the length of third trench 113 is short, leading to an increase in the frequency of chipping. Therefore, in order to inhibit chipping, distance L2 needs to be short as described above, and it is clear that the upper limit of L2 is 20 µm, which makes it possible to manufacture a nitride semiconductor light-emitting element having a stable shape.

Variation 2 of Embodiment 1

Next, Variation 2 of Embodiment 1 described above will be described.

Figure 27:
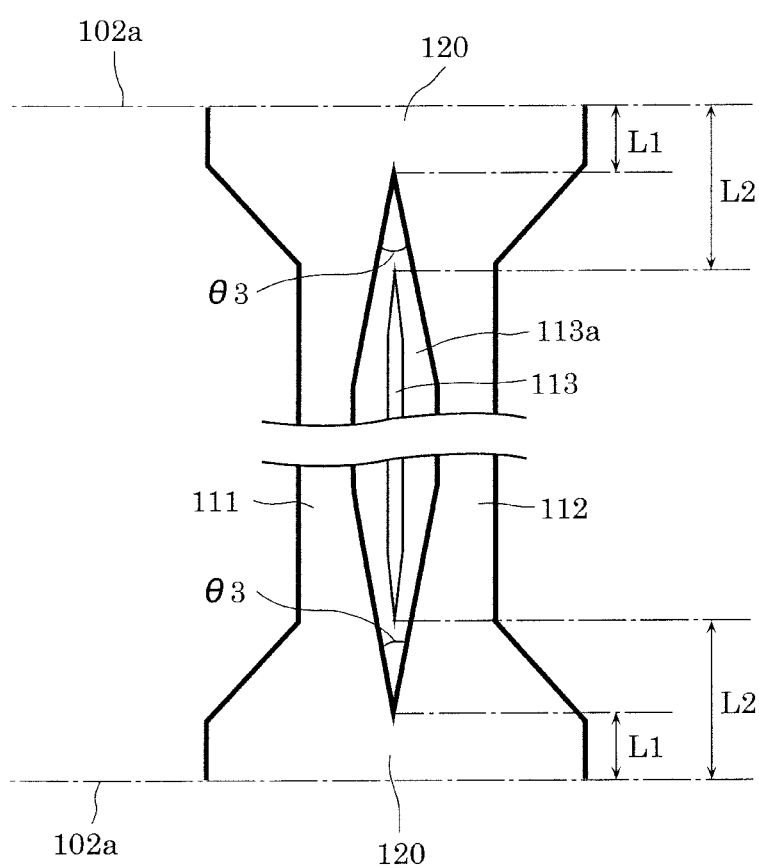
FIG. 27 is an enlarged plan view of an area in the vicinity of an end portion of a split trench forming region on a bar-shaped substrate according to Variation 2 of Embodiment 1.

In the present variation, studies are conducted on how acute angle θ3 at the leading end of split trench forming region 113a can be. FIG. 27 is an enlarged plan view of an area around split trench forming region 113a obtained by making angle θ3 at the leading end of split trench forming region 113a more acute than 90 degrees.

In this case, for example, when θ3 is set to 30 degrees, the area of split trench forming region 113a becomes small. In consideration of variations in width W of third trench 113 and variations, in the X-axis direction (first direction), in the position in which third trench 113 is formed, the length of L2 inevitably becomes great. In this case, if angle θ3 is small, split trench forming region 113a functions well as a guide, but, because the length of third trench 113 is short, higher stress is required to split bar-shaped substrate 103, leading to an increase in the frequency of chipping, as described above in Variation 1.

If θ3 is set to 60 degrees, the wall surface at the leading end portion of split trench forming region 113a overlaps the cleavage surface, and therefore in the case of splitting along the side wall of split trench forming region 113a, the split may progress along the cleavage surface, deteriorating the shape of a nitride semiconductor light-emitting element.

In view of this, by setting θ3 to 50 degrees, it is possible to set L2, which depends on the length of third trench 113, to 20 µm or less, and it is possible to not only inhibit chipping, but also keep the rate of occurrence of an out-of-line split as low as that in Embodiment 1 described above.

Thus, by setting θ3 to at least 50 degrees, it is possible to reduce both of out-of-line splits and chipping. Note that the upper limit of θ3 may be 90 degrees because the guiding function of split trench forming region 113a becomes weak if θ3 is too large. Consequently, θ3 is desirably between 50 degrees and 90 degrees, inclusive.

Embodiment 2

Next, Embodiment 2 of the present disclosure will be described; however, prior to the description of Embodiment 2 of the present disclosure, developments that resulted in one aspect of the present disclosure will be described.

Figure 28:
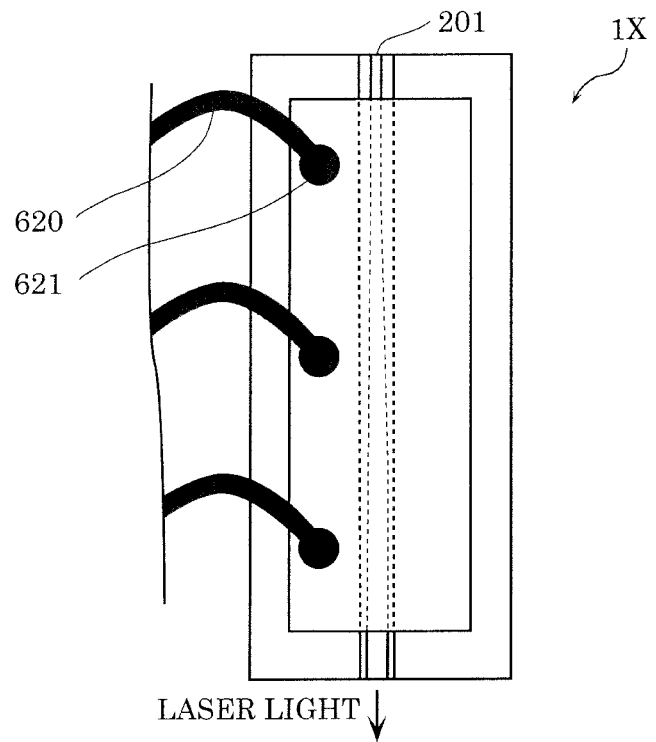
FIG. 28 is a diagram illustrating a nitride semiconductor light-emitting element including a tapered strip ridge when wires are connected to the nitride semiconductor light-emitting element.

Conventionally, a nitride semiconductor light-emitting element having a structure in which a waveguide has different widths at one end portion and the other end portion has been known. For example, nitride semiconductor light-emitting element 1X including tapered strip waveguide 201 as illustrated in FIG. 28 is known. Waveguide 201 illustrated in FIG. 28 increases in width from the end portion on the reflection surface side toward the end portion on the exit surface side through which laser light exits.

A wires such as a gold wire is used as means for supplying an electric current to the nitride semiconductor light-emitting element. In this case, as illustrated in FIG. 28, wire 620 is connected by wire bonding to nitride semiconductor light-emitting element 1X mounted on a sub-mount or the like.

Generally, in the case of nitride semiconductor light-emitting elements in quantity, a semiconductor layer stacked substrate in which waveguides in the form of stripes are formed through a plurality of element forming regions for respective nitride semiconductor light-emitting elements is cleaved to obtain a plurality of bar-shaped substrates, and each of these bar-shaped substrate is further split into individual pieces; in this manner, a plurality of nitride semiconductor light-emitting elements (chips) are obtained from one substrate (wafer).

At this time, in a conceivable method for manufacturing nitride semiconductor light-emitting elements in quantity each of which includes a waveguide having different widths at one end portion and the other end portion, the widths of adjacent waveguides may be made different while the widths of alternate waveguides are the same, in the positions of cleavage on the semiconductor layer stacked substrate. This makes it possible to easily manufacture one type of nitride semiconductor light-emitting elements in quantity from a single substrate.

In recent years, narrowing a nitride semiconductor light-emitting element has been considered for purposes such as reducing cost and downsizing the nitride semiconductor light-emitting element.

Figure 29:
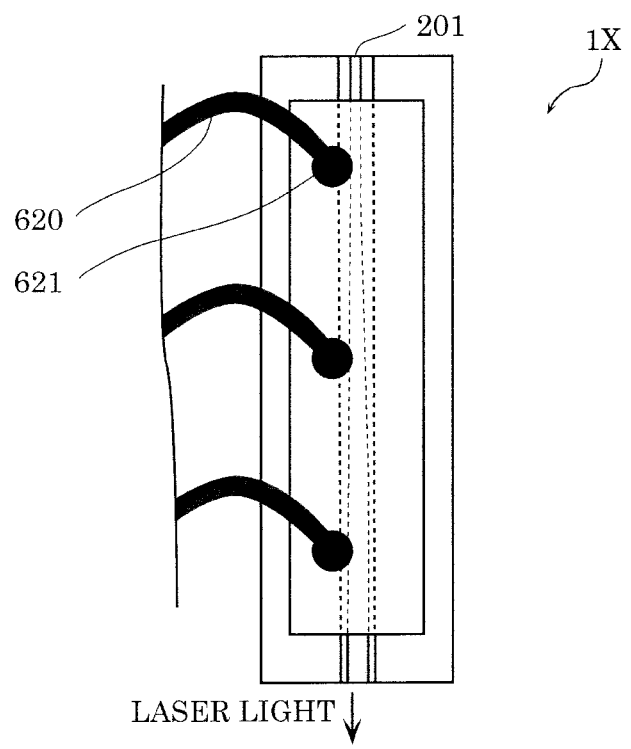
FIG. 29 is a diagram illustrating a nitride semiconductor light-emitting element including a tapered strip ridge when wires are connected to the nitride semiconductor light-emitting element.

However, when the nitride semiconductor light-emitting element is narrowed, upon connecting wire 620 to nitride semiconductor light-emitting element 1X, connecting portion 621 of wire 620 is located above waveguide 201 (ridge portion) of nitride semiconductor light-emitting element 1X, as illustrated in FIG. 29. In this case, there is a risk that waveguide 201 may be damaged by the impact of wire bonding, which reduces the reliability of nitride semiconductor light-emitting element 1X.

In view of this, the position of the waveguide may be offset along the width of the element to prevent the connecting portion of the wire from being located above the waveguide.

Figure 30:
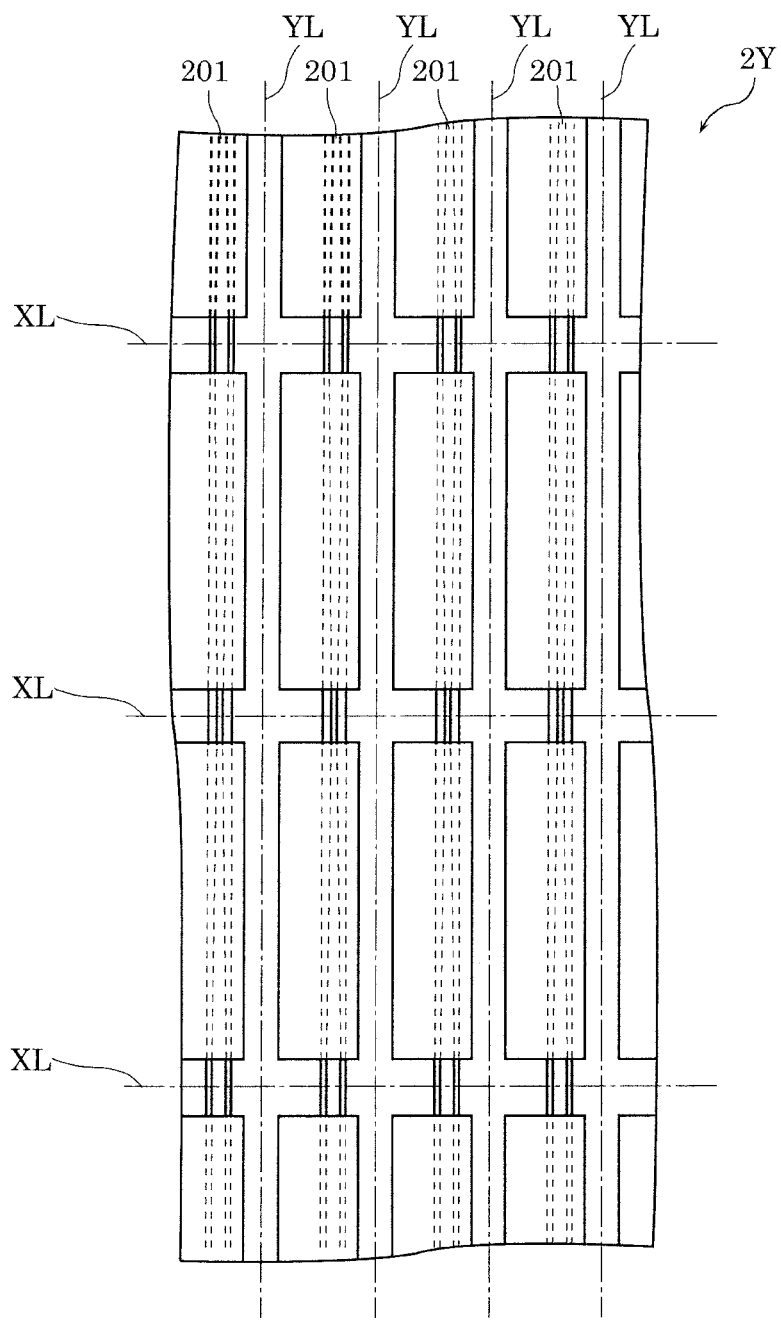
FIG. 30 is a plan view of a portion of a semiconductor layer stacked substrate according to a comparative example.
Figure 31:
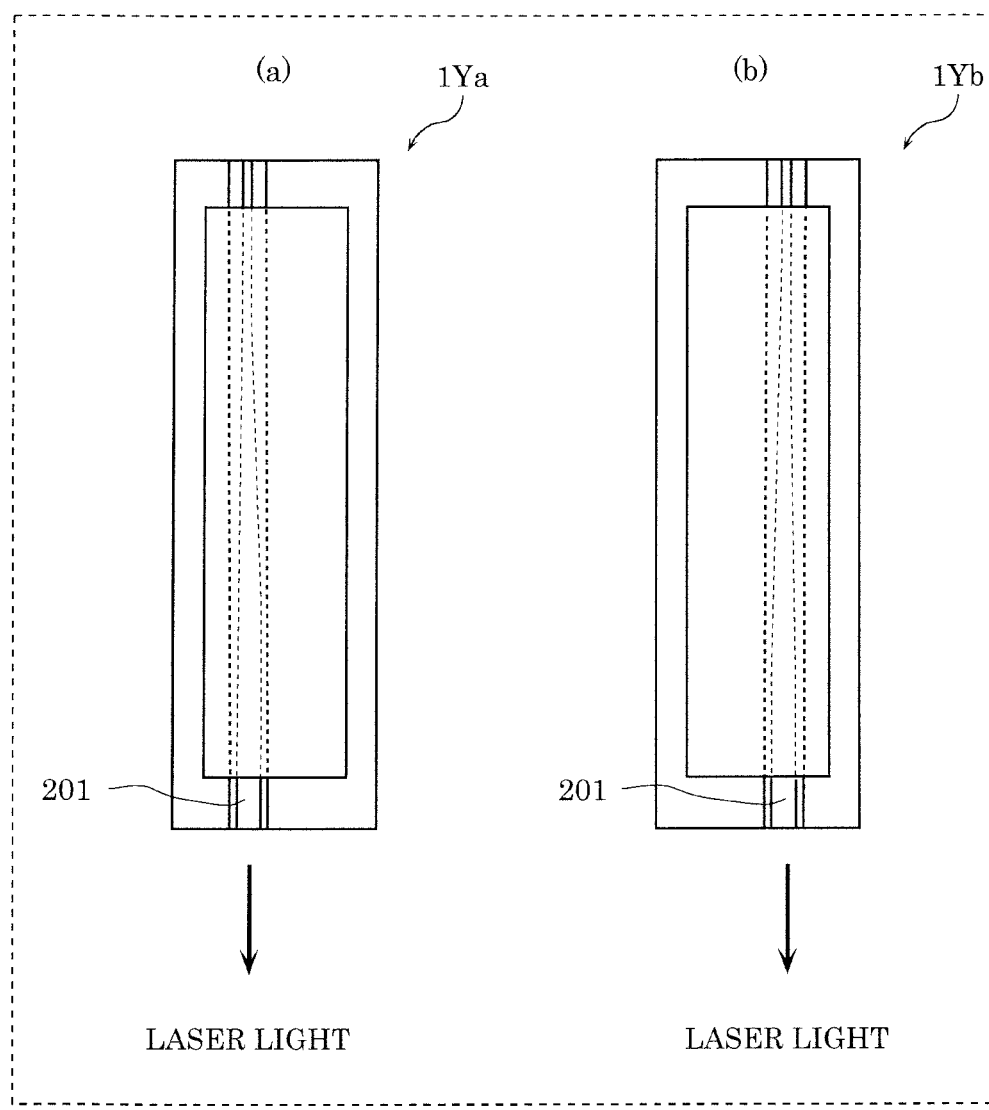
FIG. 31 is a plan view illustrating two types of nitride semiconductor light-emitting elements each obtained by splitting a semiconductor layer stacked substrate according to a comparative example.

However, in the case of manufacturing, from a single substrate (wafer), nitride semiconductor light-emitting elements in quantity in each of which a waveguide has different widths at one end portion and the other end portion and the position of the waveguide is offset along the width of the element, using a method in which the widths of adjacent waveguides 201 are made different while the widths of alternate waveguides 201 are the same, in the positions on split line XL (positions of cleavage) among two different types of split lines XL and YL for splitting semiconductor layer stacked substrate 2Y, as illustrated in FIG. 30, nitride semiconductor light-emitting element 1Ya in which waveguide 201 is offset to the left when viewed from the exit surface, as illustrated in (a) of FIG. 31, and nitride semiconductor light-emitting element 1Yb in which waveguide 201 is offset to the right when viewed from the exit surface, as illustrated in (b) of FIG. 31, are fabricated. This means that two types of nitride semiconductor light-emitting elements in which waveguides 201 are offset in different directions are undesirably obtained.

To deal with such a problem, the inventors diligently studied and found a method for easily manufacturing a single type of nitride semiconductor light-emitting elements including waveguides offset in the same direction, even when using a method for obtaining individual nitride semiconductor light-emitting elements by splitting a semiconductor layer stacked substrate in which waveguides are formed through a plurality of element forming regions, upon manufacturing nitride semiconductor light-emitting elements in quantity in each of which a waveguide has different widths at one end portion and the other end portion and the position of the waveguide is offset along the width of the element.

The present disclosure has been conceived to solve such a problem and aims to provide, for example, a method for manufacturing a nitride semiconductor light-emitting element in which a single type of nitride semiconductor light-emitting elements including waveguides offset in the same direction can be easily manufactured upon manufacturing nitride semiconductor light-emitting elements in each of which a waveguide has different widths at one end portion and the other end portion and the position of the waveguide is offset along the width of the element.

Hereinafter, Embodiment 2 of the present disclosure will be described with reference to the drawings.

Figure 32:
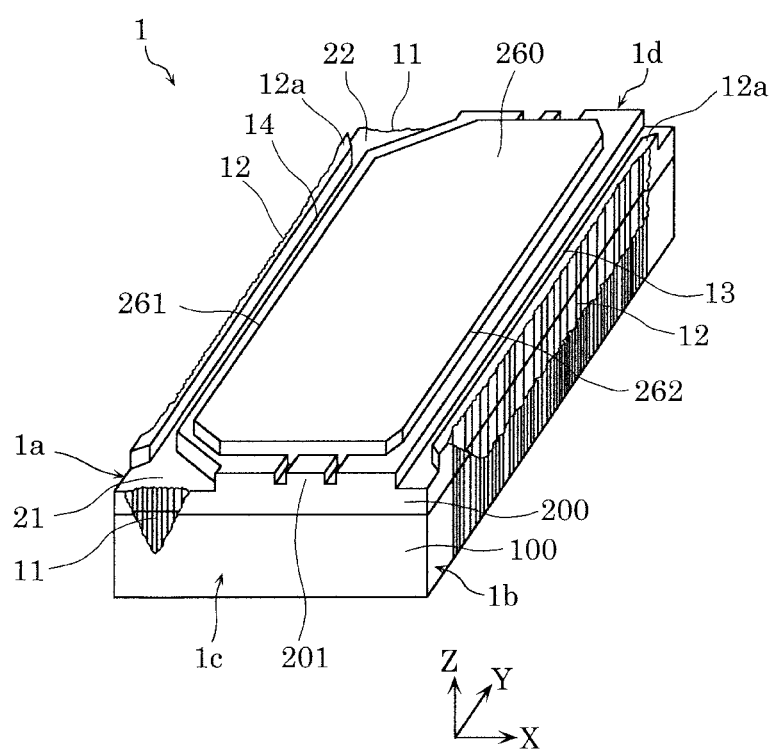
FIG. 32 is a perspective view of a nitride semiconductor light-emitting element according to Embodiment 2.
Figure 33:
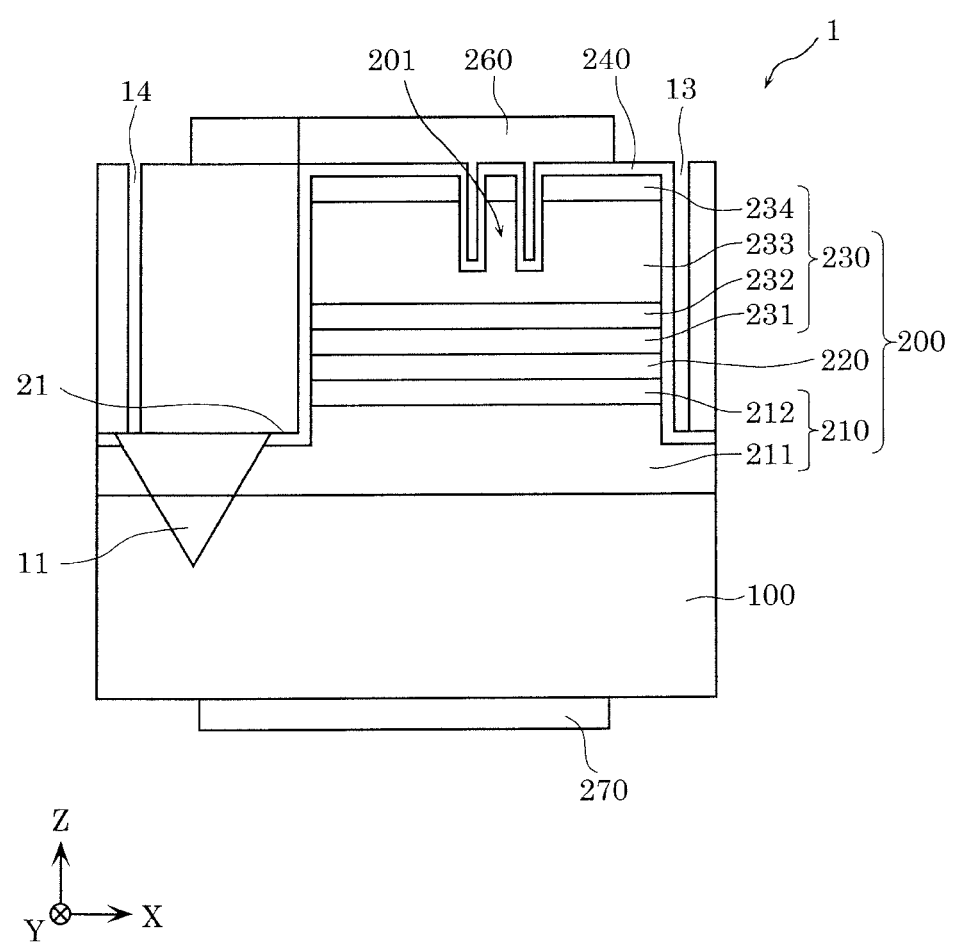
FIG. 33 is a front view of a nitride semiconductor light-emitting element according to Embodiment 2.
Figure 34:
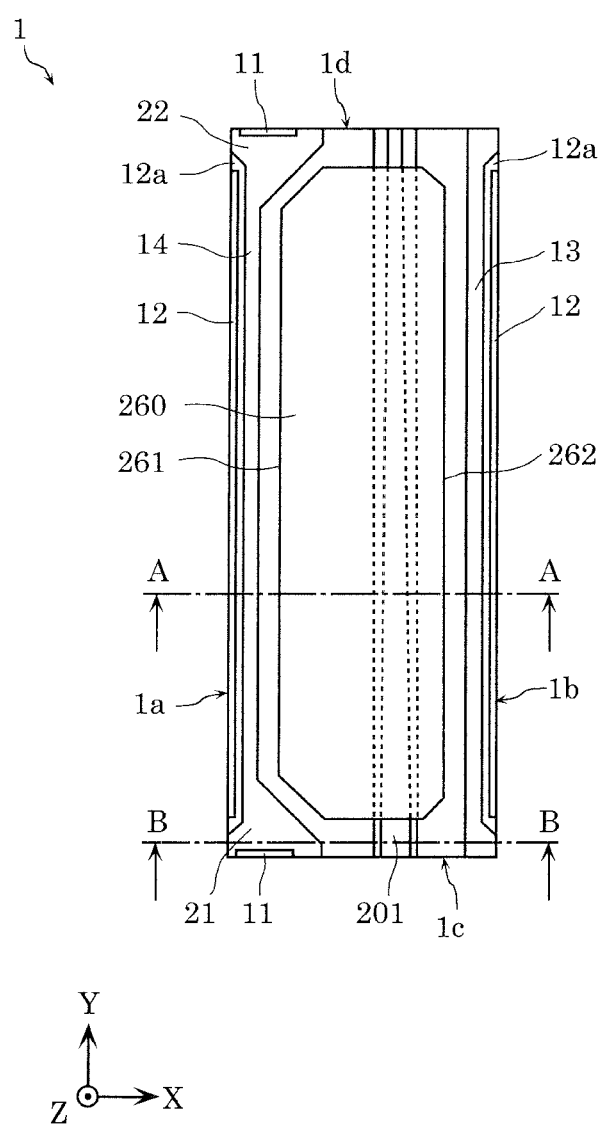
FIG. 34 is a top view of a nitride semiconductor light-emitting element according to Embodiment 2.
Figure 35A:
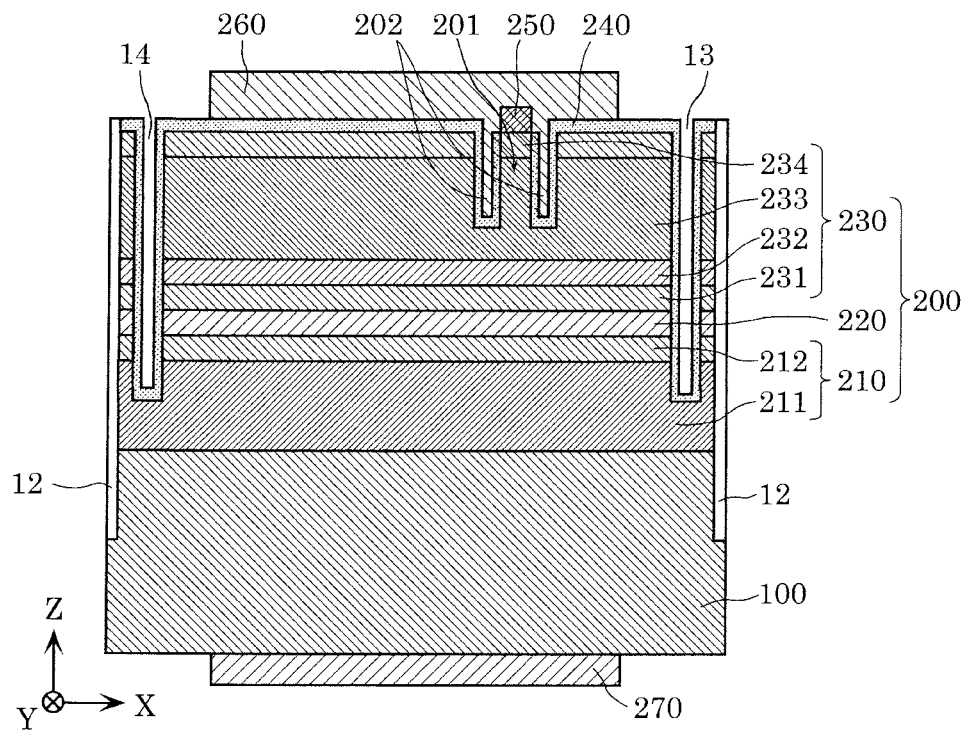
FIG. 35A is a cross-sectional view of a nitride semiconductor light-emitting element according to Embodiment 2, taken along line A-A in FIG. 34.
Figure 35B:
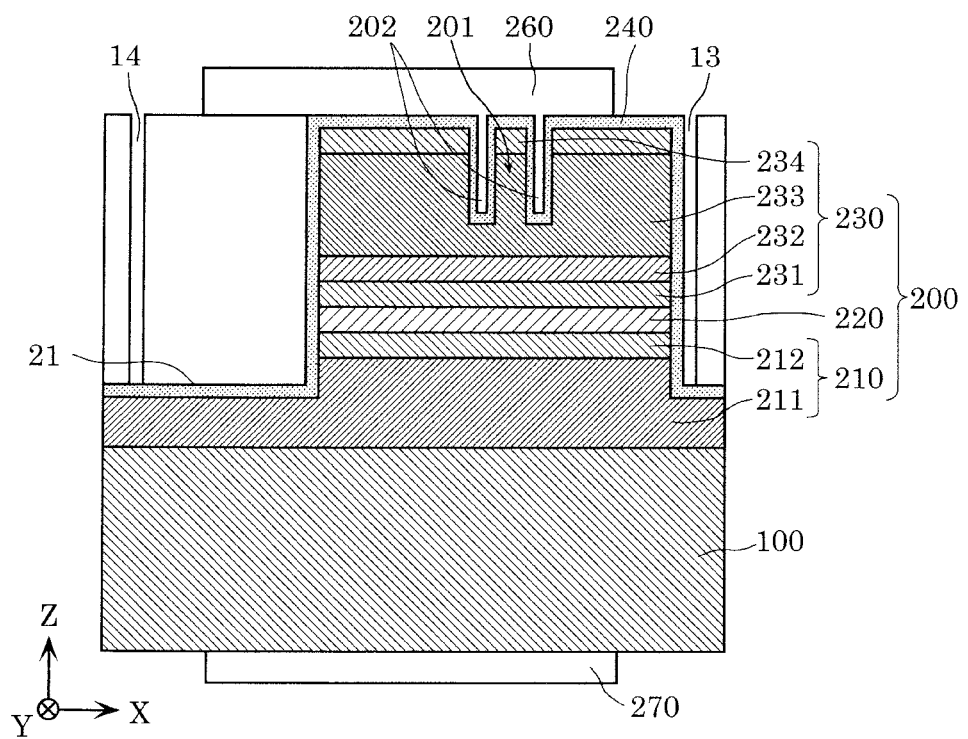
FIG. 35B is a cross-sectional view of a nitride semiconductor light-emitting element according to Embodiment 2, taken along line B-B in FIG. 34.
Figure 36:
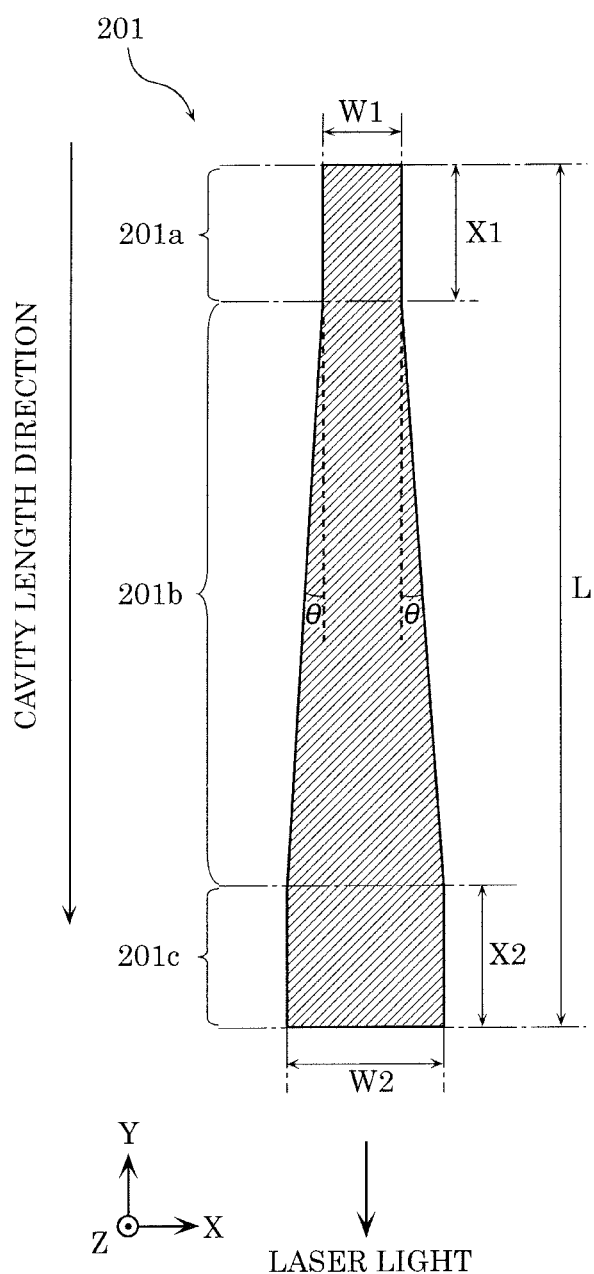
FIG. 36 is a plan view illustrating the shape of a waveguide in a nitride semiconductor light-emitting element according to Embodiment 2.

First, the configuration of nitride semiconductor light-emitting element 1 manufactured by the method for manufacturing nitride semiconductor light-emitting element 1 according to Embodiment 2 will be described with reference to FIG. 32 to FIG. 36. FIG. 32 to FIG. 34 are a perspective view, a front view, and a top view, respectively, of nitride semiconductor light-emitting element 1 according to Embodiment 2. FIG. 35A is a cross-sectional view of said nitride semiconductor light-emitting element 1 taken along line A-A in FIG. 34, and FIG. 35B is a cross-sectional view of said nitride semiconductor light-emitting element 1 taken along line B-B in FIG. 34. FIG. 36 is a plan view illustrating the shape of waveguide 201 in said nitride semiconductor light-emitting element 1.

As illustrated in FIG. 32 and FIG. 34, nitride semiconductor light-emitting element 1 has first side surface 1a, second side surface 1b, third side surface 1c, and fourth side surface 1d.

First side surface 1a and second side surface 1b are substantially parallel to the Y-axis direction. Specifically, first side surface 1a and second side surface 1b are substantially parallel to the YZ plane. Second side surface 1b is opposite to first side surface 1a.

Note that although details will be described later, first side surface 1a and second side surface 1b are split surfaces obtained along a lengthwise split line extending along the Y-axis when nitride semiconductor light-emitting element 1 is fabricated by splitting the semiconductor layer stacked substrate.

Third side surface 1c and fourth side surface 1d are substantially parallel to the X-axis direction. Specifically, third side surface 1c and fourth side surface 1d are substantially parallel to the XZ plane and are substantially perpendicular to first side surface 1a and second side surface 1b. Fourth side surface 1d is opposite to third side surface 1c. Third side surface 1c is an exit surface of nitride semiconductor light-emitting element 1, and fourth side surface 1d is a reflection surface of nitride semiconductor light-emitting element 1.

Note that although details will be described later, third side surface 1c and fourth side surface 1d are split surfaces obtained along a crosswise split line extending along the X-axis when nitride semiconductor light-emitting element 1 is fabricated by splitting the semiconductor layer stacked substrate. Specifically, third side surface 1c and fourth side surface 1d are in contact with waveguide 201 and are cleavage surfaces. Furthermore, although not illustrated in FIG. 32 to FIG. 34, each of third side surface 1c and fourth side surface 1d is covered by end surface coating film (reflection film).

As illustrated in FIG. 32 to FIG. 35B, nitride semiconductor light-emitting element 1 includes: substrate 100; and semiconductor element structure 200 on one surface of substrate 100, similar to nitride semiconductor light-emitting element 101 according to Embodiment 1. Nitride semiconductor light-emitting element 1 in the present embodiment is also a nitride semiconductor laser made from a nitride-based semiconductor material.

Substrate 100 is, for example, a GaN substrate made from GaN, as in Embodiment 1. Also in the present embodiment, a hexagonal crystal, n-type GaN substrate is used as substrate 100.

As illustrated in FIG. 35A and FIG. 35B, semiconductor element structure 200 includes first nitride semiconductor layer 210 of the first conductivity type, active layer 220, and second nitride semiconductor layer 230 of the second conductivity type different from the first conductivity type, sequentially on substrate 100, as in Embodiment 1. The specific materials of first nitride semiconductor layer 210, active layer 220, and second nitride semiconductor layer 230 are substantially the same as those in Embodiment 1.

As illustrated in FIG. 34, nitride semiconductor light-emitting element 1 includes waveguide 201 extending in the laser cavity length direction, similar to nitride semiconductor light-emitting element 101 according to Embodiment 1. As illustrated in FIG. 35A and FIG. 35B, waveguide 201 is formed in second nitride semiconductor layer 230. In the present embodiment, waveguide 201 has a ridge strip structure in the form of a ridge.

Furthermore, also in the present embodiment, electric current blocking layer 240 made from $SiO_2$ covers second nitride semiconductor layer 230 (in the present embodiment, p-type contact layer 234), except for a portion over each waveguide 201, from above, as illustrated in FIG. 35A and FIG. 35B.

Furthermore, p-side ohmic electrode 250 and p-side electrode 260 are formed above semiconductor element structure 200 as the first electrode, and n-side electrode 270 is formed on the other surface of substrate 100 as the second electrode.

In nitride semiconductor light-emitting element 1 according to the present embodiment, the position of waveguide 201 is offset along the width of nitride semiconductor light-emitting element 1, as illustrated in FIG. 33. In other words, waveguide 201 is disposed in a position offset in the X-axis direction (first direction), and the center line of waveguide 201 is located off the center of nitride semiconductor light-emitting element 1 along the width thereof.

In the present embodiment, the position of waveguide 201 is offset in the positive direction (rightward) along the X-axis when viewed from the front of nitride semiconductor light-emitting element 1. Therefore, as illustrated in FIG. 32 and FIG. 34, the first width between waveguide 201 and first end portion 261 of p-side electrode 260 closest to first side surface 1a is greater than the second width between waveguide 201 and second end portion 262 of p-side electrode 260 closest to second side surface 1b.

Furthermore, as illustrated in FIG. 36, waveguide 201 has different widths at one end portion (the ridge end portion on the exit surface side of nitride semiconductor light-emitting element 1) and the other end portion (the ridge end portion on the reflection surface side of nitride semiconductor light-emitting element 1) in the cavity length direction. In other words, when the first width (first ridge strip width) of waveguide 201 at the reflection surface side end portion which is on fourth side surface 1d is denoted as W1 and the second width (second ridge strip width) of waveguide 201 at the exit surface side end portion which is on third side surface 1c is denoted as W2, W1≠W2 is satisfied. Specifically, second width W2 on the exit surface side is greater than first width W1 on the reflection surface side (W2>W1).

In the present embodiment, waveguide 201 includes: first straight portion 201a having constant width W1; width changing portion 201b having a width continuously changing from W1 to W2; and second straight portion 201c having constant width W2. Width changing portion 201b is located between first straight portion 201a and second straight portion 201c. In the present embodiment, the width of width changing portion 201b monotonically increases from the reflection surface side to the exit surface side. Specifically, width changing portion 201b is a tapered portion having a width gradually changing in a tapered form, and waveguide 201 has a tapered strip structure.

In this case, taper angle θ (inclination angle) of width changing portion 201b with respect to the cavity length direction can be expressed with Expression 1 below where L is the total length of waveguide 201 in the cavity length direction, X1 is the length of first straight portion 201a, and X2 is the length of second straight portion 201c.

$$\tan(\theta)=(W2-W1)/(2\times(L-X1-X2))$$ Expression 1

Furthermore, in nitride semiconductor light-emitting element 1, a portion where waveguide 201 has a greater width is used as the exit surface to achieve laser light extraction. In this case, an end surface coating film (reflection film) is formed on the exit surface so that the reflectivity of the laser light on the end surface becomes Rf (%), and an end surface coating film (reflection film) is formed on the reflection surface so that the reflectivity of the laser light on the end surface becomes Rr (%). Here, in order to improve the light extraction efficiency at the exit surface, Rf and Rr are set to satisfy Rf<Rr.

Thus, with width changing portion 201b (tapered portion) in waveguide 201, it is possible to increase the homogeneity of electron-hole pair density distribution in active layer 220 with respect to the cavity length direction in the ridge strip region, and since the area of electric current injection to active layer 220 is small, the oscillation threshold electric current value required for laser oscillation can be made small. Accordingly, the thermal saturation level at the time of high-temperature operations increases, and thus the high-temperature operating characteristics of nitride semiconductor light-emitting element 1 improves.

Furthermore, the light distribution shape of laser light propagating through waveguide 201 can be controlled using first width W1 which is a narrow width. In other words, the transverse mode control is available. In this case, a region where waveguide 201 has a constant width can be provided in the vicinity of a cavity end surface to reduce the occurrence of the width of the end portion of waveguide 201 changing due to displacement of the position of cleavage.

Particularly, in nitride semiconductor light-emitting element 1 according to the present embodiment, although the position of waveguide 201 is offset, as a result of the position of waveguide 201 being offset, dissipation of heat generated during the operation of nitride semiconductor light-emitting element 1 is susceptible to the effects caused by a difference between the distance from waveguide 201 to the left side surface and the distance from waveguide 201 to the right side surface, and thus the high-temperature operating characteristics are degraded. However, in nitride semiconductor light-emitting element 1 according to the present embodiment, since waveguide 201 includes width changing portion 201b (tapered portion), it is possible to improve the high-temperature operating characteristics as described above. With this, it is possible to provide low-cost nitride semiconductor light-emitting element 1 with the element area reduced without causing a degradation of the high-temperature operating characteristics.

Nitride semiconductor light-emitting element 1 configured as described above includes a plurality of trenches. Specifically, as illustrated in FIG. 32 to FIG. 35B, nitride semiconductor light-emitting element 1 includes first trench 11, second trench 12, third trench 13, and fourth trench 14.

As described later, first trench 11 is a split trench for cleavage, and second trench 12 is a split trench for element splits into pieces. First trench 11 and second trench 12 are formed by a laser. Third trench 13 and fourth trench 14 are guide trenches used to form split trench forming region 12a for forming second trench 12. Third trench 13 and fourth trench 14 are formed by etching.

As illustrated in FIG. 32, and FIG. 34, first trench 11 extends long the X-axis direction (first direction) near the intersection between first side surface 1a and third side surface 1c in plan view. In the present embodiment, first trench 11 is formed in third side surface 1c. Specifically, first trench 11 is formed depressed slightly toward fourth side surface 1d from third side surface 1c (exit surface) in top view.

Furthermore, as illustrated in FIG. 32 and FIG. 33, first trench 11 is formed by digging from the bottom surface of first recess 21 along the Z-axis. First trench 11 reaches substrate 100 through semiconductor element structure 200. Although described later, the maximum depth of first trench 11 is 20 μm to 60 μm, and the length of first trench 11 in the first direction when viewed in plan view is 30 μm to 40 μm. First trench 11 is formed so as to have a triangular shape in front view, but this is not limiting. Note that first trench 11 is formed also in fourth side surface 1d.

As illustrated in FIG. 32 and FIG. 34, second trench 12 is formed in each of first side surface 1a and second side surface 1b. In the present embodiment, second trench 12 is formed depressed slightly backward from first side surface 1a and second side surface 1b in top view.

Furthermore, as illustrated in FIG. 32 and FIG. 35A, second trench 12 is formed by digging from the upper surface of semiconductor element structure 200 along the Z-axis. Second trench 12 reaches substrate 100 through semiconductor element structure 200. Although described later, the maximum depth of second trench 12 is 30 μm to 60 μm, and the length of second trench 12 in the second direction when viewed in plan view is within split trench forming region 12a. Second trench 12 is deeper than third trench 13 and fourth trench 14. This means that the bottom of second trench 12 is located deeper than the bottom of each of third trench 13 and fourth trench 14. Second trench 12 is formed so as to have a substantially trapezoidal shape in side view, but this is not limiting.

Furthermore, nitride semiconductor light-emitting element 1 includes, as a portion of second trench 12, a first depressed portion which is depressed toward second side surface 1b from first side surface 1a and a second depressed portion which is depressed toward first side surface 1a from second side surface 1b, similar to nitride semiconductor light-emitting element 101 according to Embodiment 1 described above.

The first depressed portion a section recessed to form a step such that a region including an upper end portion of first side surface 1a is depressed. Likewise, the second depressed portion is a section recessed to form a step such that a region including an upper end portion of second side surface 1b is depressed.

Furthermore, nitride semiconductor light-emitting element 1 includes, as a portion of first trench 11, a third depressed portion which is depressed toward fourth side surface 1d from third side surface 1c and a fourth depressed portion which is depressed toward third side surface 1c from fourth side surface 1d, similar to nitride semiconductor light-emitting element 101 according to Embodiment 1 described above.

In the present embodiment, second trench 12 is formed in split trench forming region 12a. Split trench forming region 12a is an island-shaped region obtained by forming third trench 13 and fourth trench 14 and extends along the Y-axis. Second trench 12 is formed by digging from the upper surface in split trench forming region 12a along the Z-axis.

As illustrated in FIG. 32 to FIG. 34, third trench 13 and fourth trench 14 extend substantially parallel to the Y-axis. Third trench 13 and fourth trench 14 formed as a pair across waveguide 201. In other words, waveguide 201 is present between the pair of third trench 13 and fourth trench 14 that are adjacent to each other. As illustrated in FIG. 35A, each of third trench 13 and fourth trench 14 is in the form of a recess defined by the bottom surface and two facing side surfaces formed substantially perpendicularly with respect to the bottom surface.

Third trench 13 and fourth trench 14 are formed by digging in semiconductor element structure 200. Specifically, third trench 13 and fourth trench 14 reach first nitride semiconductor layer 210; third trench 13 and fourth trench 14 are dug so that the bottom of each of third trench 13 and fourth trench 14 reaches first nitride semiconductor layer 210. In other words, third trench 13 and fourth trench 14 are formed by digging in second nitride semiconductor layer 230, active layer 220, and a portion of first nitride semiconductor layer 210. In the present embodiment, third trench 13 and fourth trench 14 are formed by digging in n-type clad layer 211 halfway. This means that the bottom of each of third trench 13 and fourth trench 14 reaches n-type clad layer 211. Note that third trench 13 and fourth trench 14 have the same depth, but this is not limiting.

Furthermore, as illustrated in FIG. 32, nitride semiconductor light-emitting element 1 includes first recess 21 near the intersection between first side surface 1a and third side surface 1c. In the present embodiment, first recess 21 is formed over first side surface 1a and third side surface 1c. Although details will be described later, a side surface (wall surface) of first recess 21 may be inclined at an angle of at least 45 degrees with respect to third side surface 1c.

Furthermore, nitride semiconductor light-emitting element 1 includes second recess 22 near the intersection between first side surface 1a and fourth side surface 1d. In the present embodiment, second recess 22 is formed over first side surface 1a and fourth side surface 1d. Although details will be described later, a side surface (wall surface) of second recess 22 may be inclined at an angle of at least 45 degrees with respect to fourth side surface 1d.

Each of first recess 21 and second recess 22 is connected to fourth trench 14. Specifically, first recess 21 is connected to one end portion of fourth trench 14 in the longitudinal direction, and second recess 22 is connected to the other end portion of fourth trench 14 in the longitudinal direction. First recess 21 and second recess 22 are formed at the same time as fourth trench 14. Therefore, each of first recess 21 and second recess 22 has the same depth as the depth of fourth trench 14, and the bottom surface of each of first recess 21 and second recess 22 is in the same position in depth as the bottom surface of fourth trench 14.

Next, a method for manufacturing nitride semiconductor light-emitting element 1 according to Embodiment 2 will be described with reference to FIG. 37A to FIG. 37K. FIG. 37A to FIG. 37K are diagrams for describing the method for manufacturing nitride semiconductor light-emitting element 1 according to Embodiment 2. In FIG. 37B to FIG. 37F, (a) on the upper side is a cross-sectional view taken along line A-A in (b) on the lower side, and (b) on the lower side is a partial plan view. In FIG. 37G, (a) on the upper side is a partial perspective view, and (b) on the lower side is a partial plan view. FIG. 37H and FIG. 37I are partial perspective views. In FIG. 37J and FIG. 37K, (a) on the upper side is a partial perspective view, (b) in the middle is a partial plan view, and (c) on the lower side is a partial cross-sectional view. In FIG. 37J, (c) is a cross-sectional view taken along line C-C in (b). Note that three-dimensional structures are not precisely illustrated in the perspective views in FIG. 37G to FIG. 37K.

In the method for manufacturing nitride semiconductor light-emitting element 1 according to the present embodiment, first, semiconductor layer stacked substrate 2 in which semiconductor layer stacked body 200A including a plurality of waveguides 201 is formed is fabricated as illustrated in FIG. 37A to FIG. 37F. Subsequently, as illustrated in FIG. 37G to FIG. 37K, semiconductor layer stacked substrate 2 is split along two split lines that are crosswise split lines XL and lengthwise split lines YL into plural pieces, and thus nitride semiconductor light-emitting element 1 is obtained. Specific processes will be described in detail below.

Figure 37A:
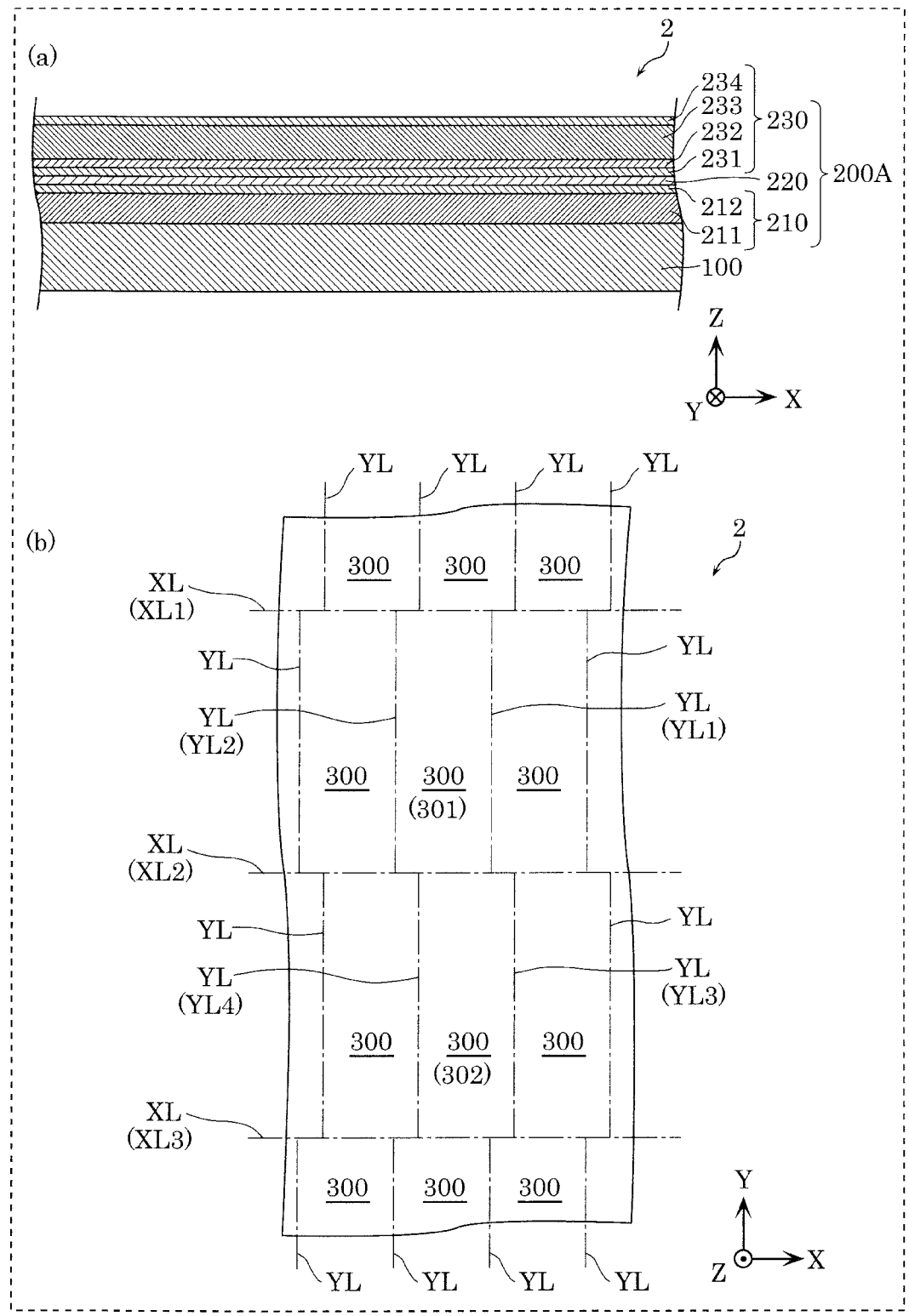
FIG. 37A is a diagram illustrating the process of forming a semiconductor layer stacked body on a substrate in a method for manufacturing a nitride semiconductor light-emitting element according to Embodiment 2.

First, as illustrated in (a) in FIG. 37A, semiconductor layer stacked substrate 2 is fabricated by forming semiconductor layer stacked body 200A on substrate 100. For example, semiconductor layer stacked body 200A is formed on one entire surface of substrate 100 by epitaxial growth of a semiconductor layer including a plurality of nitride semiconductors.

Specifically, a hexagonal crystal, n-type GaN substrate is prepared as substrate 100, and first nitride semiconductor layer 210 is formed by causing n-type clad layer 211 made from Ge-doped n-type AlGaN and n-side guide layer 212 made from n-type GaN to grow on substrate 100.

Subsequently, for example, a quantum well active layer in which a well layer made from undoped InGaN and a barrier layer made from undoped InGaN are alternately stacked once or more than once is formed on first nitride semiconductor layer 210 (in the present embodiment, on n-side guide layer 212) as active layer 220.

Thereafter, p-side guide layer 231 made from InGaN, p-type electron barrier layer 232, p-type clad layer 233 made from Mg-doped p-type AlGaN, and p-type contact layer 234 made from p-type GaN are sequentially formed on active layer 220.

At this time, as illustrated in (b) in FIG. 37A, semiconductor layer stacked substrate 2 includes a plurality of element forming regions 300 corresponding to respective individual elements each eventually obtained as nitride semiconductor light-emitting element 1.

The plurality of element forming regions 300 are partitioned by the plurality of crosswise split lines XL and the plurality of lengthwise split lines YL. Specifically, each of the plurality of element forming regions 300 is enclosed by two crosswise split lines XL adjacent to each other along the Y-axis and two lengthwise split lines YL adjacent to each other along the X-axis.

Each of the plurality of crosswise split lines XL is a first-direction split line parallel to the X-axis direction (first direction) in the plane of substrate 100. In contrast, each of the plurality of lengthwise split lines YL is a second-direction split line parallel to the Y-axis direction (second direction) in the plane of substrate 100. The plurality of crosswise split lines XL and the plurality of lengthwise split lines YL are used to split semiconductor layer stacked substrate 2. In other words, semiconductor layer stacked substrate 2 is cut along the plurality of crosswise split lines XL and the plurality of lengthwise split lines YL. Thus, each of the plurality of element forming regions 300 turns into an individual element.

Furthermore, in the present embodiment, the plurality of element forming region 300 are displaced along the X-axis on a per row basis. Specifically, the plurality of element forming regions 300 are misaligned along the X-axis at each row, on the different side between an even row and an odd row. This means that the plurality of lengthwise splints lines YL are displaced along the X-axis on each row of the plurality of element forming regions 300.

Specifically, the plurality of lengthwise split lines YL for the plurality of element forming regions 300 on the first row and the plurality of lengthwise splint lines YL for the plurality of element forming regions 300 on the second row are misaligned along the X-axis. Furthermore, the plurality of lengthwise split lines YL for the plurality of element forming regions 300 on the first row and the plurality of lengthwise splint lines YL for the plurality of element forming regions 300 on the third row match one another. This means that lengthwise split lines YL are misaligned along the X-axis at each row, on the different side between an even row and an odd row. Furthermore, the lengthwise splint lines YL on the even rows are not misaligned along the X-axis and match one another, and the lengthwise split lines YL on the odd rows are not misaligned along the X-axis and match one another.

As an example, as illustrated in (b) in FIG. 37A, the plurality of crosswise split lines XL include first crosswise split line XL1, second crosswise split line XL2, and third crosswise split line XL3, and the plurality of lengthwise split lines YL include first lengthwise split lines YL1, second lengthwise split lines YL2, third lengthwise split lines YL3, and fourth lengthwise split lines YL4.

The plurality of element forming regions 300 include first element forming region 301 and second element forming region 302 which are adjacent to each other along the Y-axis. First element forming region 301 is a rectangular region with four sides enclosed by four split lines that are first crosswise split line XL1, second crosswise split line XL2, first lengthwise split line YL1, and second lengthwise split line YL2. Second element forming region 302 is a rectangular region with four sides enclosed by four split lines that are second crosswise split line XL2, third crosswise split line XL3, third lengthwise split line YL3, and fourth lengthwise split line YL4.

Two lengthwise split lines YL (first lengthwise split line YL1 and second lengthwise split line YL2) sandwiching first element forming region 301 and two lengthwise split lines (third lengthwise split line YL3 and fourth lengthwise split line YL4) sandwiching second element forming region 302 are misaligned along the X-axis.

Figure 37B:
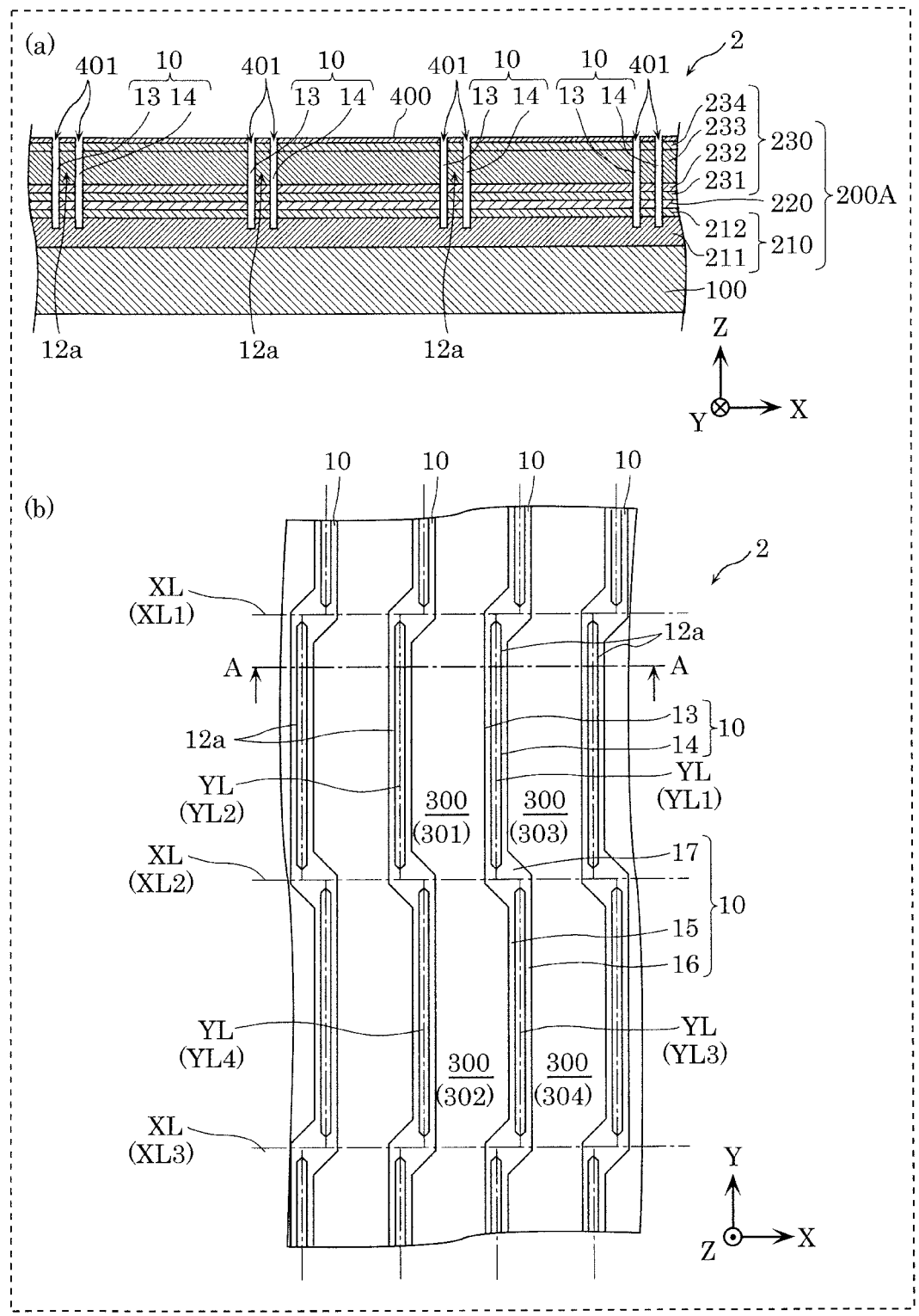
FIG. 37B is a diagram illustrating the process of forming a guide trench (a third trench and a fourth trench) in a method for manufacturing a nitride semiconductor light-emitting element according to Embodiment 2.

Next, after semiconductor layer stacked body 200A is formed, guide trench 10 is formed along lengthwise split line YL in semiconductor layer stacked substrate 2 with semiconductor layer stacked body 200A formed therein, as illustrated in (a) and (b) in FIG. 37B. Guide trench 10 is used to form split trench forming region 12a for forming second trench 12. In the present embodiment, since lengthwise split line YL is misaligned along the X-axis at each row, guide trench 10 also is misaligned along the X-axis at each row.

Guide trench 10 can be formed by the following method. Specifically, as illustrated in (a) in FIG. 37B, mask 400 made of a SiO$_2$ film and a first resist film (not illustrated in the drawings) are sequentially formed on p-type contact layer 234 using a vacuum deposition method and an etching technique, and an opening is formed in the first resist film using a photolithography technique. This opening of the first resist film is formed in a portion corresponding to each of third trench 13 and fourth trench 14.

Subsequently, first opening 401 is formed in mask 400 by etching, using an etching technique, a portion of mask 400 that corresponds to the opening of the first resist film, and then the remaining first resist film is removed.

Subsequently, guide trench 10 is formed by etching, using a dry-etching technique such as reactive ion etching (RIE), semiconductor layer stacked body 200A in a portion that is located on and below p-type contact layer 234 and corresponds to first opening 401 of mask 400.

At this time, guide trench 10 is formed by digging in semiconductor layer stacked body 200A toward substrate 100 by means of etching and removing active layer 220 and second nitride semiconductor layer 230 until the bottom surface of guide trench 10 reaches first nitride semiconductor layer 210. The bottom (depth) of guide trench 10 reaches at least first nitride semiconductor layer 210 and may reach substrate 100. Specifically, first nitride semiconductor layer 210 or substrate 100 is exposed at the bottom of guide trench 10. In the present embodiment, the bottom of guide trench 10 reaches n-type clad layer 211.

Thus, guide trench 10 in the present embodiment is an etched trench formed by etching. As illustrated in (b) in FIG. 37B, guide trench 10 is formed in two element forming regions 300 adjacent to each other along the X-axis with lengthwise split line YL therebetween.

Specifically, guide trench 10 includes third trench 13 and fourth trench 14 which extend along the Y-axis with first lengthwise split line YL1 therebetween. Third trench 13 is formed in first element forming region 301, and fourth trench 14 is formed in third element forming region 303 adjacent to first element forming region 301 along the X-axis.

Guide trench 10 includes fifth trench 15 and sixth trench 16 which extend along the Y-axis with third lengthwise split line YL3 therebetween. Fifth trench 15 is formed in second element forming region 302, and sixth trench 16 is formed in fourth element forming region 304 adjacent to second element forming region 302 along the X-axis.

Furthermore, guide trench 10 includes seventh trench 17. Seventh trench 17 is formed near the intersection between crosswise split line XL and lengthwise split line YL. Specifically, seventh trench 17 is formed on second crosswise split line XL2, between the pair of third trench 13 and fourth trench 14 and the pair of fifth trench 15 and sixth trench 16. In other words, seventh trench 17 is a connecting trench that connects the pair of third trench 13 and fourth trench 14 to the pair of fifth trench 15 and sixth trench 16; third trench 13, fourth trench 14, fifth trench 15, sixth trench 16, and seventh trench 17 are connected to one another. Note that seventh trench 17 corresponds to first recess 21 and second recess 22 in FIG. 32.

Seventh trench 17 includes, between fourth trench 14 and third trench 13 in first element forming region 301, a portion having the minimum width measured from second crosswise split line XL2 along the Y-axis. Furthermore, seventh trench 17 includes, between sixth trench 16 and fifth trench 15 in second element forming region 302, a portion having the minimum width measured from second crosswise split line XL2 along the Y-axis.

Third trench 13, fourth trench 14, fifth trench 15, sixth trench 16, and seventh trench 17 reach at least first nitride semiconductor layer 210. In the present embodiment, third trench 13, fourth trench 14, fifth trench 15, sixth trench 16, and seventh trench 17 are formed at the same time as guide trench 10, and thus the bottom surfaces thereof are flush.

Furthermore, forming guide trench 10 results in forming split trench forming region 12a. For example, split trench forming region 12a formed between first element forming region 301 and third element forming region 303 is an island-shaped region surrounded by third trench 13, fourth trench 14, and upper and lower seventh trenches 17. Split trench forming region 12a formed between second element forming region 302 and fourth element forming region 304 is an island-shaped region surrounded by fifth trench 15, sixth trench 16, and upper and lower seventh trenches 17.

Figure 37C:
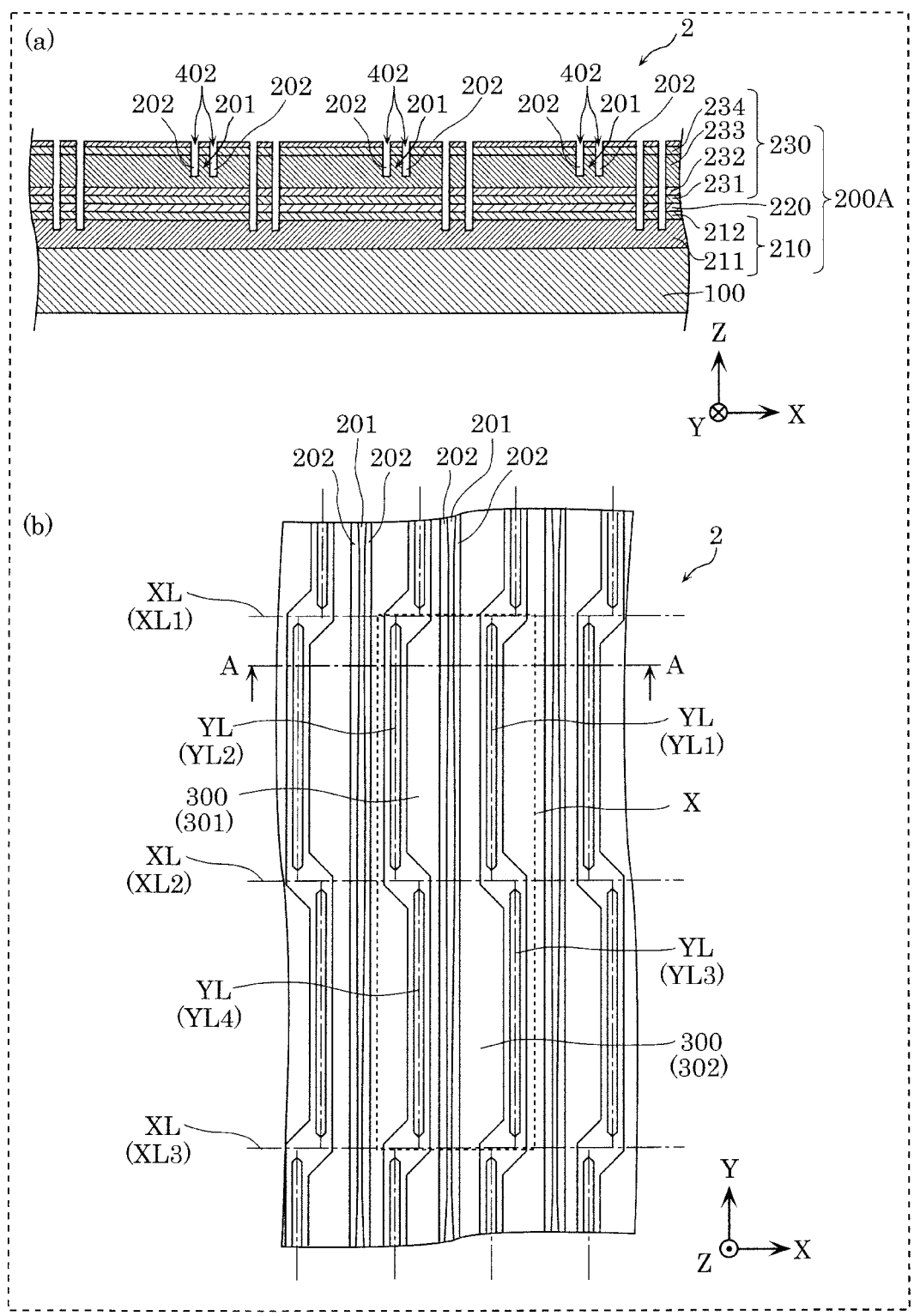
FIG. 37C is a diagram illustrating the process of forming a waveguide in a method for manufacturing a nitride semiconductor light-emitting element according to Embodiment 2.

Next, after guide trench 10 is formed, a plurality of waveguides 201 in the form of ridge stripes extending along the Y-axis are formed in semiconductor layer stacked body 200A of semiconductor layer stacked substrate 2, as illustrated in (a) and (b) in FIG. 37C. The plurality of waveguides 201 are formed at regular intervals along the X-axis.

Furthermore, in the present embodiment, the plurality of element forming regions 300 and the plurality of lengthwise split lines YL are each displaced along the X-axis on a per row basis, but waveguides 201 are not displaced on each row of the plurality of element forming regions 300 and the plurality of lengthwise split lines YL. Specifically, waveguide 201 in each element forming region 300 corresponding to the individual element (nitride semiconductor light-emitting element 1) is located offset along the X-axis, but in semiconductor layer stacked substrate 2 as a whole, waveguide 201 is linearly formed through the plurality of element forming regions 300 arranged along the Y-axis. Stated differently, the width between first lengthwise split line YL1 and the waveguide in first element forming region 301 is equal to the width between fourth lengthwise split line YL4 and the waveguide in second element forming region 302.

Furthermore, in each element forming region 300, waveguide 201 has different widths at one end portion and the other end portion. Specifically, waveguide 201 in each element forming region 300 includes, as a tapered structure, a width changing portion (tapered portion) having a width gradually changing in a tapered form.

In order to manufacture, in quantity, nitride semiconductor light-emitting elements 1 each including waveguide 201 having such a tapered structure, the widths of waveguides 201 are made different in adjacent positions, but the same in alternate positions, on crosswise split line XL. In other words, in the positions on crosswise split line XL, the widths of waveguides 201 in two element forming regions 300 adjacent to each other along the Y-axis match each other.

Waveguide 201 having such a shape can be formed by the following method. Specifically, as illustrated in (a) in FIG. 37C, a second resist film (not illustrated in the drawings) is formed on mask 400, and using a photolithography technique, openings in the form of stripes are formed in the second resist film. These openings of the second resist film are formed in portions corresponding to openings 202 between which waveguide 201 is located.

Subsequently, second opening 402 is formed in mask 400 by etching, using an etching technique, a portion of mask 400 that corresponds to the opening of the second resist film, and then the remaining second resist film is removed.

Subsequently, two openings 202 are formed by etching, using a dry-etching technique such as RIE, semiconductor layer stacked body 200A in portions that are located on and below p-type contact layer 234 and correspond to second openings 402 of mask 400.

At this time, two openings 202 are formed by digging in semiconductor layer stacked body 200A toward substrate 100 until the bottom of each of two openings 202 reaches p-type clad layer 233. Specifically, p-type contact layer 234 is etched, and p-type clad layer 233 is etched from the upper surface to a portion thereof having a predetermined depth.

Thus, it is possible to form the plurality of waveguides 201 in the form of ridge stripes which have the tapered structure in each element forming region 300 and pass through the plurality of element forming regions 300 arranged along the Y-axis, as illustrated in (b) in FIG. 37C.

Figure 38:
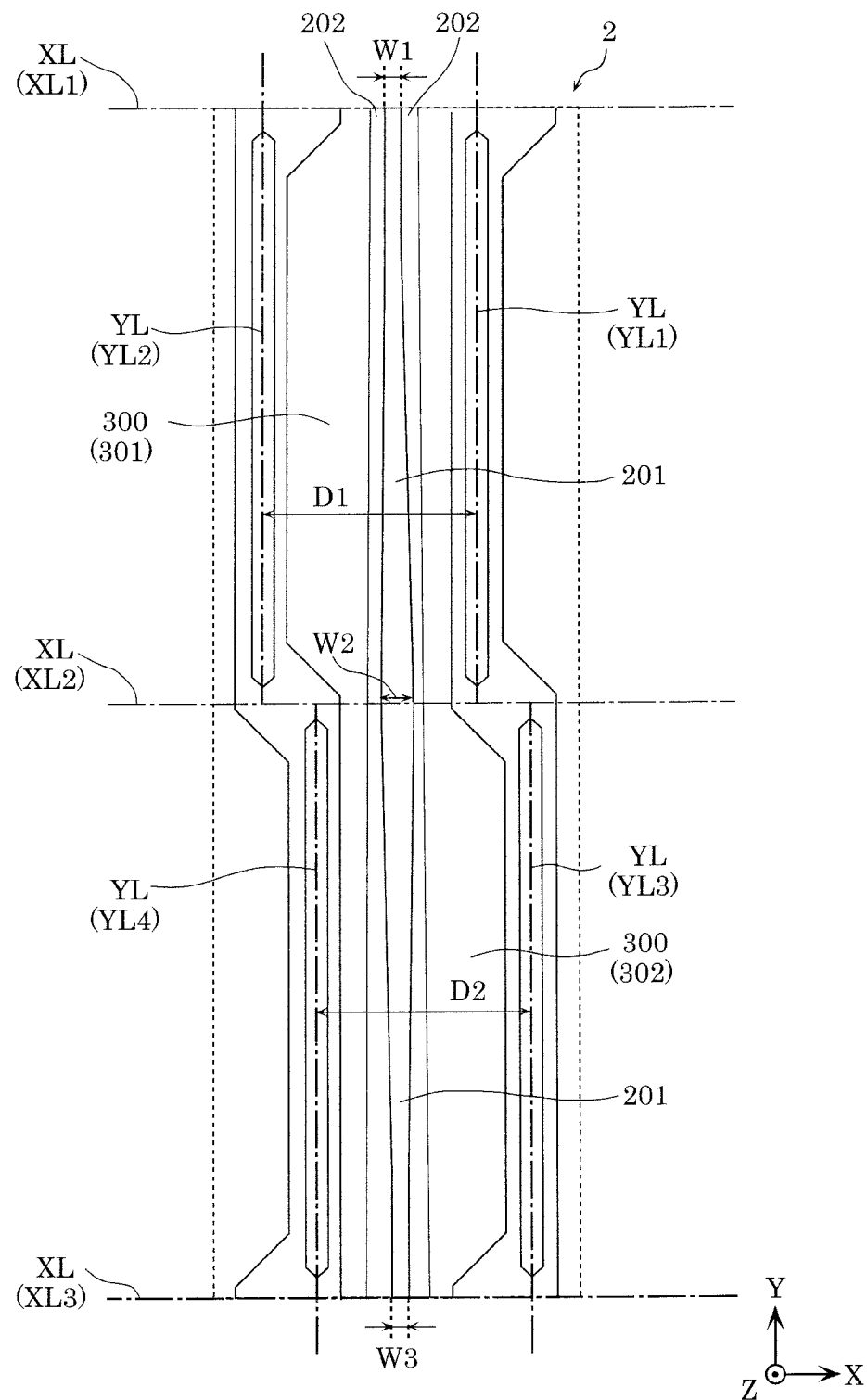
FIG. 38 is an enlarged view of region X enclosed by the dashed line in (b) in FIG. 37C.

Specifically, regarding waveguide 201 in semiconductor layer stacked substrate 2, when the first width of waveguide 201 along the X-axis on first crosswise split line XL1 is denoted as W1, the second width of waveguide 201 along the X-axis on second crosswise split line XL2 is denoted as W2, and the third width of waveguide 201 along the X-axis on third crosswise split line XL3 is denoted as W3, as illustrated in FIG. 38, W1=W3 and W1≠W2 are satisfied, and specifically, W2>W1 is satisfied. FIG. 38 is an enlarged view of region X enclosed by the dashed line in (b) in FIG. 37C.

In the present embodiment, in each of first element forming region 301 and second element forming region 302, waveguide 201 includes a width changing portion having a width continuously changing from W1 to W2.

Furthermore, when the distance between first lengthwise split line YL1 and second lengthwise split line YL2 is denoted as D1 and the distance between third lengthwise split line YL3 and fourth lengthwise split line YL4 is denoted as D2, D1=D2 is satisfied. In other words, the width of first element forming region 301 and the width of second element forming region 302 are the same. In the present embodiment, all the widths of the plurality of element forming regions 300 are the same.

Furthermore, in semiconductor layer stacked substrate 2, waveguide 201 in first element forming region 301 is located closer to first lengthwise split line YL1 than to second lengthwise split line YL2. Waveguide 201 in second element forming region 302 is located closer to fourth lengthwise split line YL4 than to third lengthwise split line YL3.

Figure 37D:
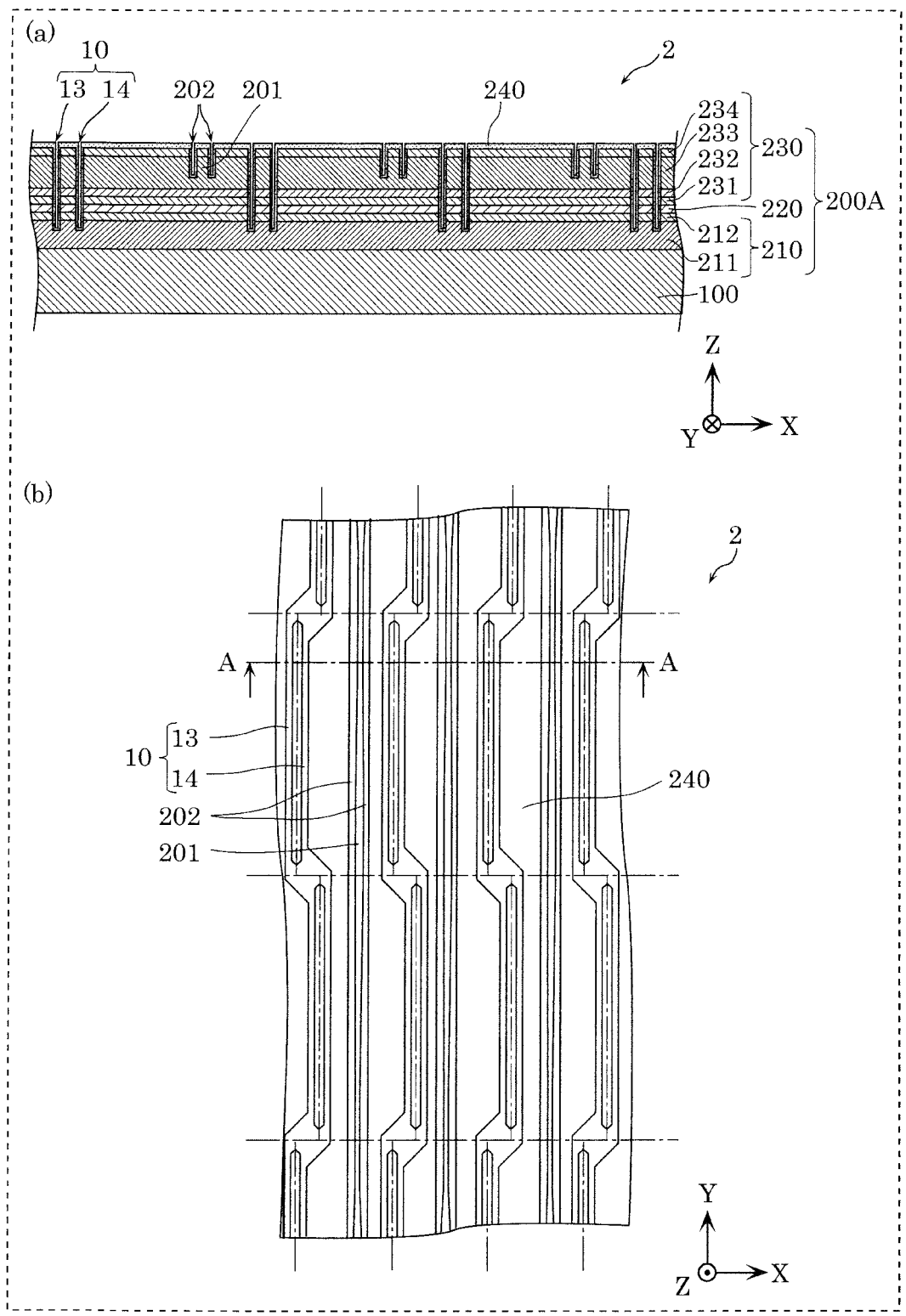
FIG. 37D is a diagram illustrating the process of forming an electric current blocking layer in a method for manufacturing a nitride semiconductor light-emitting element according to Embodiment 2.

Next, after waveguide 201 is formed, mask 400 is removed, and electric current blocking layer 240 is formed to cover semiconductor layer stacked body 200A, as illustrated in (a) and (b) in FIG. 37D.

Specifically, electric current blocking layer 240 including a $SiO_2$ film having a thickness of approximately 300 nm is formed on semiconductor layer stacked body 200A across the entire upper surface of substrate 100 using the plasma chemical vapor deposition (CVD) method. With this, the upper surface of p-type contact layer 234 is covered by electric current blocking layer 240, and the inner surfaces of guide trench 10 (third trench 13 and fourth trench 14) and opening 202 are covered by electric current blocking layer 240.

Figure 37E:
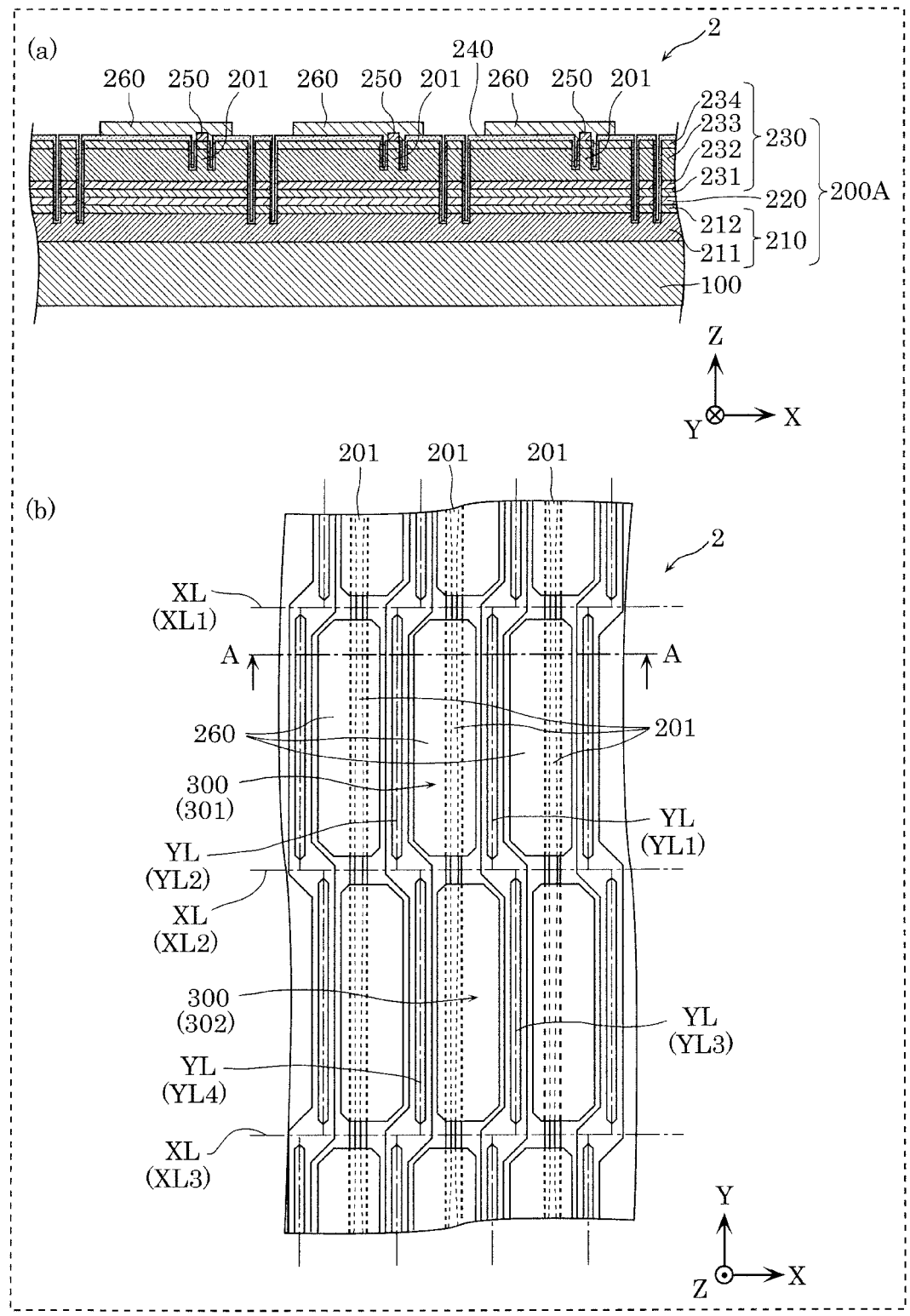
FIG. 37E is a diagram illustrating the process of forming a p-side ohmic electrode and a p-side electrode in a method for manufacturing a nitride semiconductor light-emitting element according to Embodiment 2.

Next, as illustrated in (a) and (b) in FIG. 37E, p-side ohmic electrode 250 and p-side electrode 260 corresponding to each of the plurality of element forming regions 300 are formed above semiconductor layer stacked body 200A.

Specifically, using an etching technique in which a third resist film (not illustrated in the drawings) is used as a mask, electric current blocking layer 240 above waveguides 201 in the form of ridge stripes is etched to form openings in the form of stripes in electric current blocking layer 240. Thereafter, using a vacuum deposition method and an etching technique, a Pt film and a Pd film are sequentially stacked on p-type contact layer 234 at each of waveguides 201 in the form of ridge stripes to form p-side ohmic electrode 250.

Subsequently, using a vacuum deposition method and a lift-off method, a Ti film and a Au film are sequentially stacked to cover the openings of electric current blocking layer 240, and thus p-side electrode 260 is formed. At this time, p-side electrode 260 is formed in a predetermined region on electric current blocking layer 240 in such a manner as to contact p-side ohmic electrode 250 and has a width greater than the width of p-side ohmic electrode 250.

In the present embodiment, waveguide 201 is offset along the X-axis in each element forming region 300. Therefore, in each element forming region 300, waveguide 201 is offset along the X-axis also with respect to p-side electrode 260.

Specifically, in first element forming region 301, the width between waveguide 201 and an end portion of p-side electrode 260 that is closest to second lengthwise split line YL2 is greater than the width between waveguide 201 and an end portion of p-side electrode 260 that is closest to first lengthwise split line YL1. In second element forming region 302, the width between waveguide 201 and an end portion of p-side electrode 260 that is closest to third lengthwise split line YL3 is greater than the width between waveguide 201 and a portion of p-side electrode 260 that is closest to fourth lengthwise split line YL4. The shape of p-side electrode 260 in plan view is asymmetric for the first direction in FIG. 32 and FIG. 37E, but this is not limiting; the shape of p-side electrode 260 may be symmetric for the first direction. Furthermore, the shape of p-side electrode 260 in plan view is symmetric for the second direction in FIG. 32 and FIG. 37E, but this is not limiting; the shape of p-side electrode 260 in plan view may be asymmetric for the second direction.

Furthermore, the distance between p-side electrodes 260 adjacent to each other across split line XL as an axis is desirably set to 10 μm to 140 μm. For example, when the distance between p-side electrode 260 in first element forming region 301 and p-side electrode 260 in second element forming region 302 in the second direction is 10 μm, the distance between second crosswise split line XL2 and each of p-side electrode 260 in first element forming region 301 and p-side electrode 260 in second element forming region 302 is 5 μm. When the distance between p-side electrode 260 in first element forming region 301 and p-side electrode 260 in second element forming region 302 is less than 10 μm, the cleavage surface may overlap p-side electrode 260 due to variations in the position in which first trench 11 is formed, variations in the cleavage position, and the like. On the other hand, when the distance between p-side electrode 260 in first element forming region 301 and p-side electrode 260 in second element forming region 302 is greater than 140 μm, the area of electric current injection is reduced, leading to deterioration of the properties of nitride semiconductor light-emitting element 1.

After p-side ohmic electrode 250 and p-side electrode 260 are formed, a surface of substrate 100 (back surface of substrate 100) opposite to a surface thereof on the p-side electrode 260 side is polished.

Figure 37F:
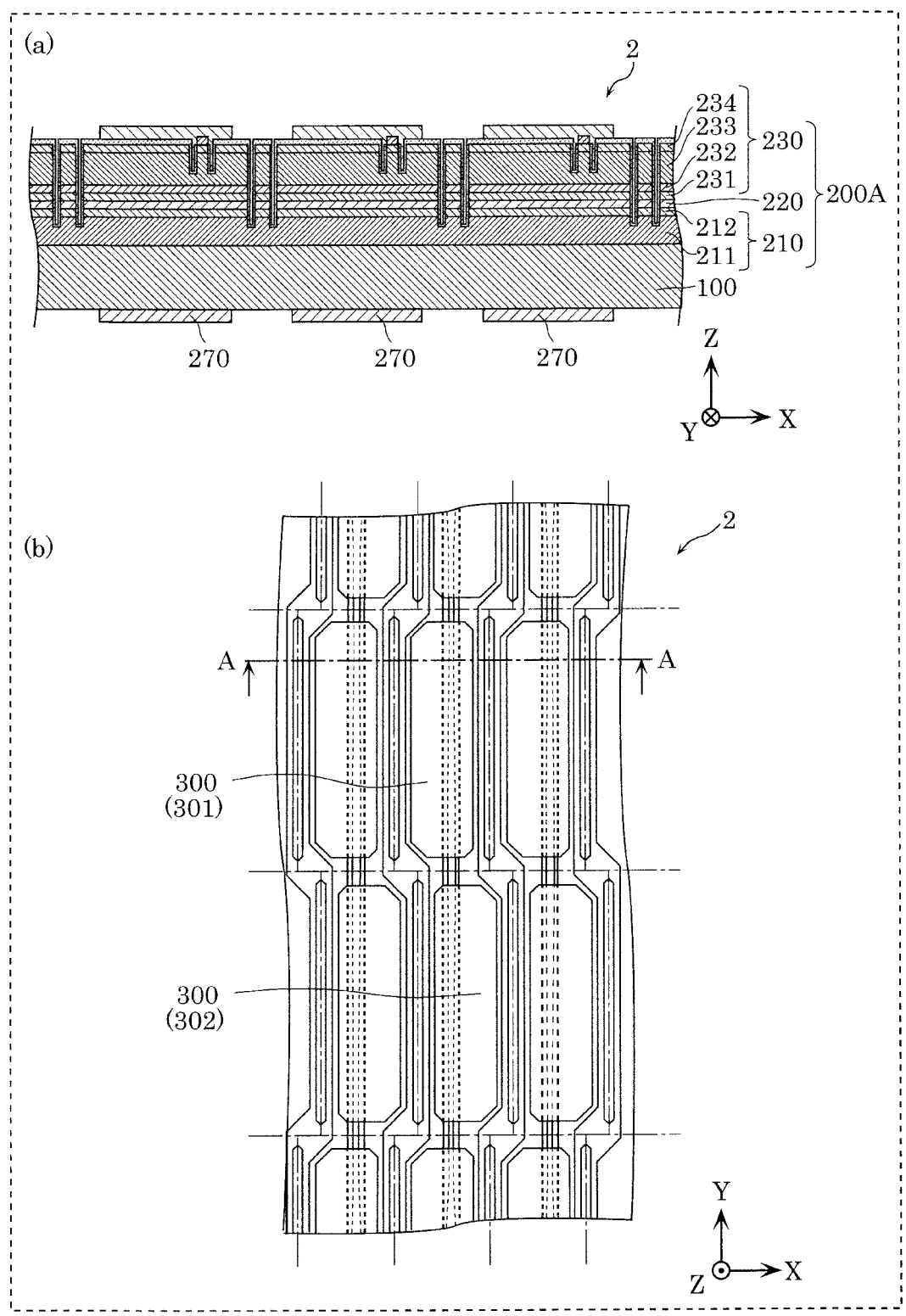
FIG. 37F is a diagram illustrating the process of forming an n-side electrode in a method for manufacturing a nitride semiconductor light-emitting element according to Embodiment 2.
Figure 37G:
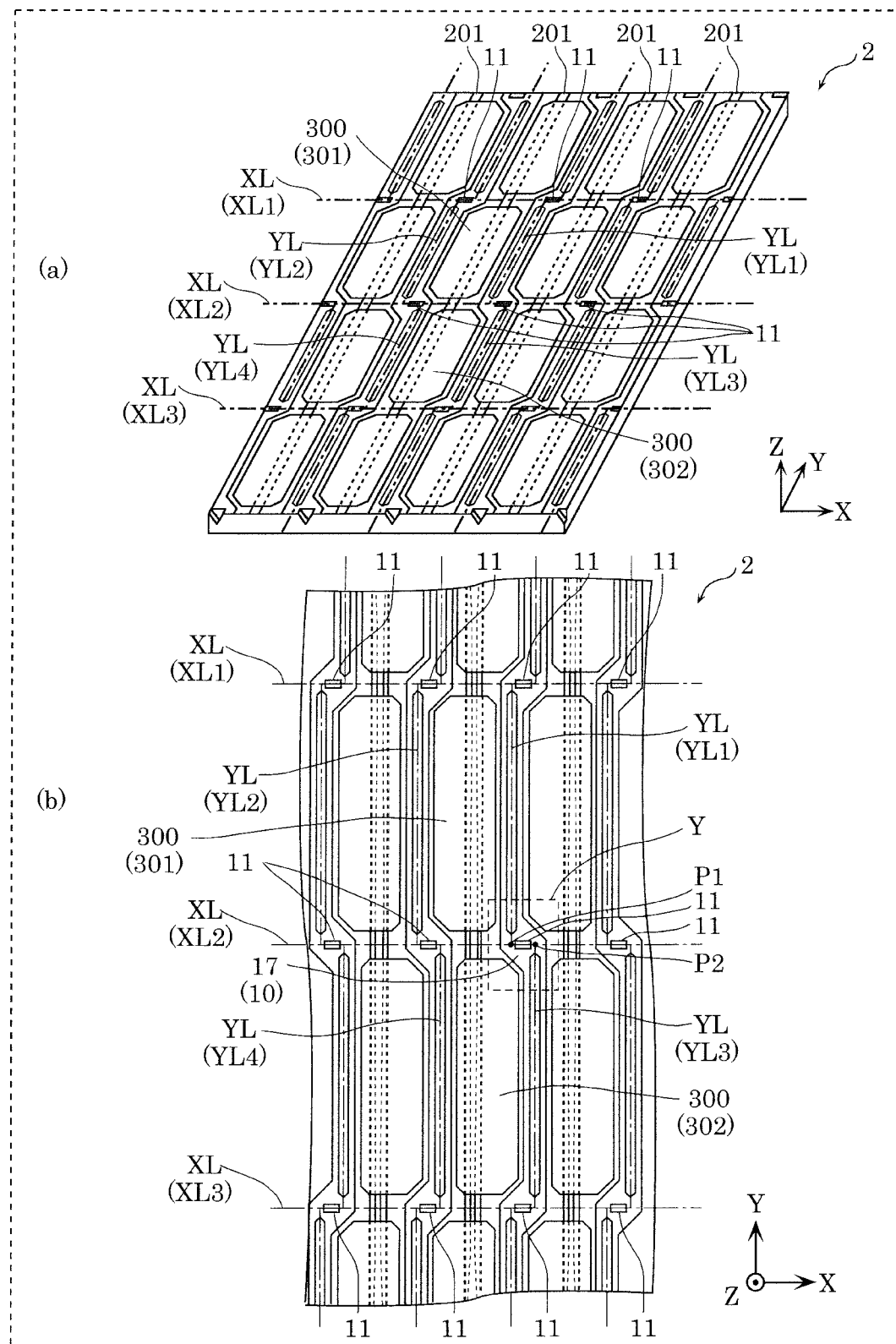
FIG. 37G is a diagram illustrating the process of forming a first trench in a method for manufacturing a nitride semiconductor light-emitting element according to Embodiment 2.
Figure 37H:
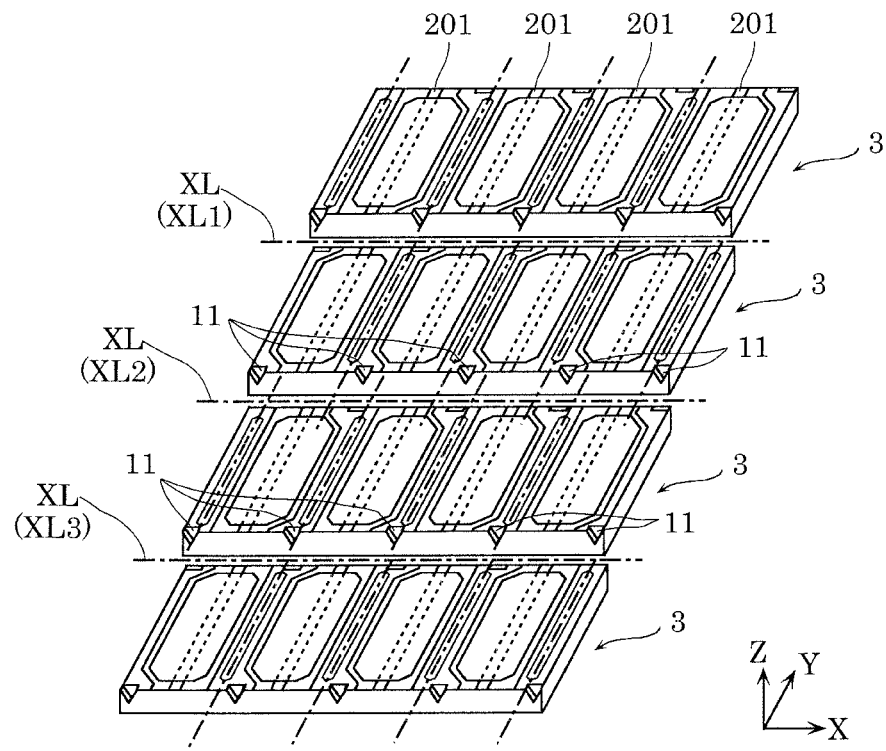
FIG. 37H is a diagram illustrating the process of cleaving a semiconductor layer stacked substrate in a method for manufacturing a nitride semiconductor light-emitting element according to Embodiment 2.
Figure 37I:
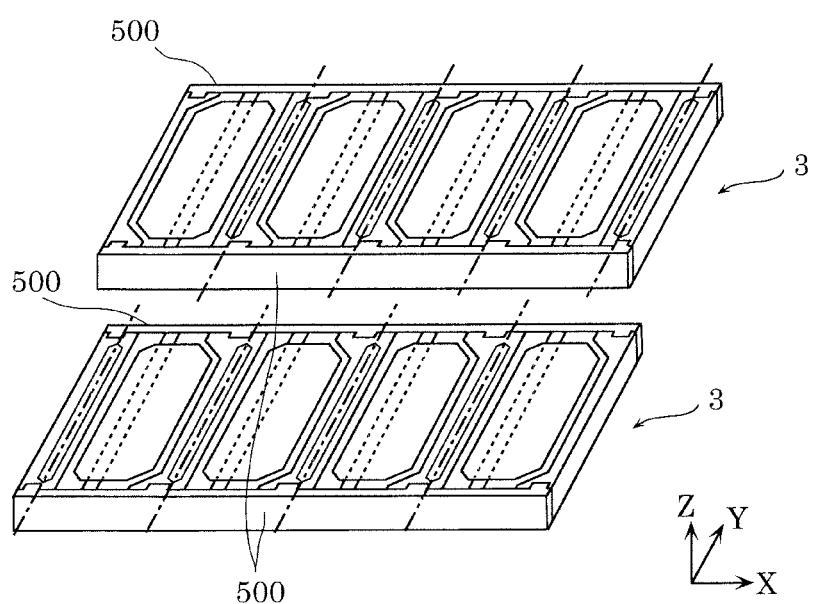
FIG. 37I is a diagram illustrating the process of forming an end surface coating film on a bar-shaped substrate in a method for manufacturing a nitride semiconductor light-emitting element according to Embodiment 2.
Figure 37J:
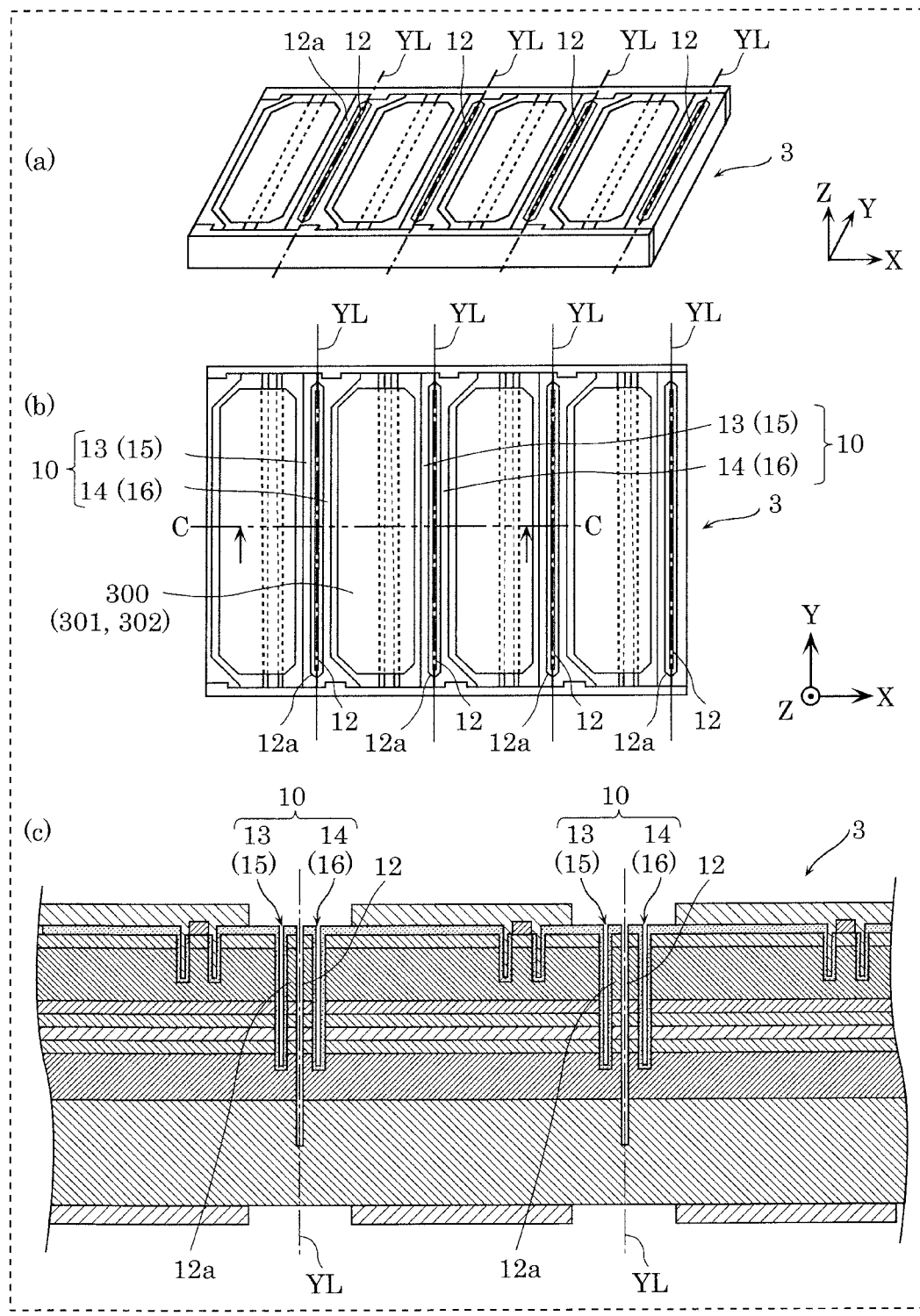
FIG. 37J is a diagram illustrating the process of forming a second trench in a method for manufacturing a nitride semiconductor light-emitting element according to Embodiment 2.
Figure 37K:
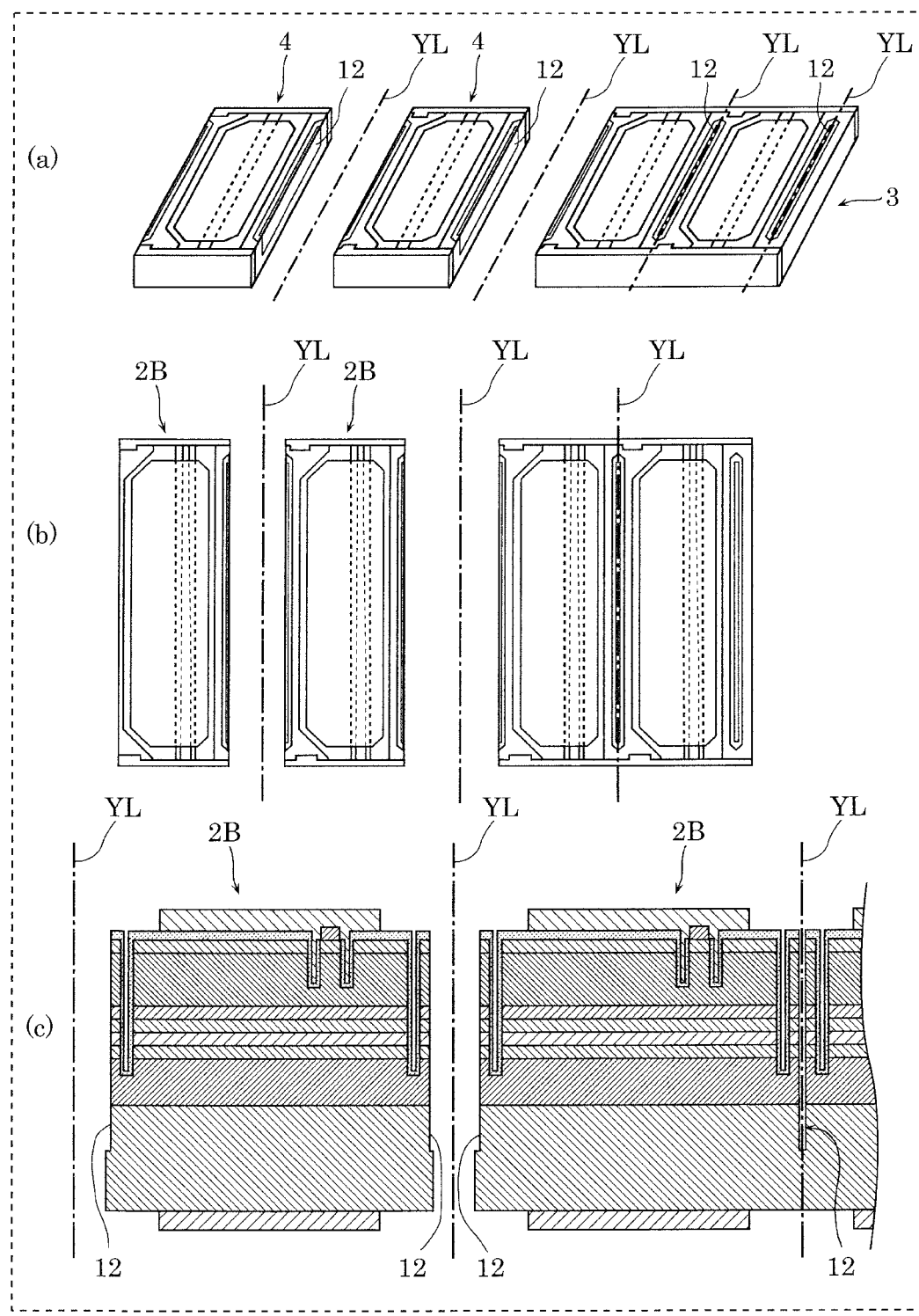
FIG. 37K is a diagram illustrating the process of splitting a bar-shaped substrate in a method for manufacturing a nitride semiconductor light-emitting element according to Embodiment 2.

Next, as illustrated in (a) and (b) in FIG. 37F, n-side electrode 270 patterned into a predetermined shape is formed on the back surface of substrate 100.

Specifically, using a vacuum deposition method and a lift-off method, a Ti film, a Pt film, and a Au film are stacked on the polished surface of substrate 100 in a sequence from the back surface of substrate 100, and thus n-side electrode 270 having the predetermined shape is formed.

In the above manner, it is possible to fabricate semiconductor layer stacked substrate 2 in which semiconductor layer stacked body 200A including a plurality of waveguides 201 extending along the Y-axis is formed on substrate 100.

Next, with reference to FIG. 37G to FIG. 37K, a method for obtaining individual nitride semiconductor light-emitting elements 1 by splitting semiconductor layer stacked substrate 2.

After the process in FIG. 37F, as illustrated in (a) and (b) in FIG. 37G, first trench 11 is formed along the plurality of crosswise split lines XL. First trench 11 is a split trench for cleavage which serves as a starting point of cleavage at the time of cleaving and splitting semiconductor layer stacked substrate 2. In the present embodiment, first trench 11 is a laser-scribe trench formed by the laser scribe method.

In the present embodiment, first trench 11 is formed in the vicinity of each intersection between crosswise split line XL and lengthwise split line YL in the plane of substrate 100. Each of first trenches 11 is elongated along the X-axis. In other words, first trenches 11 are formed into the shape of broken lines along the plurality of crosswise split lines XL. First trenches 11 in the shape of broken lines can be formed, for example, by laser light intermittently emitted to semiconductor layer stacked substrate 2 as the laser light is moved relative thereto.

Figure 39:
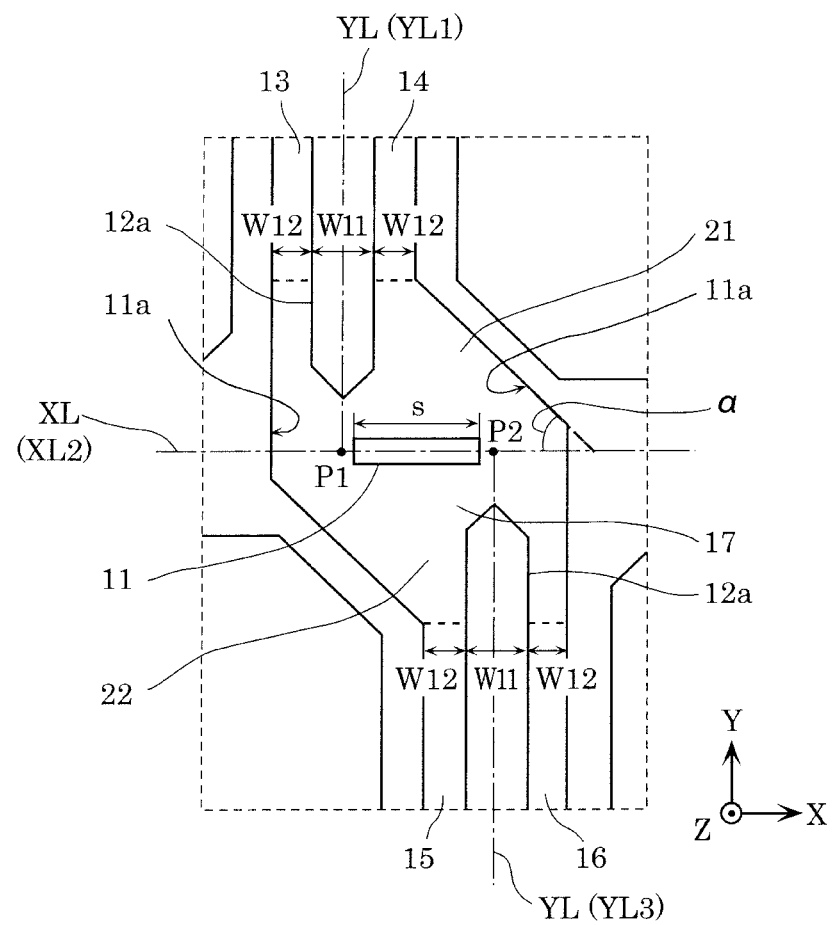
FIG. 39 is an enlarged view of region Y enclosed by the dashed line in (b) in FIG. 37G.

Specifically, first trench 11 is formed in guide trench 10, between two intersections between one crosswise split line XL and two lengthwise split lines YL adjacent to each other along the Y-axis. FIG. 39 is an enlarged view of region Y enclosed by the dashed line in (b) in FIG. 37G. As illustrated in FIG. 39, for example, first trench 11 is formed along second crosswise split line XL2, between first intersection P1, which is the intersection between second crosswise split line XL2 and first lengthwise split line YL1, and second intersection P2, which is the intersection between second crosswise split line XL2 and third lengthwise split line YL3.

Figure 40:
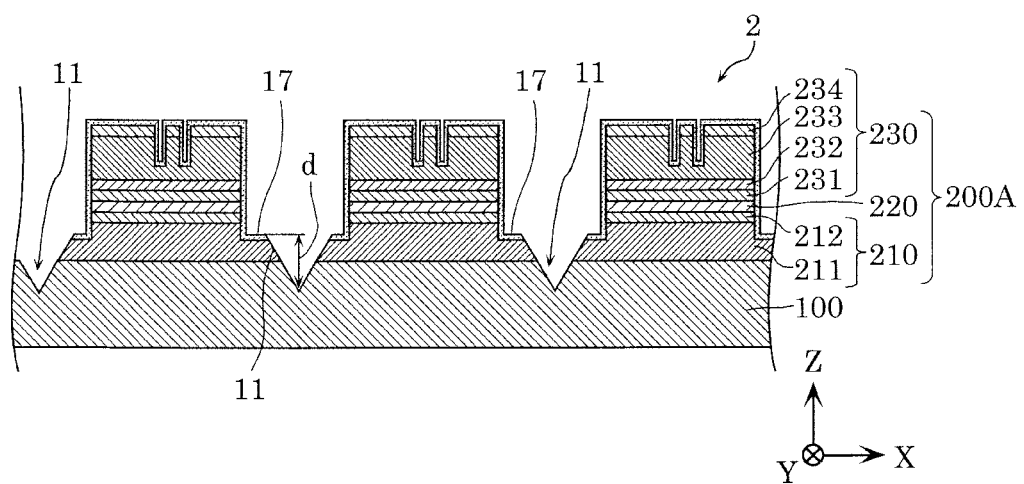
FIG. 40 is a cross-sectional view taken along second crosswise split line XL2 in (b) in FIG. 37G.

FIG. 40 is a cross-sectional view taken along second crosswise split line XL2 in (b) in FIG. 37G. As illustrated in FIG. 40, first trench 11 is formed in seventh trench 17 included in guide trench 10. In other words, first trench 11 is dug downward from the bottom surface of seventh trench 17. Therefore, the bottom of first trench 11 is located deeper than the bottom of seventh trench 17.

Next, as illustrated in FIG. 37H, semiconductor layer stacked substrate 2 is sequentially split along the plurality of crosswise split lines XL, resulting in the plurality of waveguides 201 being cut, and thus a plurality of bar-shaped substrates 3 are fabricated. In the present embodiment, using first trench 11, semiconductor layer stacked substrate 2 is cleaved (primary cleavage); thus, single semiconductor layer stacked substrate 2 is split into the plurality of bar-shaped substrates 3.

Specifically, load is applied to semiconductor layer stacked substrate 2 by causing a blade-shaped tool extending along the X-axis to contact semiconductor layer stacked substrate 2 with first trench 11 from the n-side electrode 270 side along first trench 11. With this, semiconductor layer stacked substrate 2 is split along the longitudinal length of first trench 11. In other words, semiconductor layer stacked substrate 2 is split along crosswise split line XL.

At this time, semiconductor layer stacked substrate 2 is split at each line of the plurality of first trenches 11 formed in the shape of broken lines along the X-axis. Thus, the plurality of bar-shaped substrates 3 are obtained from single semiconductor layer stacked substrate 2.

Note that in the present embodiment, the plurality of lengthwise split lines YL are misaligned along the X-axis at each row, on the different side between an even row and an odd row. Therefore, the positions of lengthwise split lines YL of two bar-shaped substrates 3 adjacent to each other along the Y-axis among the plurality of bar-shaped substrates 3 obtained by splitting semiconductor layer stacked substrate 2 are misaligned from one another along the X-axis.

Next, as illustrated in FIG. 37I, end surface coating film 500 is formed on the cleavage surface of bar-shaped substrate 3 obtained as a result of cleavage. Specifically, end surface coating film 500 is formed on each of cleavage surfaces of both bar-shaped substrates 3.

End surface coating film 500 includes, for example, an AlON film, which is an adhesion layer that adheres to the cleavage surface, an AlN film, which is an oxygen diffusion prevention layer, and a reflectivity adjustment layer. As an example, end surface coating film 500 having reflectivity of 2% is formed on the cleavage surface that serves as the exit surface (third side surface 1c) of nitride semiconductor light-emitting element 1, and end surface coating film 500 having reflectivity of 95% is formed on the cleavage surface that serves as the reflection surface (fourth side surface 1d) of nitride semiconductor light-emitting element 1.

Next, as illustrated in (a) to (c) in FIG. 37J, second trenches 12 are formed in bar-shaped substrate 3 along the plurality of lengthwise split lines YL. Second trench 12 is a split trench for element splits used to split bar-shaped substrate 3 into a plurality of individual elements. In the present embodiment, second trench 12 is a laser-scribe trench formed by the laser scribe method.

As illustrated in (a) and (b) in FIG. 37J, second trench 12 is formed along the Y-axis between two element forming regions 300 adjacent to each other along the X-axis. In the present embodiment, split trench forming region 12a is formed between two element forming regions 300 adjacent to each other along the X-axis, and second trench 12 is formed in split trench forming region 12a. In other words, second trench 12 is formed between third trench 13 (or fifth trench 15) and fourth trench 14 (sixth trench 16) formed to sandwich split trench forming region 12a.

As illustrated in (c) in FIG. 37J, the depth of second trench 12 is greater than the depth of guide trench 10 (third trench 13 and fourth trench 14). In other words, the bottom of second trench 12 is located deeper than the depth of each of third trench 13 (or fifth trench 15) and fourth trench 14 (or sixth trench 16). In the present embodiment, the bottom of second trench 12 reaches substrate 100.

Next, each of the plurality of bar-shaped substrates 3 is sequentially split along the plurality of lengthwise split lines YL to fabricate individual element 4 corresponding to nitride semiconductor light-emitting element 1, as illustrated in (a) to (c) in FIG. 37K. In the present embodiment, bar-shaped substrate 3 is split using second trench 12; thus, single bar-shaped substrate 3 is split into a plurality of individual elements 4.

Specifically, load is applied to bar-shaped substrate 3 by causing a blade-shaped tool extending along the Y-axis to contact bar-shaped substrate 3 with second trench 12 from the n-side electrode 270 side along second trench 12. With this, bar-shaped substrate 3 is split along the longitudinal length of second trench 12. In other words, bar-shaped substrate 3 is split along lengthwise split line YL.

At this time, bar-shaped substrate 3 is split at each of the plurality of second trenches 12 formed along the Y-axis. Thus, the plurality of individual elements 4 (nitride semiconductor light-emitting elements 1) are obtained from single bar-shaped substrate 3. In this manner, nitride semiconductor light-emitting element 1 having the structure illustrated in FIG. 32 can be manufactured.

In the case of nitride semiconductor light-emitting element 1 obtained in the above manner, no matter which bar-shaped substrate 3, on either an odd row or an even row of semiconductor layer stacked substrate 2, is split, it is possible to obtain a single type of nitride semiconductor light-emitting elements 1 including waveguides 201 offset in the same direction. In the present embodiment, only nitride semiconductor light-emitting elements 1 including waveguides 201 offset in the positive direction along the X-axis are obtained.

As described above, the method for manufacturing nitride semiconductor light-emitting element 1 according to the present embodiment is to manufacture individual nitride semiconductor light-emitting elements 1 by splitting, along the plurality of crosswise split lines XL and the plurality of lengthwise split lines YL, semiconductor layer stacked substrate 2 in which semiconductor layer stacked body 200A including the plurality of waveguides 201 extending along the Y-axis is formed; in this method, in semiconductor layer stacked substrate 2 including first element forming region 301 and second element forming region 302 adjacent to each other along the Y-axis, at least two lengthwise split lines YL sandwiching first element forming region 301 and two lengthwise split lines YL sandwiching second element forming region 302 are misaligned along the X-axis. Specifically, lengthwise split line YL and guide trench 10 formed along lengthwise split line YL are misaligned along the X-axis at each row, on the different side between an even row and an odd row.

With this, it is possible to obtain a single type of nitride semiconductor light-emitting elements 1 including waveguides 201 offset in the same direction, even when using a method for obtaining individual nitride semiconductor light-emitting elements 1 by splitting semiconductor layer stacked substrate 2 in which waveguides 201 are formed through the plurality of element forming regions 300, upon manufacturing nitride semiconductor light-emitting elements 1 in quantity in each of which waveguide 201 has different widths at one end portion and the other end portion and the position of waveguide 201 is offset along the width of the element.

Furthermore, in the present embodiment, in each of first element forming region 301 and second element forming region 302, waveguide 201 includes width changing portion 201b having a width continuously changing from W1 to W2.

With this, it is possible to easily manufacture a single type of nitride semiconductor light-emitting elements 1 in quantity each of which includes offset waveguide 201 having a tapered strip structure effective for the transverse mode control and the temperature characteristics.

Furthermore, the method for manufacturing nitride semiconductor light-emitting element 1 according to the present embodiment includes the process of forming, above semiconductor layer stacked body 200A, p-side electrode 260 corresponding to each of the plurality of element forming regions 300. In first element forming region 301, the width between waveguide 201 and an end portion of p-side electrode 260 that is closest to second lengthwise split line YL2 is greater than the width between waveguide 201 and an end portion of p-side electrode 260 that is closest to first lengthwise split line YL1. In second element forming region 302, the width between waveguide 201 and an end portion of p-side electrode 260 that is closest to third lengthwise split line YL3 is greater than the width between waveguide 201 and an end portion of p-side electrode 260 that is closest to fourth lengthwise split line YL4.

With this, in the case of bonding a wire to nitride semiconductor light-emitting element 1, a large wire connecting region can be provided on p-side electrode 260. Thus, it is possible to avoid a connecting portion (bonding portion) of a wire being located above waveguide 201. In this case, in consideration of the ball diameter of the connecting portion of the wire being 60 μm at a maximum from the perspective of bonding strength, the width of the wire connecting region on p-side electrode 260 may be at least 60 μm and more preferably 69 μm.

Furthermore, the method for manufacturing nitride semiconductor light-emitting element 1 according to the present embodiment includes the process of forming first trench 11 along crosswise split line XL.

With this, semiconductor layer stacked substrate 2 can be primarily cleaved using first trench 11, and thus it is possible to easily split semiconductor layer stacked substrate 2 along a predetermined, scheduled primary cleavage line (crosswise split line XL).

In this case, as illustrated in FIG. 39, first trench 11 is formed along second crosswise split line XL2 between first intersection P1, which is the intersection between second crosswise split line XL2 and first lengthwise split line YL1, and second intersection P2, which is the intersection between second crosswise split line XL2 and third lengthwise split line YL3.

Figure 41:
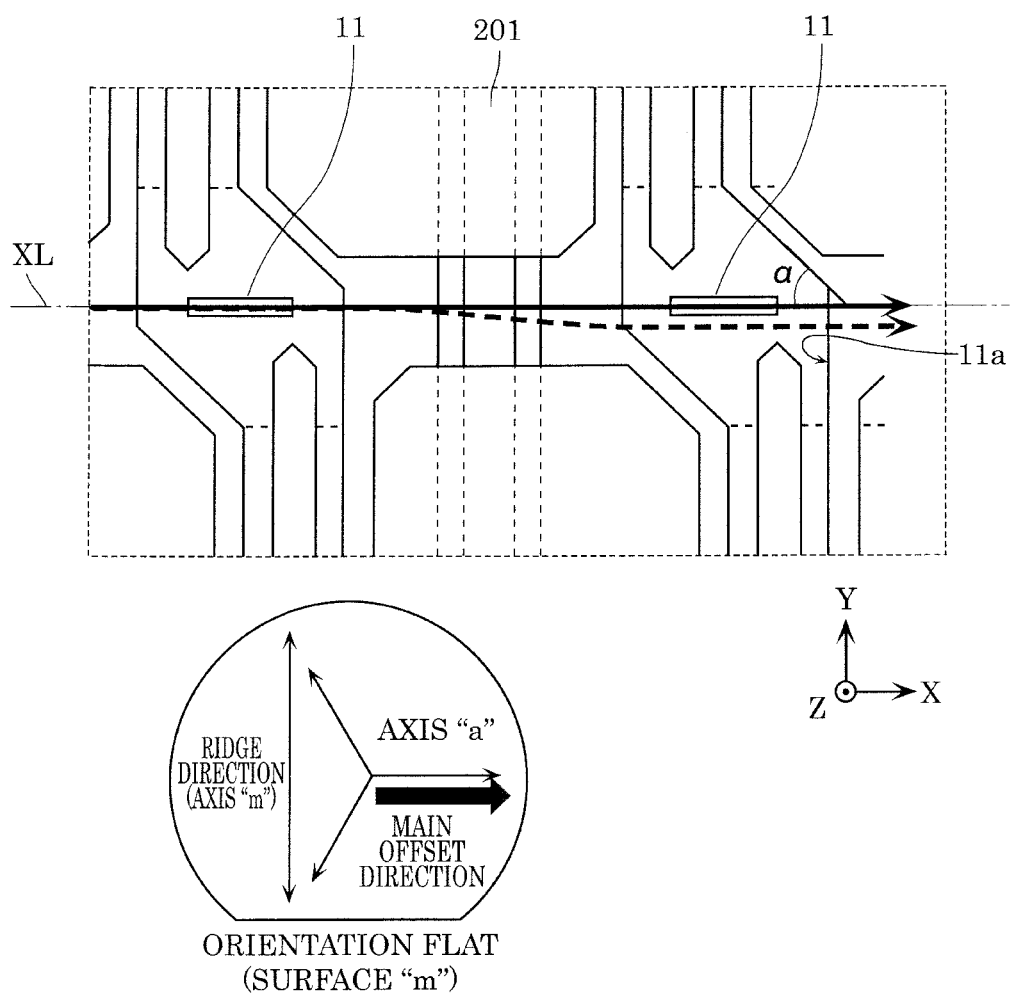
FIG. 41 is for explaining out-of-line cleavage that occurs upon cleavage of a semiconductor layer stacked substrate.

Here, when semiconductor layer stacked substrate 2 is cleaved using first trench 11, the cleavage may occur precisely along the solid line and may occur out of the predetermined cleavage line along the dashed line, as indicated by the arrow in FIG. 41. Furthermore, in the position in which the cleavage occurs out of line, the cleavage is off the crystal face of substrate 100, and thus a step is created in the cleavage surface (end surface). When out-of-line cleavage or a step is created in the cleavage surface, problems occur such as a reduction in the yield of nitride semiconductor light-emitting elements 1, generation of particles of semiconductor layer stacked body 200A including substrate 100, and a decrease in the adhesiveness of the end surface coating film. Therefore, in order to prevent these problems from occurring, the cleavage needs to progress along the cleavage surface whenever possible.

Thus, in the present embodiment, first trench 11 is formed having such a depth as to reach substrate 100 through semiconductor layer stacked body 200A. In this case, as illustrated in FIG. 40, depth d of first trench 11 may be at least 20 μm and more preferably between 20 μm and 60 μm, inclusive. Furthermore, as illustrated in FIG. 39, length s of first trench 11 may be between 30 μm and 40 μm, inclusive.

With this, at the time of cleaving semiconductor layer stacked substrate 2 using first trench 11, the advantageous effect of serving a starting point of cleavage can be increased, and thus it is possible to reduce the occurrence of out-of-line cleavage and generation of a step in the cleavage surface.

Furthermore, the method for manufacturing nitride semiconductor light-emitting element 1 according to the present embodiment includes the process of forming second trench 12 along lengthwise split line YL.

With this, as illustrated in FIG. 37K, bar-shaped substrate 3 can be split using second trench 12, and thus it is possible to easily split bar-shaped substrate 3 along the predetermined, scheduled split line (lengthwise split line YL) and also reduce the occurrence of chipping and out-of-line splits.

In this case, second trench 12 may reach substrate 100 through semiconductor layer stacked body 200A. The depth of second trench 12 may be between 20 μm and 70 μm, inclusive, and more preferably between 30 μm and 60 μm, inclusive.

With this, at the time of splitting bar-shaped substrate 3 using second trench 12, the advantageous effect of serving a starting point of a split can be increased, and thus it is possible to reduce the occurrence of an out-of-line split.

Furthermore, the method for manufacturing nitride semiconductor light-emitting element 1 according to the present embodiment includes the process of forming guide trench 10 along lengthwise split line YL. As illustrated in (b) in FIG. 37, guide trench 10 includes: third trench 13 and fourth trench 14 which extend along the Y-axis with first lengthwise split line YL1 therebetween; and fifth trench 15 and sixth trench 16 which extend along the Y-axis with third lengthwise split line YL3 therebetween. Third trench 13 is formed in first element forming region 301, fourth trench 14 is formed in third element forming region 303 adjacent to first element forming region 301 along the X-axis, fifth trench 15 is formed in second element forming region 302, and sixth trench 16 is formed in fourth element forming region 304 adjacent to second element forming region 302 along the X-axis. Second trench 12 is formed between third trench 13 (or fifth trench 15) and fourth trench 14 (or sixth trench 16), and the bottom of second trench 12 is located deeper than the bottom of each of third trench 13, fourth trench 14, fifth trench 15, and sixth trench 16.

Thus, at the time of splitting bar-shaped substrate 3 using second trench 12, the stress at the time of the split can be mitigated, allowing for a reduction in the occurrence of chipping.

Furthermore, in the method for manufacturing nitride semiconductor light-emitting element 1 according to the present embodiment, seventh trench 17 is formed as guide trench 10. As illustrated in (b) in FIG. 37B, seventh trench 17 is formed, for example, on second crosswise split line XL2, between third trench 13 and sixth trench 16.

Specifically, third trench 13, fourth trench 14, fifth trench 15, sixth trench 16, and seventh trench 17 are connected to one another.

Thus, third trench 13, fourth trench 14, fifth trench 15, sixth trench 16, and seventh trench 17 can be formed in the same process and stably finished.

Furthermore, as a result of forming guide trench 10 (third trench 13, fourth trench 14, fifth trench 15, sixth trench 16, and seventh trench 17), split trench forming region 12a surrounded by guide trench 10 can be formed, and thus second trench 12 can be formed in split trench forming region 12a.

With this, at the time of splitting bar-shaped substrate 3 using second trench 12, it is possible to further reduce the occurrence of an out-of-line split, chipping, and the like.

Note that as illustrated in FIG. 39, width W11 of split trench forming region 12a may be at least 10 μm from the perspective of reducing defects that are caused upon forming second trench 12 and split trench forming region 12a and in consideration of dimensional variations in the width, position, etc., of second trench 12. Width W12 of guide trench 10 (third trench 13, fourth trench 14, fifth trench 15, and sixth trench 16) may be at least 5 µm from the perspective of reducing the occurrence of leakage due to defects caused upon forming guide trench 10 as a result of incomplete etching.

Here, in the present embodiment, first trench 11 for primary cleavage is formed in seventh trench 17 which is guide trench 10.

This allows for a reduction in leakage that may occur on a side surface of semiconductor layer stacked body 200A, and thus it is possible to provide nitride semiconductor light-emitting element 1 which is very reliable.

Figure 42:
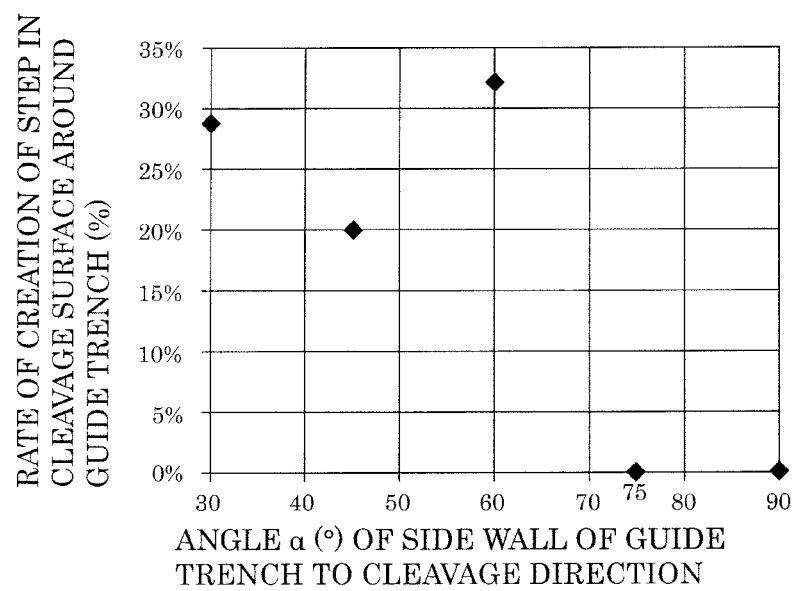
FIG. 42 illustrates the relationship between angle $\alpha$ of a side surface of a seventh trench to a cleavage direction and the rate of creation of a step in an end surface around the seventh trench.

However, when first trench 11 is formed in seventh trench 17, there are cases where a step is created in the cleavage surface as a result of the occurrence of out-of-line cleavage at the time of the primary cleavage due to the guiding function of a side surface (side wall) of seventh trench 17 which is guide trench 10. For this reason, the relationship was examined between the rate of creation of a step in the cleavage surface (end surface) and angle α formed between the cleavage direction (crosswise split line XL) and side surface 11a of seventh trench 17 (guide trench 10) as illustrated in FIG. 39 and FIG. 41. The results are shown in FIG. 42. FIG. 42 illustrates the relationship between angle α of side surface 11a of seventh trench 17 to the cleavage direction and the rate of creation of a step in an end surface around seventh trench 17.

As illustrated in FIG. 42, as angle α is reduced, the guiding function of seventh trench 17 for the progress of cleavage becomes stronger, increasing the likelihood that out-of-line cleavage occurs and a step is generated in the cleavage surface. On the other hand, as angle α increases, the guiding function of seventh trench 17 for the progress of cleavage becomes weaker, reducing the occurrence of out-of-line cleavage and generation of a step in the cleavage surface.

From the results shown in FIG. 42, angle α of side surface 11a of seventh trench 17 to the cleavage direction (crosswise split line XL) may be at least 45 degrees. For example, seventh trench 17 may have side surface 11a extending from the side surface of third trench 13 on the waveguide 201 side to fifth trench 15 at an angle of at least 45 degrees with respect to second crosswise split line XL2. However, if angle α is 60 degrees, the crystal face of substrate 100 which is a GaN substrate overlaps the cleavage line, and the guiding function of seventh trench 17 becomes stronger, increasing the likelihood that the progress of the cleavage is displaced in the vicinity of side surface 11a of seventh trench 17. In other words, out-of-line cleavage is more likely to occur, leading to an increase in the likelihood that a step is created in the cleavage surface.

Thus, when angle α of side surface 11a of seventh trench 17 to the cleavage direction is set to at least 45 degrees, it is possible to effectively reduce the occurrence of out-of-line cleavage even in the case of cleaving semiconductor layer stacked substrate 2 using first trench 11 formed in seventh trench 17. This allows for a reduction in the creation of a step in the cleavage surface.

Specifically, angle α of side surface 11a of seventh trench 17 on the scheduled primary cleavage line (crosswise split line XL) is preferably between 70 degrees and 90 degrees, inclusive, and is more preferably 90 degrees.

Furthermore, angle α of side surface 11a of seventh trench 17 in areas other than the scheduled primary cleavage line (crosswise split line XL) is preferably between 30 degrees and 90 degrees, inclusive (excluding 60 degrees), and is more preferably between 45 degrees and 90 degrees (excluding 60 degrees).

In either case, side surface 11a of guide trench 10 (in the present embodiment, seventh trench 17) in a portion in which the primary cleavage progresses is desirably close to 90 degrees at which the guiding function becomes weak with respect to the cleavage direction.

Furthermore, in the method for manufacturing nitride semiconductor light-emitting element 1 according to the present embodiment, seventh trench 17 includes, between third trench 13 in first element forming region 301 and fourth trench 14 in third element forming region 303, a portion having the minimum width measured from second crosswise split line XL2 along the Y-axis. Furthermore, seventh trench 17 includes, between fifth trench 15 in second element forming region 302 and sixth trench 16 in fourth element forming region 304, a portion having the minimum width measured from second crosswise split line XL2 along the Y-axis.

With this, it is possible to reduce the occurrence of an out-of-line split that is caused by the guiding function at the time of splitting using second trench 12 formed in split trench forming region 12a.

Furthermore, in the method for manufacturing nitride semiconductor light-emitting element 1 according to the present embodiment, semiconductor layer stacked body 200A includes first nitride semiconductor layer 210 of the first conductivity type, active layer 220, and second nitride semiconductor layer 230 of the second conductivity type sequentially on substrate 100, and guide trench 10 (third trench 13, fourth trench 14, fifth trench 15, sixth trench 16, and seventh trench 17) reaches at least first nitride semiconductor layer 210.

With this, it is possible to reduce leakage that may occur on a side surface of semiconductor layer stacked body 200A.

Furthermore, in the method for manufacturing nitride semiconductor light-emitting element 1 according to the present embodiment, the bottom of first trench 11 is located deeper than the bottom of seventh trench 17, as illustrated in FIG. 40.

With this, at the time of cleaving semiconductor layer stacked substrate 2 using first trench 11, it is possible to further reduce the occurrence of out-of-line cleavage.

Figure 43A:
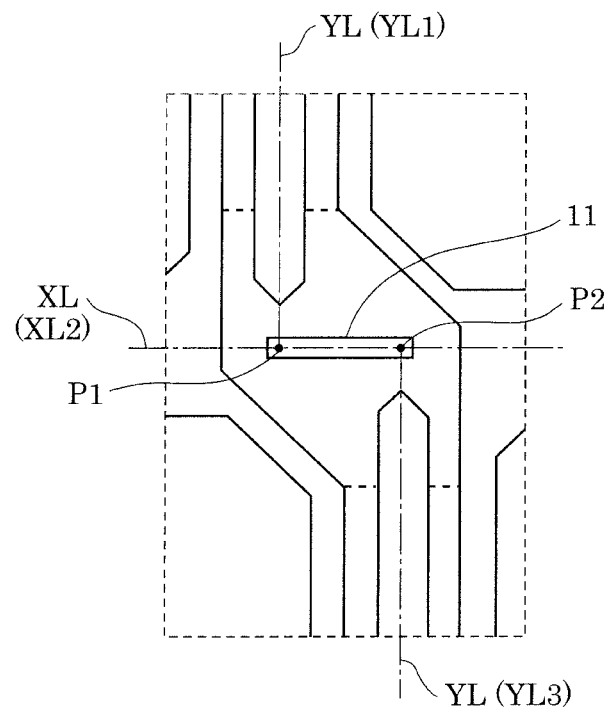
FIG. 43A is a diagram illustrating the first variation of a first trench.
Figure 43B:
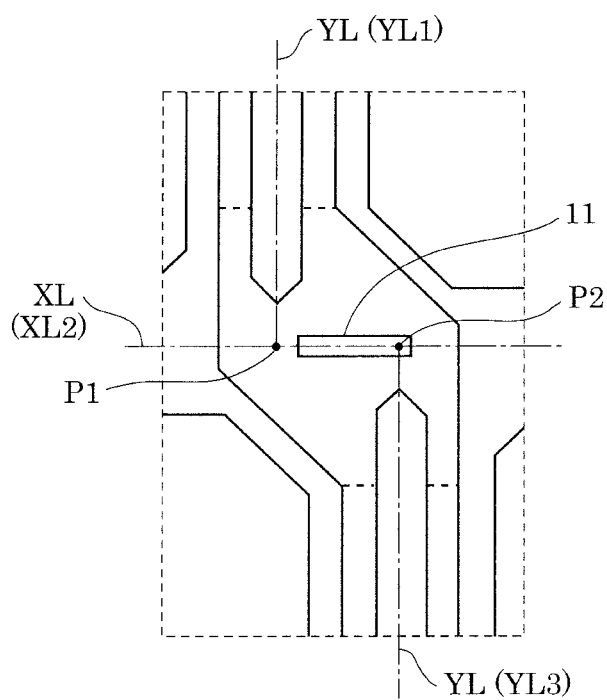
FIG. 43B is a diagram illustrating the second variation of a first trench.

Note that in the present embodiment, first trench 11 is formed between first intersection P1 and second intersection P2 so as not to overlap both of first intersection P1 and second intersection P2, as illustrated in FIG. 39, but this is not limiting. For example, first trench 11 may overlap both of first intersection P1 and second intersection P2 as illustrated in FIG. 43A, and first trench 11 may overlap one of first intersection P1 and second intersection P2 (in FIG. 43B, second intersection P2) as illustrated in FIG. 43B.

It is, however, recommended that first trench 11 do not overlap either first intersection P1 or second intersection P2 as in the present embodiment illustrated in FIG. 39. Stated differently, it is not recommended that first trench 11 overlap an extension of second trench 12. This configuration allow for a reduction in particles that are generated at the time of splitting bar-shaped substrate 3 using second trench 12.

Furthermore, nitride semiconductor light-emitting element 1 fabricated by the manufacturing method according to the present embodiment includes: substrate 100; and semiconductor element structure 200 located on one surface of substrate 100 and including waveguide 201 extending along the Y-axis. Nitride semiconductor light-emitting element 1 includes first recess 21 near the intersection between first side surface 1a and third side surface 1c in plan view, and first recess 21 has side surface 11a inclined at an angle of at least 45 degrees with respect to third side surface 1c which is a cleavage surface. Furthermore, when the second width of waveguide 201 on third side surface 1c is denoted as W2 and the first width of waveguide 201 on fourth side surface 1d is denoted as W1, W1≠W2 is satisfied, and waveguide 201 is located offset along the X-axis.

Thus, with first recess 21, it is possible to reduce leakage on a side surface of semiconductor element structure 200. Furthermore, since angle α of side surface 11a of first recess 21 which is a part of guide trench 10 (seventh trench 17) is at least 45 degrees, it is possible to reduce the occurrence of out-of-line cleavage at the time of manufacturing nitride semiconductor light-emitting element 1. Moreover, as a result of waveguide 201 having different widths on third side surface 1c and fourth side surface 1d, it is possible to equalize the operating carrier density in the cavity length direction in the case of, for example, transverse mode control, a reduction in threshold electric current (reduction in the area for electric current injection), or a reduction in the reflectivity of the end surface coating film on the reflection surface. In addition, as a result of waveguide 201 being offset along the X-axis (along the width of the element), it is possible to provide a large wire connecting region. This makes it possible to avoid a connecting portion of a wire being located above waveguide 201 at the time of wire bonding.

Furthermore, nitride semiconductor light-emitting element 1 according to the present embodiment includes second recess 22 near the intersection between first side surface 1a and fourth side surface 1d in plan view, and second recess 22 has side surface 11a inclined at an angle of at least 45 degrees with respect to fourth side surface 1d.

Thus, with second recess 22, it is possible to further reduce leakage on a side surface of semiconductor element structure 200. Furthermore, since angle α of side surface 11a of second recess 22 which is another part of guide trench 10 (seventh trench 17) is at least 45 degrees, it is possible to reduce the occurrence of out-of-line cleavage at the time of manufacturing nitride semiconductor light-emitting element 1.

Furthermore, nitride semiconductor light-emitting element 1 according to the present embodiment includes p-side electrode 260 above semiconductor element structure 200, and the first width between waveguide 201 and first end portion 261 of p-side electrode 260 that is closest to first side surface 1a is greater than the second width between waveguide 201 and second end portion 262 of p-side electrode 260 that is closest to second side surface 1b.

With this configuration, a large region of p-side electrode 260 that has the first width can be used as a large wire connecting region, and thus it is possible to easily avoid a connecting portion of a wire being located above waveguide 201.

Furthermore, in nitride semiconductor light-emitting element 1 according to the present embodiment, waveguide 201 includes width changing portion 201b having a width continuously changing from W1 to W2.

With this configuration, it is possible to provide nitride semiconductor light-emitting element 1 including tapered strip waveguide 201, and thus the operating carrier density in the cavity length direction can be equalized in the case of in the case of, for example, transverse mode control, a reduction in threshold electric current (reduction in the area for electric current injection), or a reduction in the reflectivity of the end surface coating film on the reflection surface. High-volume production is easily made possible.

Furthermore, nitride semiconductor light-emitting element 1 according to the present embodiment includes, near the intersection between first side surface 1a and third side surface 1c, first trench 11 extending along the X-axis.

With this configuration, it is possible to manufacture nitride semiconductor light-emitting element 1 by splitting bar-shaped substrate 3 using second trench 12 and reduce generation of particles at the time of splitting bar-shaped substrate 3.

Figure 44:
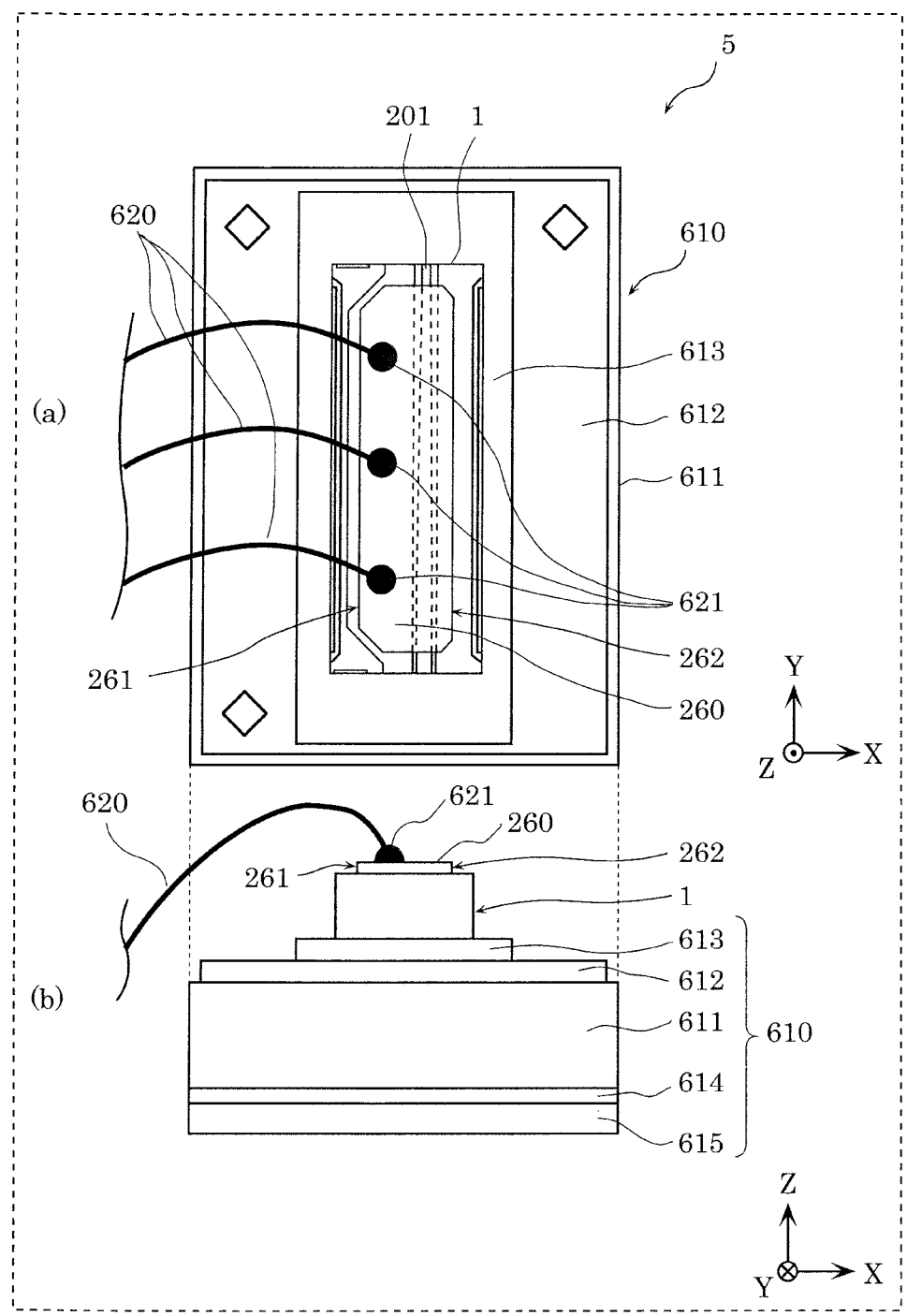
FIG. 44 is a diagram illustrating the configuration of a nitride semiconductor light-emitting device according to Embodiment 2.

Furthermore, as illustrated in FIG. 44, nitride semiconductor light-emitting element 1 according to the present embodiment can be used in nitride semiconductor light-emitting device 5. FIG. 44 is a diagram illustrating the configuration of nitride semiconductor light-emitting device 5 according to Embodiment 2. In FIG. 44, the end surface coating film is not illustrated.

As illustrated in FIG. 44, nitride semiconductor light-emitting device 5 according to the present embodiment includes: nitride semiconductor light-emitting element 1; sub-mount 610 on which nitride semiconductor light-emitting element 1 is mounted; and wire 620 connected to nitride semiconductor light-emitting element 1.

Sub-mount 610 includes: high thermal conductor 611; first metal layer 612 and first joining layer 613 which are stacked on the upper surface of high thermal conductor 611; and second metal layer 614 and second joining layer 615 which are stacked on the lower surface of high thermal conductor 611. High thermal conductor 611 is, for example, made from a high thermally conductive material such as SiC, AlN, and diamond. Each of first metal layer 612 and second metal layer 614 is a wiring layer and includes, for example, Ti, Pt, and Au sequentially from the high thermal conductor 611 side. First joining layer 613 includes, for example, Pt and AuSn sequentially from the first metal layer 612 side, and second joining layer 615 includes, for example, AuSn.

Nitride semiconductor light-emitting element 1 which is mounted on sub-mount 610 is joined to first joining layer 613 of sub-mount 610. At the time of mounting nitride semiconductor light-emitting element 1 on sub-mount 610, first end portion 261 (or second end portion 262) of p-side electrode 260 of nitride semiconductor light-emitting element 1 and an end portion of first metal layer 612 of sub-mount 610 may be used as recognition portions. This makes it possible to easily parallelize sub-mount 610 and nitride semiconductor light-emitting element 1 at the time of positioning nitride semiconductor light-emitting element 1 and sub-mount 610.

Furthermore, in nitride semiconductor light-emitting element 1 according to the present embodiment, the first width between waveguide 201 and first end portion 261 of p-side electrode 260 that is closest to first side surface 1a is greater than the second width between waveguide 201 and second end portion 262 of p-side electrode 260 that is closest to second side surface 1b. Therefore, connecting portion 621 (bonding portion) of wire 620 that is connected to nitride semiconductor light-emitting element 1 is positioned closer to first side surface 1a than to second side surface 1b of nitride semiconductor light-emitting element 1. In other words, connecting portion 621 of wire 620 is connected to a wide region on p-side electrode 260 that corresponds to the first width.

With this configuration, wire 620 can be bonded to nitride semiconductor light-emitting element 1 in such a manner that connecting portion 621 of wire 620 is not located above waveguide 201. Thus, it is possible to reduce the occurrence of waveguide 201 being damaged by the impact of wire bonding. In other words, the stress on waveguide 201 can be reduced.

Furthermore, in the present embodiment, the width of connecting portion 621 of wire 620 along the X-axis is less than the first width between waveguide 201 and first end portion 261 of p-side electrode 260 that is closest to first sides surface 1*a*.

With this configuration, it is possible to reduce the occurrence of leakage in nitride semiconductor light-emitting device 5.

Figure 45:
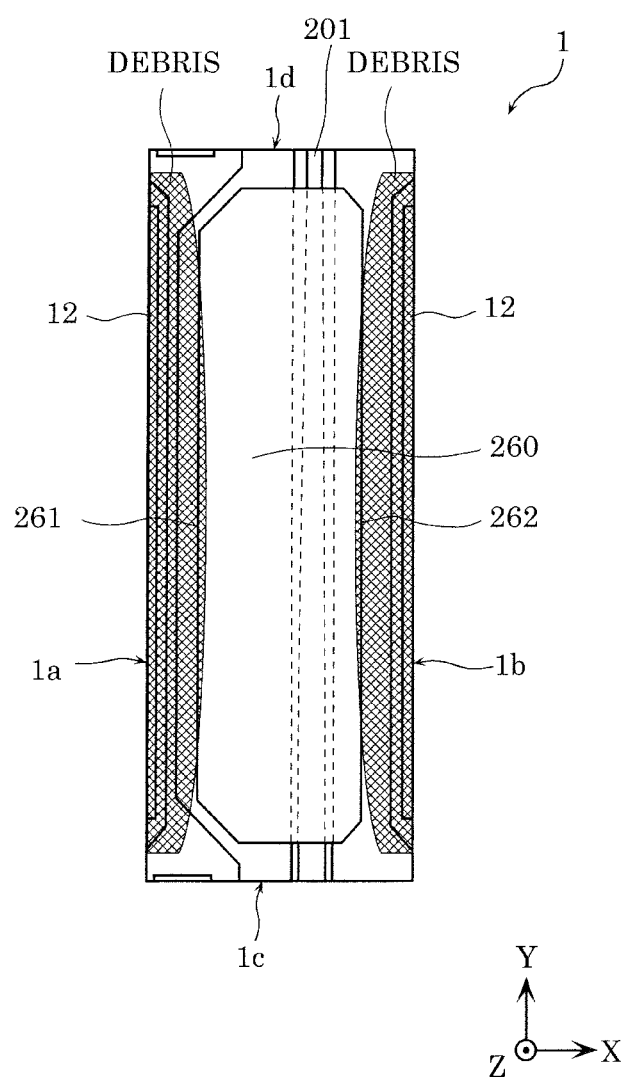
FIG. 45 is a diagram illustrating a nitride semiconductor light-emitting element to which debris generated during the forming of a second trench is adhering.

Furthermore, as described above, nitride semiconductor light-emitting element 1 according to the present embodiment is fabricated by splitting bar-shaped substrate 3 using second trench 12 formed by the laser scribe method. At this time, as illustrated in FIG. 45, there are cases where debris (scattered fragments) generated at the time of forming second trench 12 adhere to the area around second trench 12 and first end portion 261 and second end portion 262 of p-side electrode 260 are covered by the debris. In this case, at the time of mounting nitride semiconductor light-emitting element 1 on sub-mount 610, first end portion 261 and second end portion 262 of p-side electrode 260 cannot be used as the recognition portions.

Figure 46:
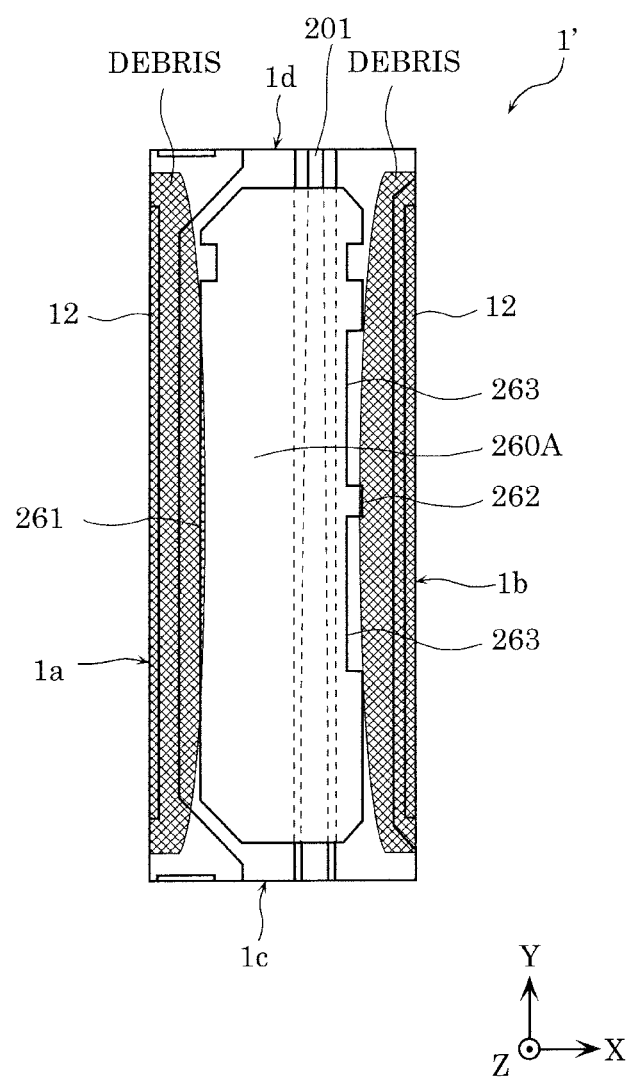
FIG. 46 is a plan view of a nitride semiconductor light-emitting element according to Variation 1 of Embodiment 2.

In view of this, in nitride semiconductor light-emitting element 1' illustrated in FIG. 46, p-side electrode 260A includes, between second end portion 262 and waveguide 201 along the X-axis, third end portion 263 extending along the Y-axis. Specifically, a part of second end portion 262 of p-side electrode 260A that is depressed inward in plan view is used as third end portion 263.

With this configuration, even when debris adheres to nitride semiconductor light-emitting element 1' as a result of forming second trench 12, it is possible to reduce the occurrence of debris adhering to third end portion 263 of p-side electrode 260A. Thus, third end portion 263 can be used as the recognition portion even when debris adheres to p-side electrode 260A; therefore, it is possible to accurately parallelize sub-mount 610 and nitride semiconductor light-emitting element 1' at the time of positioning sub-mount 610 and nitride semiconductor light-emitting element 1'. Accordingly, nitride semiconductor light-emitting element 1' can be accurately mounted on sub-mount 610.

Note that third end portion 263 to be used as the recognition portion at the time of mounting is disposed on the second end portion 262 side in FIG. 46, but may be disposed on the first end portion 261 side. However, from the perspective of providing a large region for connecting to wire 620, third end portion 263 may be disposed on the second end portion 262 side. In FIG. 45 and FIG. 46, the end surface coating film is not illustrated.

Variation 1 of Embodiment 2

Next, a variation of Embodiment 2 will be described.

Figure 47:
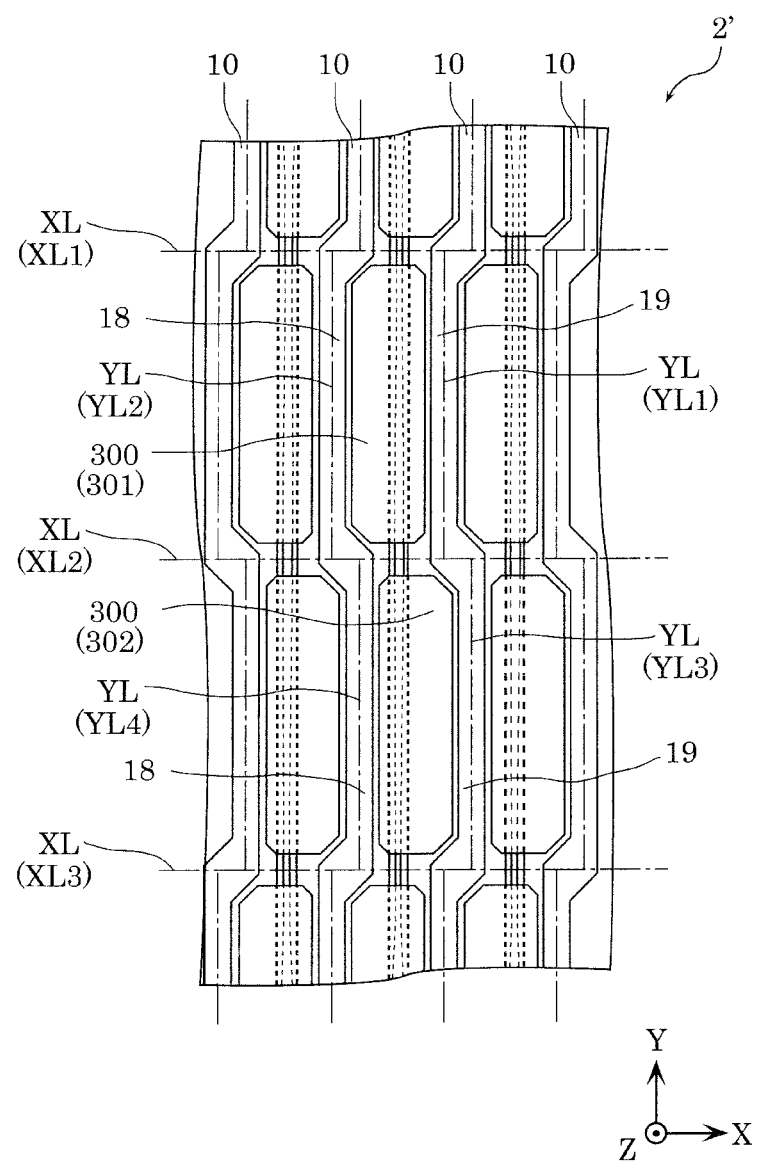
FIG. 47 is a plan view of a portion of a semiconductor layer stacked substrate according to Variation 2 of Embodiment 2.

In Embodiment 2 described above, as guide trench 10 formed along lengthwise split line YL1, third trench 13 and fourth trench 14 are disposed to sandwich first lengthwise split line Y1, and fifth trench 15 and sixth trench 16 are disposed to sandwich third lengthwise split line YL3, but this is not limiting. For example, as guide trench 10, single eighth trench 18 extending along the Y-axis may be formed along first lengthwise split line YL1 and single ninth trench 19 extending along the Y-axis may be formed along third lengthwise split line YL3, as in semiconductor layer stacked substrate 2' illustrated in FIG. 47. In other words, split trench forming region 12*a* need not be formed. With this configuration, it is possible to further reduce leakage that may occur on a side surface of semiconductor layer stacked body 200A.

Figure 48:
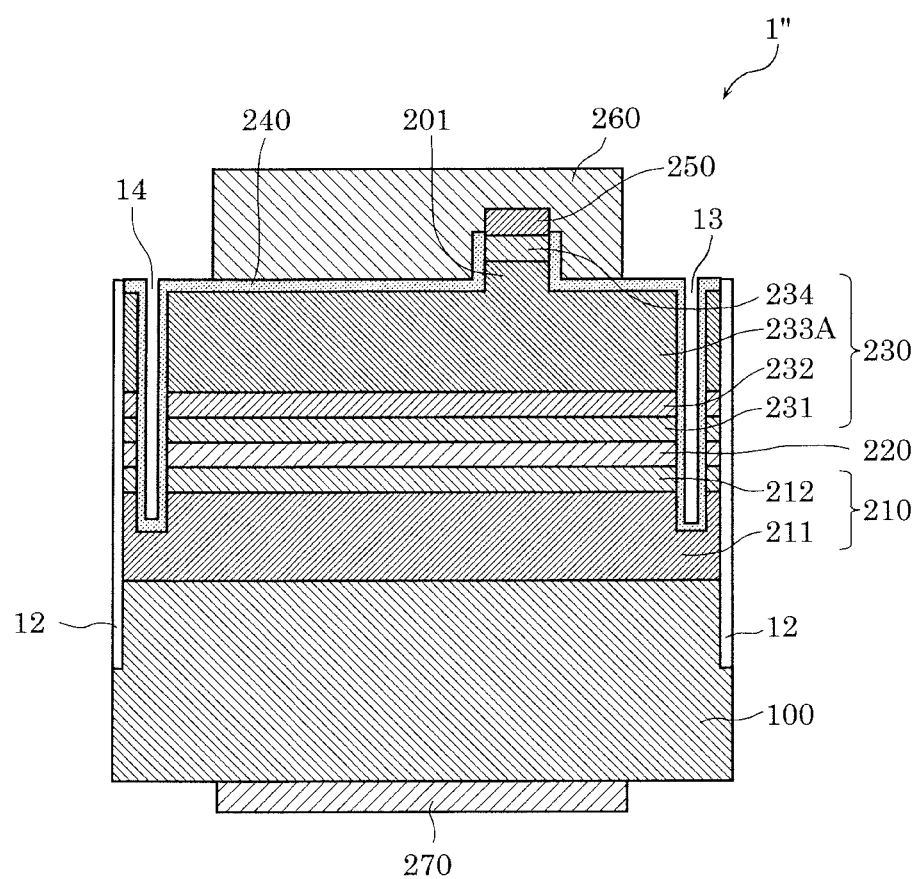
FIG. 48 is a cross-sectional view of a nitride semiconductor light-emitting element according to Variation 3 of Embodiment 2.
Figure 49:
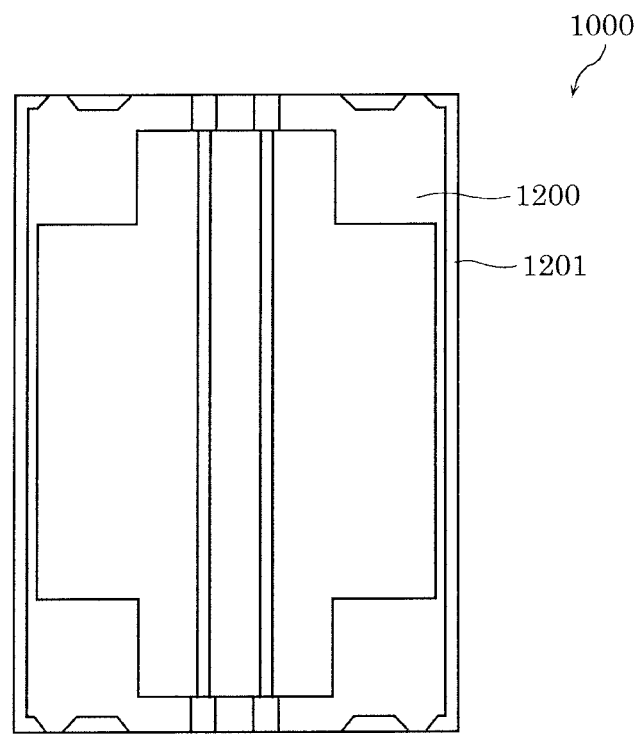
FIG. 49 is a plan view of a semiconductor light-emitting element according to Conventional Example 1.
Figure 50:
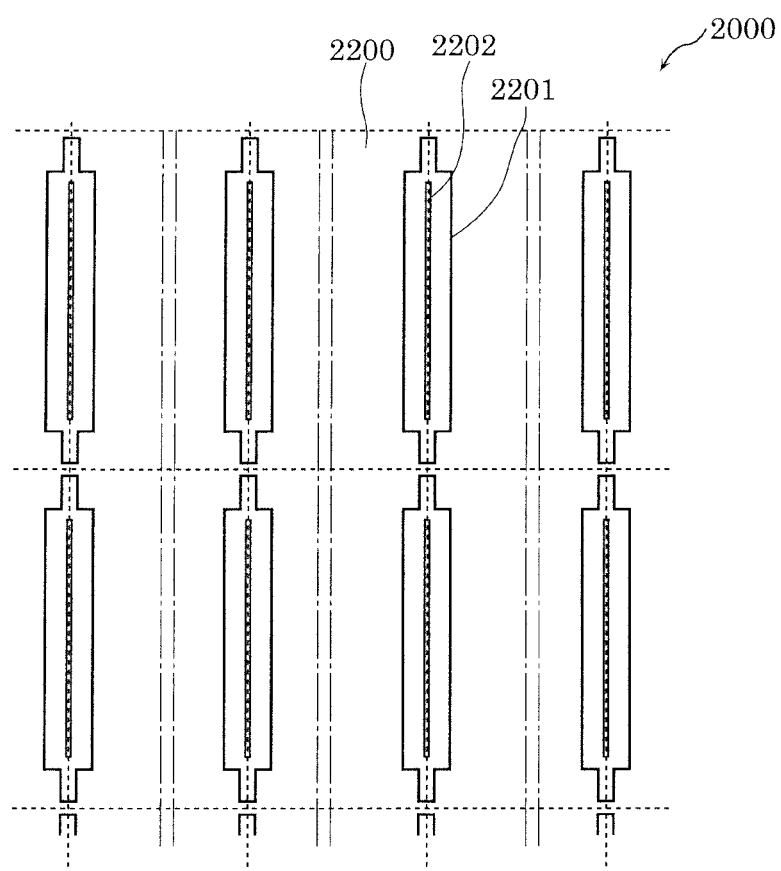
FIG. 50 is a plan view of a semiconductor light-emitting element according to Conventional Example 2.

Furthermore, in Embodiment 2 described above, ridge strip waveguide 201 is formed by forming openings 202 in semiconductor layer stacked body 200A, but this is not limiting. For example, as in nitride semiconductor light-emitting element 1" illustrated in FIG. 48, ridge strip waveguide 201 may be formed by forming a ridge portion having the form of a projection in p-type clad layer 233A.

Other Variations

Although the nitride semiconductor light-emitting element, the method for manufacturing the nitride semiconductor light-emitting element, etc., according to the present disclosure have been described thus far based on the embodiments, the present disclosure is not limited to the above-described embodiments.

For example, forms obtained by various modifications to the exemplary embodiments that can be conceived by a person having ordinary skill in the art as well as forms realized by arbitrarily combining structural elements and functions in the exemplary embodiments which are within the scope of the essence of the present disclosure are included in the present disclosure.

INDUSTRIAL APPLICABILITY

The nitride semiconductor light-emitting element according to the present disclosure is useful as a semiconductor laser element, and particularly useful as a watt-class high-output semiconductor laser element used in a projector light source and a headlamp for automobiles.

What is claimed is:

1. A method for manufacturing a nitride semiconductor light-emitting element, the method comprising:
    fabricating a semiconductor layer stacked substrate including a semiconductor layer stacked body on a substrate, the semiconductor layer stacked body including a plurality of waveguides extending in a second direction substantially orthogonal to a first direction;
    fabricating a plurality of bar-shaped substrates by splitting the semiconductor layer stacked substrate along a plurality of first-direction split lines parallel to the first direction, resulting in the plurality of waveguides being cut; and
    fabricating a plurality of individual elements by splitting each of the plurality of bar-shaped substrates along a plurality of second-direction split lines parallel to the second direction, wherein
    a waveguide in each of the plurality of individual elements has different widths at one end portion and another end portion and a center line of the waveguide is located off a center of the individual element along the first direction,
    the semiconductor layer stacked substrate includes a plurality of element forming regions corresponding to the plurality of individual elements,
    the plurality of element forming regions include a first element forming region and a second element forming region which are adjacent to each other in the second direction, and
    two of the plurality of second-direction split lines sandwiching the first element forming region and two of the plurality of second-direction split lines sandwiching the second element forming region are misaligned in the first direction, and wherein:

the plurality of first-direction split lines include a first first-direction split line, a second first-direction split line, and a third first-direction split line, the plurality of second-direction split lines include: a first second-direction split line and a second second-direction split line sandwiching the first element forming region; and a third second-direction split line and a fourth second-direction split line sandwiching the second element forming region, the first element forming region is enclosed by the first first-direction split line, the second first-direction split line, the first second-direction split line, and the second second-direction split line, the second element forming region is enclosed by the second first-direction split line, the third first-direction split line, the third second-direction split line, and the fourth second-direction split line, each of the plurality of waveguides in the semiconductor layer stacked substrate satisfies W1=W3 and W1≠W2, where W1 is a first width of the waveguide in the first direction on the first first-direction split line, W2 is a second width of the waveguide in the first direction on the second first-direction split line, and W3 is a third width of the waveguide in the first direction on the third first-direction split line, D1=D2 is satisfied, where D1 is a distance between the first second-direction split line and the second second-direction split line, and D2 is a distance between the third second-direction split line and the fourth second-direction split line, in the semiconductor layer stacked substrate, the waveguide in the first element forming region is closer to the first second-direction split line than to the second second-direction split line, and the waveguide in the second element forming region is closer to the fourth second-direction split line than to the third second-direction split line, and a width between the waveguide in the first element forming region and the first second-direction split line is equal to a width between the waveguide in the second element forming region and the fourth second-direction split line.

2. The method for manufacturing a nitride semiconductor light-emitting element according to claim 1, the method further comprising:

forming an electrode corresponding to each of the plurality of element forming regions above the semiconductor layer stacked body before fabricating the plurality of bar-shaped substrates, wherein in the first element forming region, a width between the waveguide and an end portion of the electrode that is closest to the second second-direction split line is greater than a width between the waveguide and an end portion of the electrode that is closest to the first second-direction split line, and in the second element forming region, a width between the waveguide and an end portion of the electrode that is closest to the third second-direction split line is greater than a width between the waveguide and a portion of the electrode that is closest to the fourth second-direction split line.

3. The method for manufacturing a nitride semiconductor light-emitting element according to claim 1, the method further comprising:

forming a first trench along the second first-direction split line between a first intersection and a second intersection, the first intersection being an intersection between the second first-direction split line and the first second-direction split line, the second intersection being an intersection between the second first-direction split line and the third second-direction split line.

4. The method for manufacturing a nitride semiconductor light-emitting element according to claim 3, wherein the first trench reaches the substrate through the semiconductor layer stacked body.

5. The method for manufacturing a nitride semiconductor light-emitting element according to claim 1, the method further comprising:

forming a second trench along each of the plurality of second-direction split lines after fabricating the plurality of bar-shaped substrates and before fabricating the plurality of individual elements.

6. The method for manufacturing a nitride semiconductor light-emitting element according to claim 5, wherein the second trench reaches the substrate through the semiconductor layer stacked body.

7. The method for manufacturing a nitride semiconductor light-emitting element according to claim 6, the method further comprising:

forming guide trenches along the plurality of second-direction split lines, wherein the guide trenches include a third trench and a fourth trench which sandwich the first second-direction split line and each of which extends in the second direction, the third trench is formed in the first element forming region, the fourth trench is formed in a third element forming region adjacent to the first element forming region in the first direction, the second trench is formed between the third trench and the fourth trench, and a bottom of the second trench is located deeper than a bottom of each of the third trench and the fourth trench.

8. The method for manufacturing a nitride semiconductor light-emitting element according to claim 7, wherein the guide trenches include a fifth trench and a sixth trench which sandwich the third second-direction split line and each of which extends in the second direction, the fifth trench is formed in the second element forming region, the sixth trench is formed in a fourth element forming region adjacent to the second element forming region in the first direction, the second trench is formed between the fifth trench and the sixth trench, a bottom of the second trench is located deeper than a bottom of each of the fifth trench and the sixth trench, and on the second first-direction split line, a seventh trench is disposed between the third trench and the sixth trench.

9. The method for manufacturing a nitride semiconductor light-emitting element according to claim 8, wherein the semiconductor layer stacked body includes a first nitride semiconductor layer of a first conductivity type, an active layer, and a second nitride semiconductor layer of a second conductivity type different from the first conductivity type, sequentially on the substrate, and the third trench, the fourth trench, the fifth trench, the sixth trench, and the seventh trench reach at least the first nitride semiconductor layer.

10. The method for manufacturing a nitride semiconductor light-emitting element according to claim 9, wherein the third trench, the fourth trench, the fifth trench, the sixth trench, and the seventh trench are connected to one another.

11. The method for manufacturing a nitride semiconductor light-emitting element according to claim 10, wherein the seventh trench has a side surface extending from a side surface of the third trench to the fifth trench at an angle of at least 45 degrees with respect to the second first-direction split line, the side surface of the third trench being on a side of the waveguide.

12. The method for manufacturing a nitride semiconductor light-emitting element according to claim 10, wherein the seventh trench includes, between the third trench in the first element forming region and the fourth trench in the third element forming region, a portion having a minimum width measured from the second first-direction split line in the second direction.

13. The method for manufacturing a nitride semiconductor light-emitting element according to claim 10, wherein the seventh trench includes, between the fifth trench in the second element forming region and the sixth trench in the fourth element forming region, a portion having a minimum width measured from the second first-direction split line in the second direction.

14. The method for manufacturing a nitride semiconductor light-emitting element according to claim 8, the method further comprising:
forming a first trench along the second first-direction split line between a first intersection and a second intersection, the first intersection being an intersection between the second first-direction split line and the first second-direction split line, the second intersection being an intersection between the second first-direction split line and the third second-direction split line,
wherein a bottom of the first trench is located deeper than a bottom of the seventh trench.

15. The method for manufacturing a nitride semiconductor light-emitting element according to claim 6, the method further comprising:
forming an eighth trench along the first second-direction split line and a ninth trench along the third second-direction split line, the eighth trench extending in the second direction, the ninth trench extending in the second direction.

16. The method for manufacturing a nitride semiconductor light-emitting element according to claim 1, wherein in each of the first element forming region and the second element forming region, the waveguide includes a width changing portion having a width continuously changing from W1 to W2.

17. A nitride semiconductor light-emitting element, comprising:
a substrate; and
a semiconductor element structure on one surface of the substrate, the semiconductor element structure including a waveguide extending in a second direction substantially orthogonal to a first direction, wherein:
the nitride semiconductor light-emitting element further comprises: a first side surface substantially parallel to the second direction; a second side surface opposite to the first side surface: a third side surface substantially perpendicular to the first side surface and the second side surface; and a fourth side surface opposite to the third side surface,
each of the third side surface and the fourth side surface is a cleavage surface, and
the nitride semiconductor light-emitting element further comprises:
a first trench between the second side surface and the waveguide, the first trench extending in the second direction;
a second trench between the first side surface and the waveguide, the second trench extending in the second direction;
a first recess near an intersection between the first side surface and the third side surface;
a second recess near an intersection between the first side surface and the fourth side surface;
a first depressed portion depressed toward the second side surface from the first side surface; and
a second depressed portion depressed toward the first side surface from the second side surface, and
the semiconductor element structure includes:
a first nitride semiconductor layer of a first conductivity type;
an active layer; and
a second nitride semiconductor layer of a second conductivity type different from the first conductivity type,
the first nitride semiconductor layer, the active layer, and the second nitride semiconductor layer being disposed in this order above the substrate,
a depth of each of the first trench and the second trench reaches the first nitride semiconductor layer, and
a position of the waveguide is offset in the first direction.

18. The nitride semiconductor light-emitting element according to claim 17, wherein the second trench is connected to the first recess and the second recess.

19. A nitride semiconductor light-emitting element, comprising:
a substrate; and
a semiconductor element structure on one surface of the substrate, the semiconductor element structure including a waveguide extending in a second direction substantially orthogonal to a first direction, wherein:
the nitride semiconductor light-emitting element further comprises: a first side surface substantially parallel to the second direction; a second side surface opposite to the first side surface: a third side surface substantially perpendicular to the first side surface and the second side surface; and a fourth side surface opposite to the third side surface,
each of the third side surface and the fourth side surface is a cleavage surface, and
the nitride semiconductor light-emitting element further comprises:
a first trench between the second side surface and the waveguide, the first trench extending in the second direction;
a second trench between the first side surface and the waveguide, the second trench extending in the second direction;
a first recess near an intersection between the first side surface and the third side surface;
a second recess near an intersection between the first side surface and the fourth side surface;
a first depressed portion depressed toward the second side surface from the first side surface;

a second depressed portion depressed toward the first side surface from the second side surface; and an electrode above the semiconductor element structure, the electrode having a width greater than a width of the waveguide, wherein each of the first trench and the second trench is not covered by the electrode, and a position of the waveguide is offset in the first direction.

20. A nitride semiconductor light-emitting element, comprising:

a substrate; and a semiconductor element structure on one surface of the substrate, the semiconductor element structure including a waveguide extending in a second direction substantially orthogonal to a first direction, wherein:

the nitride semiconductor light-emitting element further comprises: a first side surface substantially parallel to the second direction; a second side surface opposite to the first side surface: a third side surface substantially perpendicular to the first side surface and the second side surface; and a fourth side surface opposite to the third side surface, each of the third side surface and the fourth side surface is a cleavage surface, and the nitride semiconductor light-emitting element further comprises:

a first trench between the second side surface and the waveguide, the first trench extending in the second direction;

a second trench between the first side surface and the waveguide, the second trench extending in the second direction;

a first recess near an intersection between the first side surface and the third side surface;

a second recess near an intersection between the first side surface and the fourth side surface;

a first depressed portion depressed toward the second side surface from the first side surface;

a second depressed portion depressed toward the first side surface from the second side surface;

a third trench between the waveguide and the first trench, the third trench extending in the second direction; and a fourth trench between the waveguide and the second trench, the fourth trench extending in the second direction, and the waveguide has a ridge stripe structure in a form of a ridge, the ridge being formed by the third trench and the fourth trench.

* * * * *

UNITED STATES PATENT AND TRADEMARK OFFICE
CERTIFICATE OF CORRECTION

| | |
|---|---|
| PATENT NO. | : 11,309,688 B2 |
| APPLICATION NO. | : 16/584173 |
| DATED | : April 19, 2022 |
| INVENTOR(S) | : Daisuke Ikeda et al. |

It is certified that error appears in the above-identified patent and that said Letters Patent is hereby corrected as shown below:

On the Title Page

Under "(72) Inventors," the inventors should be listed as:
(72) Inventors:
Daisuke Ikeda, Toyama (JP), Gen Shimizu, Toyama (JP), Hideo Kitagawa, Toyama (JP), Toru Takayama Toyama (JP), Masayuki Ono, Toyama, Katsuya Samonji, Toyama (JP), Osamu Tomita, Osaka (JP), Satoko Kawasaki, Osaka (JP)

Signed and Sealed this
Nineteenth Day of July, 2022

Katherine Kelly Vidal
*Director of the United States Patent and Trademark Office*